(12) United States Patent
Chung

(10) Patent No.: US 9,412,473 B2
(45) Date of Patent: Aug. 9, 2016

(54) SYSTEM AND METHOD OF A NOVEL REDUNDANCY SCHEME FOR OTP

(71) Applicant: Shine C. Chung, San Jose, CA (US)

(72) Inventor: Shine C. Chung, San Jose, CA (US)

( * ) Notice: Subject to any disclaimer, the term of this patent is extended or adjusted under 35 U.S.C. 154(b) by 0 days.

(21) Appl. No.: 14/545,775

(22) Filed: Jun. 16, 2015

(65) Prior Publication Data
US 2016/0019983 A1    Jan. 21, 2016

Related U.S. Application Data

(60) Provisional application No. 62/012,947, filed on Jun. 16, 2014.

(51) Int. Cl.
| G11C 29/04 | (2006.01) |
| G11C 29/00 | (2006.01) |
| G11C 17/16 | (2006.01) |
| G11C 17/18 | (2006.01) |

(52) U.S. Cl.
CPC ............... *G11C 29/78* (2013.01); *G11C 17/16* (2013.01); *G11C 17/18* (2013.01); *G11C 29/702* (2013.01)

(58) Field of Classification Search
CPC .... G11C 29/36; G11C 29/44; G11C 29/4401; G11C 29/781; G11C 29/787; G11C 29/822; G11C 2029/36; G11C 17/146; G11C 17/16; G11C 17/18
See application file for complete search history.

(56) References Cited

U.S. PATENT DOCUMENTS

| 3,198,670 A | 8/1965 | Nissim |
| 3,715,242 A | 2/1973 | Daniel |
| 4,148,046 A | 4/1979 | Hendrickson et al. |
| 4,192,059 A | 3/1980 | Khan et al. |
| 4,642,674 A | 2/1987 | Schoofs |
| 5,192,989 A | 3/1993 | Matsushita et al. |
| 5,389,552 A | 2/1995 | Iranmanesh |
| 5,447,876 A | 9/1995 | Moyer et al. |
| 5,635,742 A | 6/1997 | Hoshi et al. |
| 5,637,901 A | 6/1997 | Beigel et al. |
| 5,680,354 A * | 10/1997 | Kawagoe ............. G11C 29/835 365/200 |
| 5,723,890 A | 3/1998 | Fujihira et al. |

(Continued)

FOREIGN PATENT DOCUMENTS

| CN | 1469473 A | 1/2004 |
| CN | 1691204 A | 11/2005 |

(Continued)

OTHER PUBLICATIONS

U.S. Appl. No. 13/471,704, filed May 15, 2012.

(Continued)

*Primary Examiner* — Andrew Q Tran

(57) ABSTRACT

A novel redundancy scheme to repair no more than one defect per I/O in a One-Time-Programmable (OTP) memory is disclosed. An OTP memory has a plurality of OTP cells in a plurality of I/Os and at least one auxiliary OTP cell associated with each I/O. At least one volatile cell in each I/O corresponds to the auxiliary OTP cells. At least one Boolean gate to invert the data into and/or out of the main OTP memory in each I/O independently based on the data in the volatile cells. The data in each I/O of the OTP memory can be inverted if no more than one defect per I/O is found. Furthermore, the inversion scheme can be achieved by reading the auxiliary OTP cells and storing into the volatile cells by automatically generating at least one read cycle upon initialization.

21 Claims, 25 Drawing Sheets

(56) References Cited

U.S. PATENT DOCUMENTS

| | | |
|---|---|---|
| 5,757,046 A | 5/1998 | Fujihira et al. |
| 5,761,148 A | 6/1998 | Allan et al. |
| 5,962,903 A | 10/1999 | Sung et al. |
| 5,999,463 A * | 12/1999 | Park ................ G06F 11/00 365/200 |
| 6,002,156 A | 12/1999 | Lin |
| 6,008,092 A | 12/1999 | Gould |
| 6,034,882 A | 3/2000 | Johnson et al. |
| 6,054,344 A | 4/2000 | Liang et al. |
| 6,140,687 A | 10/2000 | Shimomura et al. |
| 6,243,864 B1 | 6/2001 | Odani et al. |
| 6,249,472 B1 | 6/2001 | Tamura et al. |
| 6,346,727 B1 | 2/2002 | Ohtomo |
| 6,388,292 B1 | 5/2002 | Lin |
| 6,400,540 B1 | 6/2002 | Chang |
| 6,405,160 B1 | 6/2002 | Djaja et al. |
| 6,461,934 B2 | 10/2002 | Nishida et al. |
| 6,483,734 B1 | 11/2002 | Sharma et al. |
| 6,597,629 B1 | 7/2003 | Raszka et al. |
| 6,611,043 B2 | 8/2003 | Takiguchi |
| 6,731,535 B1 | 5/2004 | Ooishi et al. |
| 6,770,953 B2 | 8/2004 | Boeck et al. |
| 6,798,684 B2 | 9/2004 | Low et al. |
| 6,803,804 B2 | 10/2004 | Madurawe |
| 6,813,705 B2 | 11/2004 | Duesterwald et al. |
| 6,897,543 B1 | 5/2005 | Huang et al. |
| 6,934,176 B2 | 8/2005 | Low et al. |
| 6,944,083 B2 | 9/2005 | Pedlow |
| 6,967,879 B2 | 11/2005 | Mizukoshi |
| 7,009,182 B2 | 3/2006 | Kannan et al. |
| 7,102,951 B2 | 9/2006 | Paillet et al. |
| 7,167,397 B2 | 1/2007 | Paillet et al. |
| 7,211,843 B2 | 5/2007 | Low et al. |
| 7,212,432 B2 | 5/2007 | Ferrant et |
| 7,224,598 B2 | 5/2007 | Perner |
| 7,263,027 B2 | 8/2007 | Kim et al. |
| 7,294,542 B2 | 11/2007 | Okushima |
| 7,369,452 B2 | 5/2008 | Kenkare et al. |
| 7,391,064 B1 | 6/2008 | Tripsas et al. |
| 7,411,844 B2 | 8/2008 | Nitzan et al. |
| 7,439,608 B2 | 10/2008 | Arendt |
| 7,461,371 B2 | 12/2008 | Luo et al. |
| 7,573,762 B2 | 8/2009 | Kenkare et al. |
| 7,589,367 B2 | 9/2009 | Oh et al. |
| 7,609,578 B2 | 10/2009 | Buer et al. |
| 7,660,181 B2 | 2/2010 | Kumar et al. |
| 7,696,017 B1 | 4/2010 | Tripsas et al. |
| 7,701,038 B2 | 4/2010 | Chen et al. |
| 7,764,532 B2 | 7/2010 | Kurjanowicz et al. |
| 7,772,591 B1 | 8/2010 | Shih et al. |
| 7,802,057 B2 | 9/2010 | Iyer et al. |
| 7,808,815 B2 | 10/2010 | Ro et al. |
| 7,830,697 B2 | 11/2010 | Herner |
| 7,833,823 B2 | 11/2010 | Klersy |
| 7,852,656 B2 | 12/2010 | Shin et al. |
| 7,859,920 B2 | 12/2010 | Jung |
| 7,889,204 B2 | 2/2011 | Hansen et al. |
| 7,910,999 B2 | 3/2011 | Lee et al. |
| 8,008,723 B2 | 8/2011 | Nagai |
| 8,050,129 B2 | 11/2011 | Liu et al. |
| 8,089,137 B2 | 1/2012 | Lung et al. |
| 8,115,280 B2 | 2/2012 | Chen et al. |
| 8,119,048 B2 | 2/2012 | Nishimura |
| 8,168,538 B2 | 5/2012 | Chen et al. |
| 8,174,063 B2 | 5/2012 | Liu et al. |
| 8,174,922 B2 | 5/2012 | Naritake |
| 8,179,711 B2 | 5/2012 | Kim et al. |
| 8,183,665 B2 | 5/2012 | Bertin et al. |
| 8,217,490 B2 | 7/2012 | Bertin et al. |
| 8,233,316 B2 | 7/2012 | Liu et al. |
| 8,339,079 B2 | 12/2012 | Tamada |
| 8,369,166 B2 | 2/2013 | Kurjanowicz et al. |
| 8,373,254 B2 | 2/2013 | Chen et al. |
| 8,380,768 B2 | 2/2013 | Hoefler |
| 8,415,764 B2 | 4/2013 | Chung |
| 8,482,972 B2 | 7/2013 | Chung |
| 8,488,359 B2 * | 7/2013 | Chung ................ G11C 17/06 365/194 |
| 8,488,364 B2 | 7/2013 | Chung |
| 8,503,141 B2 | 8/2013 | Mallikarjunaswamy |
| 8,514,606 B2 * | 8/2013 | Chung ............... G11C 11/1659 365/100 |
| 8,526,254 B2 | 9/2013 | Kurjanowicz et al. |
| 8,559,208 B2 | 10/2013 | Chung |
| 8,570,800 B2 | 10/2013 | Chung |
| 8,576,602 B2 | 11/2013 | Chung |
| 8,598,639 B2 | 12/2013 | Hsin |
| 8,643,085 B2 | 2/2014 | Pfirsch |
| 8,644,049 B2 * | 2/2014 | Chung ............... G11C 11/1659 365/100 |
| 8,648,349 B2 | 2/2014 | Masuda et al. |
| 8,649,203 B2 | 2/2014 | Chung |
| 8,680,620 B2 | 3/2014 | Salcedo |
| 8,699,259 B2 | 4/2014 | Zhang et al. |
| 8,760,904 B2 | 6/2014 | Chung |
| 8,804,398 B2 | 8/2014 | Chung |
| 8,817,563 B2 | 8/2014 | Chung |
| 8,830,720 B2 | 9/2014 | Chung |
| 8,848,423 B2 | 9/2014 | Chung |
| 8,854,859 B2 | 10/2014 | Chung |
| 8,861,249 B2 | 10/2014 | Chung |
| 8,913,415 B2 | 12/2014 | Chung |
| 8,913,449 B2 | 12/2014 | Chung |
| 8,923,085 B2 | 12/2014 | Chung |
| 8,929,122 B2 | 1/2015 | Chung |
| 8,988,965 B2 | 3/2015 | Chung |
| 9,019,742 B2 | 4/2015 | Chung |
| 9,019,791 B2 | 4/2015 | Chung |
| 9,025,357 B2 | 5/2015 | Chung |
| 9,070,437 B2 | 6/2015 | Chung |
| 9,178,100 B2 | 11/2015 | Webster |
| 9,236,141 B2 | 1/2016 | Chung |
| 9,281,038 B2 | 3/2016 | Chung |
| 2002/0075744 A1 | 6/2002 | McCollum |
| 2002/0168821 A1 | 11/2002 | Williams et al. |
| 2002/0196659 A1 | 12/2002 | Hurst et al. |
| 2003/0104860 A1 | 6/2003 | Cannon et al. |
| 2003/0135709 A1 | 7/2003 | Niles et al. |
| 2003/0169625 A1 | 9/2003 | Hush et al. |
| 2004/0057271 A1 | 3/2004 | Parkinson |
| 2004/0113183 A1 | 6/2004 | Karpov et al. |
| 2004/0130924 A1 | 7/2004 | Ma et al. |
| 2005/0060500 A1 | 3/2005 | Luo et al. |
| 2005/0062110 A1 | 3/2005 | Dietz et al. |
| 2005/0110081 A1 | 5/2005 | Pendharkar |
| 2005/0124116 A1 | 6/2005 | Hsu et al. |
| 2005/0146962 A1 | 7/2005 | Schreck |
| 2005/0242386 A1 | 11/2005 | Ang |
| 2006/0072357 A1 | 4/2006 | Wicker |
| 2006/0092689 A1 | 5/2006 | Braun et al. |
| 2006/0104111 A1 | 5/2006 | Tripsas et al. |
| 2006/0120148 A1 | 6/2006 | Kim et al. |
| 2006/0129782 A1 | 6/2006 | Bansal et al. |
| 2006/0215440 A1 | 9/2006 | Cho et al. |
| 2006/0244099 A1 | 11/2006 | Kurjanowicz |
| 2007/0004160 A1 | 1/2007 | Voldman |
| 2007/0030026 A1 | 2/2007 | Hsu et al. |
| 2007/0057323 A1 | 3/2007 | Furukawa et al. |
| 2007/0081377 A1 | 4/2007 | Zheng et al. |
| 2007/0133341 A1 | 6/2007 | Lee et al. |
| 2007/0138549 A1 | 6/2007 | Wu et al. |
| 2007/0223266 A1 | 9/2007 | Chen |
| 2007/0279978 A1 | 12/2007 | Ho et al. |
| 2008/0025068 A1 | 1/2008 | Scheuerlein et al. |
| 2008/0028134 A1 | 1/2008 | Matsubara et al. |
| 2008/0044959 A1 | 2/2008 | Cheng et al. |
| 2008/0067601 A1 | 3/2008 | Chen |
| 2008/0105878 A1 | 5/2008 | Ohara |
| 2008/0151612 A1 | 6/2008 | Pellizzer et al. |
| 2008/0170429 A1 | 7/2008 | Bertin et al. |
| 2008/0175060 A1 | 7/2008 | Liu et al. |
| 2008/0220560 A1 | 9/2008 | Klersy |
| 2008/0225567 A1 | 9/2008 | Burr et al. |
| 2008/0280401 A1 | 11/2008 | Burr et al. |

(56) References Cited

U.S. PATENT DOCUMENTS

| | | |
|---|---|---|
| 2008/0316852 A1 | 12/2008 | Matsufuji et al. |
| 2009/0055617 A1 | 2/2009 | Bansal et al. |
| 2009/0115021 A1 | 5/2009 | Moriwaki |
| 2009/0168493 A1 | 7/2009 | Kim et al. |
| 2009/0172315 A1 | 7/2009 | Iyer et al. |
| 2009/0180310 A1 | 7/2009 | Shimomura et al. |
| 2009/0194839 A1 | 8/2009 | Bertin et al. |
| 2009/0213660 A1 | 8/2009 | Pikhay et al. |
| 2009/0219756 A1 | 9/2009 | Schroegmeier et al. |
| 2009/0309089 A1 | 12/2009 | Hsia et al. |
| 2010/0027326 A1 | 2/2010 | Kim et al. |
| 2010/0061136 A1 | 3/2010 | Koyama et al. |
| 2010/0085798 A1 | 4/2010 | Lu et al. |
| 2010/0091546 A1 | 4/2010 | Liu et al. |
| 2010/0142254 A1 | 6/2010 | Choi et al. |
| 2010/0157651 A1 | 6/2010 | Kumar et al. |
| 2010/0171086 A1 | 7/2010 | Lung et al. |
| 2010/0232203 A1 | 9/2010 | Chung et al. |
| 2010/0238701 A1 | 9/2010 | Tsukamoto et al. |
| 2010/0246237 A1 | 9/2010 | Borot et al. |
| 2010/0277967 A1 | 11/2010 | Lee et al. |
| 2010/0301304 A1 | 12/2010 | Chen et al. |
| 2011/0022648 A1 | 1/2011 | Harris et al. |
| 2011/0062557 A1 | 3/2011 | Bandyopadhyay et al. |
| 2011/0128772 A1 | 6/2011 | Kim et al. |
| 2011/0145777 A1 | 6/2011 | Iyer et al. |
| 2011/0175199 A1 | 7/2011 | Lin et al. |
| 2011/0222330 A1 | 9/2011 | Lee et al. |
| 2011/0260289 A1 | 10/2011 | Oyamada |
| 2011/0267869 A1 | 11/2011 | Hoefler |
| 2011/0297912 A1 | 12/2011 | Samachisa et al. |
| 2011/0310655 A1 | 12/2011 | Kreupl et al. |
| 2011/0312166 A1 | 12/2011 | Yedinak et al. |
| 2012/0032303 A1 | 2/2012 | Elkareh et al. |
| 2012/0039107 A1 | 2/2012 | Chung |
| 2012/0044736 A1 | 2/2012 | Chung |
| 2012/0044737 A1 | 2/2012 | Chung |
| 2012/0044738 A1 | 2/2012 | Chung |
| 2012/0044739 A1 | 2/2012 | Chung |
| 2012/0044740 A1 | 2/2012 | Chung |
| 2012/0044743 A1 | 2/2012 | Chung |
| 2012/0044744 A1 | 2/2012 | Chung |
| 2012/0044745 A1 | 2/2012 | Chung |
| 2012/0044746 A1 | 2/2012 | Chung |
| 2012/0044747 A1 | 2/2012 | Chung |
| 2012/0044748 A1 | 2/2012 | Chung |
| 2012/0044753 A1 | 2/2012 | Chung |
| 2012/0044756 A1 | 2/2012 | Chung |
| 2012/0044757 A1 | 2/2012 | Chung |
| 2012/0044758 A1 | 2/2012 | Chung |
| 2012/0047322 A1 | 2/2012 | Chung |
| 2012/0074460 A1 | 3/2012 | Kitagawa |
| 2012/0106231 A1 | 5/2012 | Chung |
| 2012/0147653 A1 | 6/2012 | Chung |
| 2012/0147657 A1 | 6/2012 | Sekar et al. |
| 2012/0209888 A1 | 8/2012 | Chung |
| 2012/0224406 A1 | 9/2012 | Chung |
| 2012/0256292 A1 | 10/2012 | Yu et al. |
| 2012/0287730 A1 | 11/2012 | Kim |
| 2012/0314472 A1 | 12/2012 | Chung |
| 2012/0314473 A1 | 12/2012 | Chung |
| 2012/0320656 A1 | 12/2012 | Chung |
| 2012/0320657 A1 | 12/2012 | Chung |
| 2013/0148409 A1 | 6/2013 | Chung |
| 2013/0161780 A1 | 6/2013 | Kizilyalli et al. |
| 2013/0189829 A1 | 7/2013 | Mieczkowski et al. |
| 2013/0200488 A1 | 8/2013 | Chung |
| 2013/0201745 A1 | 8/2013 | Chung |
| 2013/0201746 A1 | 8/2013 | Chung |
| 2013/0201748 A1 | 8/2013 | Chung |
| 2013/0201749 A1 | 8/2013 | Chung |
| 2013/0208526 A1 | 8/2013 | Chung |
| 2013/0215663 A1 | 8/2013 | Chung |
| 2013/0235644 A1 | 9/2013 | Chung |
| 2013/0268526 A1 | 10/2013 | Johns et al. |
| 2013/0308366 A1 | 11/2013 | Chung |
| 2014/0010032 A1 | 1/2014 | Seshadri et al. |
| 2014/0016394 A1 | 1/2014 | Chung et al. |
| 2014/0071726 A1 | 3/2014 | Chung |
| 2014/0092674 A1 | 4/2014 | Chung |
| 2014/0124871 A1 | 5/2014 | Ko et al. |
| 2014/0124895 A1 | 5/2014 | Salzman et al. |
| 2014/0126266 A1 | 5/2014 | Chung |
| 2014/0131710 A1 | 5/2014 | Chung |
| 2014/0131711 A1 | 5/2014 | Chung |
| 2014/0131764 A1 | 5/2014 | Chung |
| 2014/0133056 A1 | 5/2014 | Chung |
| 2014/0160830 A1 | 6/2014 | Chung |
| 2014/0211567 A1 | 7/2014 | Chung |
| 2014/0269135 A1 | 9/2014 | Chung |
| 2014/0340954 A1 | 11/2014 | Chung |
| 2015/0003142 A1 | 1/2015 | Chung |
| 2015/0003143 A1 | 1/2015 | Chung |
| 2015/0009743 A1 | 1/2015 | Chung |
| 2015/0014785 A1 | 1/2015 | Chung |
| 2015/0021543 A1 | 1/2015 | Chung |
| 2015/0029777 A1 | 1/2015 | Chung |
| 2015/0078060 A1 | 3/2015 | Chung |
| 2016/0071582 A1 | 3/2016 | Chung |

FOREIGN PATENT DOCUMENTS

| | | |
|---|---|---|
| CN | 101057330 A | 10/2007 |
| CN | 101083227 A | 12/2007 |
| CN | 101188140 A | 5/2008 |
| CN | 101271881 A | 9/2008 |
| CN | 101483062 A | 7/2009 |
| CN | 101728412 A | 6/2010 |
| EP | 1367596 A1 | 12/2003 |
| JP | 03-264814 | 11/1991 |
| TW | I309081 | 10/2007 |

OTHER PUBLICATIONS

U.S. Appl. No. 13/026,650, filed Feb. 14, 2011.
U.S. Appl. No. 13/026,656, filed Feb. 14, 2011.
U.S. Appl. No. 13/026,664, filed Feb. 14, 2011.
U.S. Appl. No. 13/026,678, filed Feb. 14, 2011.
U.S. Appl. No. 13/026,692, filed Feb. 14, 2011.
U.S. Appl. No. 13/026,704, filed Feb. 14, 2011.
U.S. Appl. No. 13/026,717, filed Feb. 14, 2011.
U. S. Appl. No. 13/026,725, filed Feb. 14, 2011.
U.S. Appl. No. 13/026,752, filed Feb. 14, 2011.
U.S. Appl. No. 13/026,771, filed Feb. 14, 2011.
U.S. Appl. No. 13/026,783, filed Feb. 14, 2011.
U.S. Appl. No. 13/026,835, filed Feb. 14, 2011.
U.S. Appl. No. 13/026,840, filed Feb. 14, 2011.
U.S. Appl. No. 13/026,852, filed Feb. 14, 2011.
U.S. Appl. No. 13/214,198, filed Aug. 21, 2011.
U.S. Appl. No. 13/590,044, filed Aug. 20, 2012.
U.S. Appl. No. 13/590,047, filed Aug. 20, 2012.
U.S. Appl. No. 13/590,049, filed Aug. 20, 2012.
U.S. Appl. No. 13/590,050, filed Aug. 20, 2012.
U.S. Appl. No. 13/214,183, filed Aug. 20, 2011.
U.S. Appl. No. 13/288,843, filed Nov. 3, 2011.
U.S. Appl. No. 13/314,444, filed Dec. 8, 2011.
U.S. Appl. No. 13/397,673, filed Feb. 15, 2012.
U.S. Appl. No. 13/571,797, filed Aug. 10, 2012.
U.S. Appl. No. 13/678,539, filed Nov. 15, 2012.
U.S. Appl. No. 13/678,544, filed Nov. 15, 2012.
U.S. Appl. No. 13/678,541, filed Nov. 15, 2012.
U.S. Appl. No. 13/678,543, filed Nov. 15, 2012.
Ahn, S.J. et al, "Highly Reliable 50nm Contact Cell Technology for 256Mb PRAM," IEEE VLSI Tech Symp., Jun. 2005, pp. 98-99.
Alavi, Mohsen, et al., "A PROM Element Based on Salicide Allgomeration of Poly Fuses in a CMOS Logic Process," IEEE IEDM, 97, pp. 855-858.
Andre, T. W. et al., "A 4-Mb 0.18um 1T1MTJ Toggle MRAM With Balanced Three Input Sensing Scheme and Locally Mirrored Unidirectional Write Drivers," IEEE J. of Solid-State Circuits, vol. 40, No. 1, Jan. 2005, pp. 301-309.

(56) References Cited

OTHER PUBLICATIONS

Ang, Boon et al., "NiSi Polysilicon Fuse Reliability in 65nm Logic CMOS Technology," IEEE Trans. on Dev. Mat. Rel. vol. 7, No. 2, Jun. 2007, pp. 298-303.

Aziz, A. et al., "Lateral Polysilicon n+p Diodes: Effect of the Grain boundaries and of the p-Implemented Doping Level on the I-V and C-V Characteristics," Springer Proceedings in Physics, vol. 54, 1991, pp. 318-322.

Aziz, A. et al., "Lateral Polysilicon PN Diodes: Current-Voltage Characteristics Simulation Between 200K and 400K a Numerical Approach," IEEE Trans. On Elec. Dev., vol. 41, No. 2, Feb. 1994, pp. 204-211.

Banerjee, Kaustav et al., "High Current Effects in Silicide Films for Sub-0.25um VLSI Technologies," IEEE 36th IRPS, 1998, pp. 284-292.

Bedeschi, F. et al., "4-Mb MOSFET-Selected uTrench Phase-Change Memory Experimental Chip," IEEE J. of Solid-State Circuits, vol. 40, No. 7, Jul. 2005, pp. 1557-1565.

Bedeschi, F. et al., "A Bipolar-Selected Phase Change Memory Featuring Multi-Level Cell Storage," IEEE J. Sol. Stat. Cir., vol. 44, No. 1, Jan. 2009, pp. 217-227.

Bedeschi, F. et al., "A Fully Symmetrical Sense Amplifier for Non-volatile Memories," IEEE. Int. Symp. On Circuits and Systems, (ISCAS), vol. 2, 2004, pp. 625-628.

Bedeschi, F. et al., "An 8Mb Demonstrator for High-Density 1.8V Phase-Change Memories," VLIS Cir. Symp, Jun. 2004, pp. 442-445.

Bedeschi, F. et al., "SET and RESET Pulse Characterization in BJT-Selected Phase-Change Memory," IEEE Int. Symp. On Circuits and Systems (ISCAS), 2005, pp. 1270-1273.

Braganca, P. M. et al., "A Three-Terminal Approach to Developing Spin-Torque Written Magnetic Random Access Memory Cells," IEEE Trans. on Nano. vol. 8, No. 2, Mar. 2009, pp. 190-195.

Cagli, C. et al., "Evidence for threshold switching in the set process of NiO-based RRAM and physical modeling for set, reset, retention and disturb prediction," IEEE IEDM, 2008, pp. 1-4.

Chan, W. T. et al., "CMOS Compatible Zero-Mask One-Time Programmable (OTP) Memory Design," Proc. Int. Conf. Solid State Integr. Cir. Tech., Beijing, China, Oct. 20-23, 2008. pp. 861-864.

Chan, Wan Tim, et al., "CMOS Compatible Zero-Mask One Time Programmable.Memory Design", Master Thesis, Hong-Kong University of Science and Technologies, 2008.

Chang, Meng-Fan et al., "Circuit Design Challenges in Embedded Memory and Resistive RAM (RRAM) for Mobile SoC and 3D-IC", Design Automation Conference (ASP-DAC), 16th Asia and South Pacific, 2011, pp. 197-203.

Cheng, Yu-Hsing et al., "Failure Analysis and Optimization of Metal Fuses for Post Package Trimming," IEEE 45th IRPS, 2007, pp. 616-617.

Chiu, Pi-Feng et al., "A Low Store Energy, Low VDDmin, Nonvolatile 8T2R SRAM with 3D Stacked RRAM Devices for Low Power Mobile Applications," IEEE VLSI Cir./Tech Symp., Jun. 2010, pp. 229-230.

Cho, Woo Yeong et al., "A 0.18um 3.0V 64Mb Non-Volatile Phase-Transition Random-Access Memory (PRAM)," ISSCC, Feb. 2004, Sec. 2-1.

Choi, Sang-Jun et al., "Improvement of CBRAM Resistance Window by Scaling Down Electrode Size in Pure-GeTe Film," IEEE Elec. Dev., vol. 30, No. 2, Feb. 2009, pp. 120-122.

Choi, Youngdon et al., "A 20nm 1.8V 8Gb PRAM with 40MB/s Program Bandwidth," IEEE ISSCC, 2012, pp. 46-47.

Chung, S. et al., "A 1.25um2 Cell 32Kb Electrical Fuse Memory in 32nm CMOS with 700mV Vddmin and Parallel/Serial Interface," VLSI Cir. Symp., Jun. 2009, pp. 30-31

Chung, S. et al., "A 512×8 Electrical Fuse Memory with 15um2 Cells Using 8-sq Asymmetrical Fuse and Core Devices in 90nm CMOS," VLSI Cir. Symp., Jun. 2007, pp. 74-75.

Crowley, Matthew et al., "512Mb PROM with 8 Layers of Antifuse/Diode Cells," IEEE ISSCC 2003, Sec. 16.4.

De Sandre, Guido et al., "A 4Mb LV MOS-Selected Embedded Phase Change.Memory in 90nm Standard CMOS Technology," IEEE J. Sol. Stat. Cir, vol. 46. No. 1, Jan. 2011, pp. 52-63.

De Sandre, Guido et al., "A 90nm 4Mb Embedded Phase-Change Memory with 1.2V 12ns Read Access Time and 1MB/s Write Throughput," ISSCC 2010, Sec. 14.7.

Desikan, Rajagopalan et al., "On-Chip MRAM as a High-Bandwidth Low-Latency Replacement for DRAM Physical Memories," Tech Report TR-02-47, Dept. of Computer Science, University of Texas, Austin, Sep. 27, 2002, 18 pages.

Dietrich, Stefan et al., "A Nonvolatile 2-Mbit CBRAM Memory Core Featuring Advanced Read and Program Control," IEEE J. of Solid-Stat Cir., vol. 42, No. 4, Apr. 2007, pp. 839-845.

Dion, Michael J., "Reservoir Modeling for Electromigration Improvement of Metal Systems with Refractory Barriers," IEEE 39th IRPS, 2001, pp. 327-333.

Doom, T. S. et al., "Ultra-fast Programming of Silicided Polysilicon Fuses Based on New Insights in the Programming Physics," IEEE IEDM, 2005, pp. 667-670.

Doorn, T. S., "Detailed Qualitative Model for the Programming Physics of Silicided Polysilicon Fuses," IEEE Trans. on Elec. Dev. vol. 54, No. 12, Dec. 2007, pp. 3285-3291.

Durlam, M. et al., "A 1-Mbit MRAM Based on 1T1MTJ Bit Cell Integrated With Copper Interconnects," IEEE J. of Solid-State Circuits, vol. 38, No. 5, May 2003, pp. 769-773.

Engel, B. et al., "The Science and Technology of Magnetoresistive Tunnel Memory,"IEEE Tran. on Nanotechnology, vol. 1, No. 1, Mar. 2002, pp. 32-38.

Engel, B.N. et al., "A 4Mb Toggle MRAM Based on a Novel bit and Switching Method," IEEE Trans. on Mag. vol. 41, No. 1, Jan. 2005, pp. 132-136.

Fellner, Johannes, et al., "Lifetime Study for a Poly Fuse in a 0.35um Polycide CMOS Process," IEEE 43rd IRPS, 2005, pp. 446-449.

Gao, B. et al., "Oxide-Based RRAM: Uniformity Improvement Using a New Material-Oriented Methodology," IEEE VLSI Tech. Symp., Jun. 2009, pp. 30-31.

Gao, B. et al., "Oxide-Based RRAM Switching Mechanism: A New Ion-Transport-Recombination Model," IEDM, Dec. 2008, pp. 563-566.

Gill, M. et al., "Ovonic Unified Memory—A High Performance Nonvolatile Memory Technology for Stand-Alone Memory and Embedded Applications," IEEE, ISSCC Dig. of Tech. Paper, Feb. 2002, pp. 202-203.

Gogl, D. et al., "A 16-Mb MRAM Featuring Bootstrapped Write Drivers," IEEE J. of Solid-State Circuits, vol. 40, No. 4, Apr. 2005, pp. 902-908.

Gopalan, C. et al., Demonstration of Conductive Bridging Random Access Memory (CBRAM) in Logic CMOS Process, IEEE Int. Memory Workshop, 2010, pp. 1-4.

Ha, Daewon and Kim, Kinam, "Recent Advances in High Density Phase Change Memory (PRAM)," IEEE VLSI Tech. Symp. Jun. 2007.

Hosoi, Y. et al., "High Speed Unipolar Switching Resistance RAM (RRAM) Technology," IEEE IEDM, Dec. 2006, pp. 1-4.

Hosomi, M. et al., "A Novel Nonvolatile Memory with Spin Torque Transfer.Magnetization Switching: Spin-RAM," IEEE IEDM Dig. of Tech. Paper, Dec. 2005, pp. 459-463.

Huang, Chia-En et al., "A New CMOS Logic Anti-Fuse Cell with Programmable Contact," IEEE IEDM Tech. Dig. 2007, pp. 48-51.

Im, Jay et al., "Characterization of Silicided Polysilicon Fuse Implemented in 65nm CMOS Technology," 7th Annual Non-Volatile Memory Technology Symp, (NVMTS) 2006, pp. 55-57.

Jin, Li-Yan et al., "Low-Area 1-Kb Multi-Bit OTP IP Design," IEEE 8th Int. Conf. on ASIC (ASICON), 2009. pp. 629-632.

Johnson, Mark et al., "512Mb PROM with a Three-Dimensional Array of Diode/Antifuse Memory Cells," IEEE J. of Sol. Stat. Cir., vol. 38, No. 11, Nov. 2003, pp. 1920-1928.

Kalnitsy, Alexander et al., "CoSi2 Integrated Fuses on Poly Silicon for Low Voltage 0.18um CMOS Applications," IEEE IEDM 1999, pp. 765-768.

Kang, Han-Byul et al., "Electromigration of NiSi Poly Gated Electrical Fuse and Its Resistance Behaviors Induced by High Temperature," IEEE IRPS, 2010, pp. 265-270.

(56) References Cited

OTHER PUBLICATIONS

Kang, Sangbeom et al., "A 0.1um 1.8V 256Mb Phase-Change Random Access.Memory (PRAM) with 66Mhz Synchronous Burst-Read," IEEE J. of Sol. Stat. Cir. vol. 42. No. 1, Jan. 2007, pp. 210-218.
Kawahara, T. et al., "2Mb Spin-Transfer Torque RAM (SPRAM) with Bit-by-Bit Bidirectional Current Write and Parallelizing-Direction Current Read," IEEE ISSCC Dig. of Tech. Paper, Feb. 2007, pp. 480-481.
Ker, Ming-Dou et al., "High-Current Characterization of Polysilicon Diode for Electrostatic Discharge Protection in Sub-Quarter-Micron Complementary Metal Oxide Semiconductor Technology," Jpn. J. Appl. Phys. vol. 42 (2003) pp. 3377-3378.
Ker, Ming-Dou et al., "Ultra-High-Voltage Charge Pump Circuit in Low-Voltage Bulk CMOS Processes With Polysilicon Diodes," IEEE Trans. on Cir. And Sys.-II: Exp. Brief., vol. 54, No. 1, Jan. 2007, pp. 47-51.
Kim, Deok-Kee et al., "An Investigation of Electrical Current Induced Phase Transitions in the NiPtSi/Polysilicon System," J. App. Phy. 103, 073708 (2008).
Kim, I. S. et al., "High Performance PRAM Cell Scalable to sub-20nm Technology with below 4F2 Cell Size, Extendable to DRAM Applications," IEEE VLSI Tech Symp., Jun. 2010, pp. 203-204.
Kim, Jinbong et al., "3-Transistor Antifuse OTP ROM Array Using Standard CMOS Process," IEEE VLSI Cir. Symposium, Jun. 2003, pp. 239-242.
Kim, O. et al., "CMOS trimming circuit based on polysilicon fusing," Elec. Lett. vol. 34, No. 4, pp. 355-356, Feb. 1998.
Klee, V. et al., "A 0.13um Logic-Based Embedded DRAM Technology with Electrical Fuses, Cu Interconnect in SiLK, sub-7ns Random Access Time and its Extension to the 0.10um Generation," IEEE IEDM, 2001, pp. 407-410.
Kothandaramam, C. et al., "Electrically programmable fuse (eFUSE) using electromigration in silicides," IEEE Elec. Dev. Lett., vol. 23, No. 9, pp. 523-525, Sep. 2002.
Kulkarni, S. et al., "High-Density 3-D Metal-Fuse PROM Featuring 1.37um2 1T1R Bit Cell in 32nm High-K Metal-Gate CMOS Technology," VLSI Cir. Symp., Jun. 2009 pp. 28-29.
Kulkarni, S. et al., "A 4Kb Metal-Fuse OTP-ROM Macro Featuring a 2V Programmable 1.37um2 1T1R Bit Cell in 32nm High-K Metal-Gate CMOS," IEEE J. of Sol. Stat. Cir, vol. 45, No. 4, Apr. 2010, pp. 863-868.
Kund, Michael et al., "Conductive Bridging RAM (CBRAM): An Emerging Non-Volatile Memory Technology Scalable to Sub 20nm," IEEE IEDM 2005, pp. 754-757.
Lai, Han-Chao et al., "A 0.26um2 U-Shaped Nitride-Based Programming Cell on Pure 90nm CMOS Technology," IEEE Elec. Dev. Lett. vol. 28, No. 9, Sep. 2007, pp. 837-839.
Lai, S., "Current Status of the Phase Change Memory and Its Future," IEEE IEDM Dig. of Tech. Paper, Dec. 2003, pp. 255-258.
Lee, H. Y. et al., "Low Power and High Speed Bipolar Switching with a Thin Reactive Ti Buffer Layer in Robust HfO2 Based RRAM," IEEE IEDM, 2008, pp. 1-4.
Lee, K.J., et al., "A 90nm 1.8V 512Mb Diode-Switch PRAM with 266MB/s Read Throughout," IEEE ISSCC, Dig. of Tech. Paper, Feb. 2007, 3 pgs.
Lee, Kwang-Jin et al., "A 90nm 1.8V 512Mb Diode-Switch PRAM with 266MB/s Read Throughput," IEEE J. of Sol. Stat. Cir., vol. 43, No. 1, Jan. 2008, pp. 150-162.
Lee, M.-J. et al., "Stack Friendly all-Oxide 3D RRAM Using GaInZnO Peripheral TFT Realized Over Glass Substrates," IEDM, Dec. 2008, pp. 1-4.
Lee, Man Chiu et al., "OTP Memory for Low Cost Passive RFID Tags," IEEE Conf. on Electron Devices and Solid-State Circuits (EDSSC), 2007, pp. 633-636.
Liaw, Corvin et al., "The Conductive Bridging Random Access Memory (CBRAM): A Non-volatile Multi-Level Memory Technology," 37th European Solid-State Device Research Conference (ESSDERC), 2007, pp. 226-229.
Lim, Kyunam et al., "Bit Line Coupling Scheme and Electrical Fuse Circuit for Reliable Operation of High Density DRAM," IEEE VLSI Cir. Symp. Jun. 2001, pp. 33-34.
Maffitt, T. et al., "Design Considerations for MRAM," IBM J. Res. & Dev., vol. 50, No. 1, Jan. 2006, pp. 25-39.
Meng, X.Z. et al., "Reliability Concept for Electrical Fuses," IEE Proc.-Sci Meas. Technol., vol. 144, No. 2, Mar. 1997, pp. 87-92.
Min, Byung-Jun et al., "An Embedded Non-volatile FRAM with Electrical Fuse Repair Scheme and One Time Programming Scheme for High Performance Smart Cards," IEEE CICC, Nov. 2005, pp. 255-258.
Mojumder, N. N. et al., "Three-Terminal Dual-Pillar STT-MRAM for High Performance Robust Memory Applications," IEEE Trans. Elec. Dev. vol. 58. No. 5, May 2011, pp. 1508-1516.
Morimoto, T. et al., "A NiSi Salicide Technology for Advanced Logic Devices," IEEE IEDM, Dec. 1991, pp. 653-656.
Neale, Ron, "PCM Progress Report No. 6 Afterthoughts," http://www.eetimes.com/General/PrintView/4236240, Feb. 13, 2012, 5 pages.
Nebashi, R. et al., "A 90nm 12ns 32Mb 2T1MTJ MRAM," IEEE ISSCC Dig. of Tech. Paper, Sess. 27.4, Feb. 2009, 3 pages.
Ng, K.P. et al., "Diode-Base Gate Oxide Anti-Fuse One-Time Programmable Memory Array in Standard CMOS Process," IEEE Int. Conf. of Elect. Dev. & Solid-Stat Cir. (EDSSC), Dec. 2009, pp. 457-460.
Ohbayashi, Shigeki et al., "A 65nm Embedded SRAM With Wafer Level Burn-In Mode, Leak-Bit Redundancy and Cu E-Trim Fuse for Known Good Die," IEEE J. of Solid. Stat. Cir., vol. 43, No. 1, Jan. 2008, pp. 96-108.
Oh, G. H. et al., "Parallel Multi-Confined (PMC) Cell Technology for High Density MLC PRAM," IEEE VLSI Tech. Symp., Jun. 2009, pp. 220-221.
Oh, J. H. et al., "Full Integration of Highly Manufacturable 512Mb PRAM Based on 90nm Technology," IEEE IEDM Dig. of Tech. Paper, Dec. 2006, pp. 1-4.
Osada, K. et al., "Phase Change RAM Operated with 1.5V CMOS as Low Cost Embedded Memory," IEEE CICC, Nov. 2005, pp. 431-434.
Park, Don et al., "Study on Reliability of Metal Fuse for Sub-100nm Technology," IEEE Int. Symp. On Semiconductor Manufacturing (ISSM), 2005, pp. 420-421.
Park, Jongwoo et al., "Phase Transformation of Programmed NiSi Electrical Fuse: Diffusion, Agglomeration, and Thermal Stability," 18th IEEE Int. Symp. On Physical and Failure Analysis of Integrated Circuits, (IPFA), 2011, pp. 1-7.
Park, Young-Bae et al., "Design of an eFuse OTP Memory of 8 Bits Based on a 0.35um BCD Process," Mobile IT Convergence (ICMIC), 2011 Int. Conf. on, pp. 137-139.
Pellizzer, F. et al., "Novel uTrench Phase-Change Memory Cell for Embedded and Stand-alone Non-Volatile Memory Applications," IEEE VLSI Tech Symp. Jun. 2004, pp. 18-19.
Peng, J. et al., "A Novel Embedded OTP NVM Using Standard Foundry CMOS Logic Technology," IEEE 21st Non-Volatile Semiconductor Memory Workshop (NVSMW) 2006, pp. 24-26.
Rizzolo, R. F. et al., "IBM System z9 eFUSE applications and methodology," IBM J. Res. & Dev. vol. 51 No. 1/2 Jan./Mar. 2007, pp. 65-75.
Robson, Norm et al., "Electrically Programmable Fuse (eFuse) from Memory Redundancy to Autonomous Chips," IEEE CICC, 2007, pp. 799-804.
Russo, U. et al., "Conductive-Filament Switching Analysis and Self-Accelerated Thermal Dissolution Model for Reset in NiO-based RRAM," IEDM, Dec. 2007, pp. 775-778.
Safran, J. et al., "A Compact eFUSE Programmable Array Memory for SOI CMOS," VLSI Cir. Symp. Jun. 2007, pp. 72-73.
Sasaki, Takahiko et al., "Metal-Segregate-Quench Programming of Electrical Fuse," IEEE 43rd IRPS, 2005, pp. 347-351.
Schrogmeier, P. et al., "Time Discrete Voltage Sensing and Iterative Programming Control for a 4F2 Multilevel CBRAM," VLSI Cir. Symp., Jun. 2007, pp. 186-187.
Sheu, Shyh-Shyuan et al., "A 5ns Fast Write Multi-Level Non-Volatile 1K-bits RRAM Memory with Advance Write Scheme," VLSI Cir. Symp., Jun. 2009, pp. 82-83.

(56) References Cited

OTHER PUBLICATIONS

Sheu, Shyh-Shyuan et al., "Fast-Write Resistive RAM (RRAM) for Embedded Applications," IEEE Design & Test of Computers, Jan./Feb. 2011, pp. 64-71.
Shi, Min et al., "Zero-Mask Contact Fuse for One-Time-Programmable Memory in Standard CMOS Processes," IEEE Dev. Lett. vol. 32, No. 7, Jul. 2011, pp. 955-957.
Song, Y. J. et al., "Highly Reliable 256Mb PRAM with Advanced Ring Contact Technology and Novel Encapsulating Technology," IEEE VLSI Tech Symp., Jun. 2006, pp. 153-154.
Suto, Hiroyuki et al., "Programming Conditions for Silicided Poly-Si or Copper Electrically Programmable Fuses," IEEE IIRW Final Report, 2007, pp. 84-89.
Suto, Hiroyuki et al., "Study of Electrically Programmable Fuses Through Series of I-V Measurements," IEEE IIRW Final Report, 2006, pp. 83-86.
Suto, Hiroyuki et al., "Systematic Study of the Dopant-Dependent Properties of Electrically Programmable Fuses With Silicide Poly-Si Links Through a Series of I-V Measurements," IEEE Trans. on Dev. Mat. Rd. vol. 7, No. 2, Jun. 2007, pp. 285-297.
Takaoka, H. et al., A Novel Via-fuse Technology Featuring Highly Stable Blow Operation with Large On-off Ratio for 32nm Node and Beyond, IEDM, 2007, pp. 43-46.
Tehrani, S. et al., "Magnetoresistive Random Access Memory Using Magnetic Tunnel Junction," Proc. of IEEE, vol. 91, No. 5, May 2003, pp. 703-714.
Tehrani, S., "Status and Outlook of MRAM Memory Technology," IEEE IEDM Dig. of Tech Paper., Dec. 2006, pp. 1-4.
Teichmann, J. et al., "One Time Programming (OTP) with Zener Diodes in CMOS Processes," 33rd Conf. on European Solid-State Device Research (ESSDERC), 2003, pp. 433-436.
Tian, C. et al., "Reliability Investigation of NiPtSi Electrical Fuse with Different Programming Mechanisms," IEEE IIRW Final Report, 2007, pp. 90-93.
Tian, C. et al., "Reliability Qualification of CoSi2 Electrical Fuse for 90nm Technology," IEEE 44th IRPS, 2006, pp. 392-397.
Tian, Chunyan et al., "Reliability Investigation of NiPtSi Electrical Fuse with Different Programming Mechanisms," IEEE Trans. on Dev. Mat. Rd. vol. 8, No. 3, Sep. 2008, pp. 536-542.
Tonti, W. R. et al., "Product Specific Sub-Micron E-Fuse Reliability and Design Qualification," IEEE IIRW Final Report, 2003, pp. 36-40.
Tonti, W. R., "Reliability and Design Qualification of a Sub-Micro Tungsten Silicide E-Fuse," IEEE IRPS Proceedings, 2004, pp. 152-156.
Tonti, W. R., "Reliability, Design Qualification, and Prognostic Opportunity of in Die E-Fuse," IEEE Conference on Prognostics and Health Management (PHM), 2011, pp. 1-7.
Ueda, T. et al., "A Novel Cu Electrical Fuse Structure and Blowing Scheme utilizing Crack-assisted Mode for 90-45nm-node and beyond," IEEE VLSI Tech. Sym., Jun. 2006, 2 pages.
Ulman, G. et al., "A Commercial Field-Programmable Dense eFUSE Array Memory with 00.999% Sense Yield for 45nm SOI CMOS", ISSCC 2008/ Session 22 / Variation Compensation and Measurement/ 22.4, 2008 IEEE International Solid-State Circuits Conference, pp. 406-407.
Vimercati, Daniele et al., "A 45nm 1Gbit 1.8V PCM for Wireless and Embedded Applications," IEEE ISSCC Feb. 2010, 26 pages.
Vinson, J. E., "NiCr Fuse Reliability—A New Approach," Southcon/94, Conference Record, 1994, pp. 250-255.
Walko, J., "Ovshinsky's Memories," IEE Review, Issue 11, Nov. 2005, pp. 42-45.
Wang, J. P. et al., "The Understanding of Resistive Switching Mechansim in HfO2-Based Resistive Random Access Memory," IEDM, 2011, pp. 12.1.1-12.1.4.
Wikipedia, "Programmable read-only memory", http://en.wikipedia.org/wiki/Programmable_read-only_memory, downloaded Jan. 31, 2010, 4 pages.
Worledge, D.C., "Single-Domain Model for Toggle MRAM," IBM J. Res. & Dev. vol. 50, No. 1, Jan. 2006, pp. 69-79.
Wu, Kuei-Sheng et al., "The Improvement of Electrical Programmable Fuse with Salicide-Block Dielectrical Film in 40nm CMOS Technology," Interconnect Technology Conference (IITC), 2010 Int. pp. 1-3.
Wu, Kuei-Sheng et al., "Investigation of Electrical Programmable Metal Fuse in 28nm and beyond CMOS Technology," IEEE International Interconnect Technology Conference and 2011 Materials for Advanced Metallization (IITC/MAM), 2011, pp. 1-3.
Yin, M. et al., "Enhancement of Endurance for CuxO based RRAM Cell," 9th Int. Conf. on Solid-State and Integrated-Circuit Technology (ICSICT) 2008, pp. 917-920.
Zhu, Jian-Gang, "Magnetoresistive Random Access Memory: The Path to Competitiveness and Scalability," Proc. of IEEE, vol. 96, No. 11, Nov. 2008, pp. 1786-1798.
Zhuang, W. W. et al., "Novell Colossal Magnetonresistive Thin Film Nonvolatile Resistance Random Access Memory (RRAM)," IEEE IEDM 2002, pp. 193-196.
Notice of Allowance for U.S. Appl. No. 13/026,664 mailed Sep. 18, 2012.
Office Action for U.S. Appl. No. 13/471,704 mailed Jul. 31, 2012.
Notice of Allowance for U.S. Appl. No. 13/471,704 mailed Oct. 18, 2012.
Notice of Allowance for U.S. Appl. No. 13/026,678 mailed Sep. 19, 2012.
Office Action for U.S. Appl. No. 13/026,783 mailed Sep. 27, 2012.
Office Action for U.S. Appl. No. 13/026,717 mailed Oct. 25, 2012.
Office Action for U.S. Appl. No. 13/026,650 mailed Nov. 9, 2012.
Office Action for U.S. Appl. No. 13/026,692 mailed Nov. 9, 2012.
Office Action for U.S. Appl. No. 13/026,752 mailed Nov. 9, 2012.
Office Action for U.S. Appl. No. 13/026,656 mailed Nov. 13, 2012.
Office Action for U.S. Appl. No. 13/026,704 mailed Nov. 23, 2012.
Office Action for U.S. Appl. No. 13/397,673, mailed Dec. 18, 2012.
Office Action for U.S. Appl. No. 13/026,840, mailed Dec. 31, 2012.
Office Action for U.S. Appl. No. 13/026,852, mailed Jan. 14, 2013.
Office Action for U.S. Appl. No. 13/026,783, mailed Sep. 27, 2012.
Restriction Requirement for U.S. Appl. No. 13/026,835, mailed Dec. 12, 2012.
Notice of Allowance for U.S. Appl. No. 13/026,717, mailed Feb. 12, 2013.
Office Action for U.S. Appl. No. 13/471,704, mailed Jan. 25, 2013.
U.S. Appl. No. 13/761,048, filed Feb. 6, 2013.
U.S. Appl. No. 13/761,057, filed Feb. 6, 2013.
U.S. Appl. No. 13/761,097, filed Feb. 6, 2013.
U.S. Appl. No. 13/761,045, filed Feb. 6, 2013.
Office Action for U.S. Appl. No. 13/026,678, mailed Feb. 20, 2013.
Notice of Allowance for U.S. Appl. No. 13/026,783, mailed Mar. 4, 2013.
Notice of Allowance for U.S. Appl. No. 13/026,692, mailed Mar. 15, 2013.
Office Action for U.S. Appl. No. 13/026,704, mailed Nov. 23, 2012.
Notice of Allowance for U.S. Appl. No. 13/026,835, mailed Mar. 20, 2013.
Notice of Allowance for U.S. Appl. No. 13/026,664, mailed Apr. 22, 2013.
Notice of Allowance for U.S. Appl. No. 13/026,656, mailed Apr. 22, 2013.
Jagasivamani et al., "Development of a Low-Power SRAM Compiler", IEEE Press, 2001, pp. 498-501.
Liu et al., "A Flexible Embedded SRAM Compiler", IEEE Press, 2002, 3 pgs.
Sundrararajan, "OSUSPRAM: Design of a Single Port SRAM Compiler in NCSU FREEPDK45 Process", Mater of Science in Electrical Engineering, Oklahoma State University, Jul. 2010, 117 pgs.
Notice of Allowance for U.S. Appl. No. 13/026,835, Mailed Apr. 18, 2013.
Notice of Allowance for U.S. Appl. No. 13/026,704, mailed Apr. 30, 2013.
Notice of Allowance for U.S. Appl. No. 13/026,852, mailed May 10, 2013.
Notice of Allowance for U.S. Appl. No. 13/026,717, mailed May 15, 2013.
Notice of Allowance for U.S. Appl. No. 13/471,704, mailed May 22, 2013.

(56) References Cited

OTHER PUBLICATIONS

Notice of Allowance for U.S. Appl. No. 13/026,678, mailed May 28, 2013.
Notice of Allowance for U.S. Appl. No. 13/026,650, mailed May 30, 2013.
Restriction Requirement for U.S. Appl. No. 13/314,444, mailed Jun. 7, 2013.
Restriction Requirement for U.S. Appl. No. 13/214,198, mailed Jun. 13, 2013.
Notice of Allowance for U.S. Appl. No. 13/026,840, mailed Jun. 13, 2013.
Restriction Requirement for U.S. Appl. No. 13/026,771, mailed Jun. 13, 2013.
Notice of Allowance for U.S. Appl. No. 13/026,752, mailed Jul. 1, 2013.
Restriction Requirement for U.S. Appl. No. 13/678,543, mailed Jul. 8, 2013.
Office Action for U.S. Appl. No. 13/026,725, mailed Jul. 19, 2013.
Notice of Allowance for U.S. Appl. No. 13/026,664, mailed Jul. 22, 2013.
Notice of Allowance for U.S. Appl. No. 13/026,692, mailed Jul. 23, 2013.
Notice of Allowance for U.S. Appl. No. 13/397,673, mailed Jul. 30, 2013.
Notice of Allowance for U.S. Appl. No. 13/026,704, mailed Aug. 2, 2013.
Notice of Allowance for U.S. Appl. No. 13/026,783, mailed Aug. 5, 2013.
Office Action for U.S. Appl. No. 13/214,198, mailed Aug. 6, 2013.
Office action for Chinese Patent Application No. 201110279954.7, mailed Jul. 1, 2013.
Shen et al., "High-K Metal Gate Contact RRAM (CRRAM) in Pure 28 nm CMOS Logic Process", Electron Devices Meeting (IEDM), 2012 IEEE International, Dec. 2012, 4 pgs.
Tseng et al., "A New High-Density and Ultrasmall-Cell Size Contact RRAM (CR-RAM) with Fully CMOS-Logic-Compatible Technology and Circuits", IEEE Transactions on Electron Devices, vol. 58, Issue 1, Jan. 2011, 6 pgs.
Office Action for U.S. Appl. No. 13/026,783, mailed Sep. 9, 2013.
Office Action for U.S. Appl. No. 13/314,444, mailed Sep. 9, 2013.
Office Action for U.S. Appl. No. 13/026,771, mailed Sep. 9, 2013.
Notice of Allowance for U.S. Appl. No. 13/026,852, mailed Sep. 18, 2013.
Office Action (Ex Parte) for U.S. Appl. No. 13/678,543, mailed Sep. 20, 2013.
Office Action for U.S. Appl. No. 13/835,308, mailed Sep. 27, 2013.
Notice of Allowance for U.S. Appl. No. 13/026,717, mailed Oct. 1, 2013.
Office Action for U.S. Appl. No. 13/954,831, mailed Oct. 1, 2013.
Notice of Allowance for U.S. Appl. No. 13/026,656, mailed Oct. 4, 2013.
Office Action for U.S. Appl. No. 13/214,183, mailed Oct. 25, 2013.
Chua, "Many Times Programmable z8 Microcontroller", e-Gizmo.cim, Nov. 21, 2006, pp. 1-5.
Forum, Intel Multi-byte Nops, asmcommunity.net, Nov. 21, 2006, pp. 1-5.
CMOS Z8 OTP Microcontrollers Product Specification, Zilog Inc., May 2008, Revision 1, pp. 1-84.
OTP Programming Adapter Product User Guide, Zilog Inc., 2006, pp. 1-3.
Notice of Allowance for U.S. Appl. No. 13/026,852, mailed Nov. 15, 2013.
Notice of Allowance for U.S. Appl. No. 13/026,835, mailed Nov. 22, 2013.
Notice of Allowance for U.S. Appl. No. 13/026,725, mailed Dec. 10, 2013.
Office Action for U.S. Appl. No. 13/026,783, mailed Dec. 23, 2013.
Notice of Allowance for U.S. Appl. No. 13/026,771, mailed Jan. 15, 2014.
Office Action for Chinese Patent Application No. 201110244362.1, mailed Sep. 29, 2013.
Office Action for Chinese Patent Application No. 201110235464.7, mailed Oct. 8, 2013.
Office Action for Chinese Patent Application No. 201110244400.3, mailed Nov. 5, 2013.
Office Action for Chinese Patent Application No. 201110244342.4, mailed Oct. 31, 2013.
Restriction Requirement for U.S. Appl. No. 13/678,541, mailed Feb. 28, 2014.
Notice of Allowance for U.S. Appl. No. 13/026,840, mailed Mar. 6, 2014.
Notice of Allowance for U.S. Appl. No. 13/026,840, mailed Mar. 10, 2014.
Notice of Allowance of U.S. Appl. No. 13/678,543, mailed Dec. 13, 2013.
Notice of Allowance for U.S. Appl. No. 13/835,308, mailed Mar. 14, 2014.
Notice of Allowance for U.S. Appl. No. 13/026,835, mailed Mar. 14, 2014.
Notice of Allowance for U.S. Appl. No. 13/026,725, mailed Mar. 31, 2014.
Notice of Allowance for U.S. Appl. No. 13/026,852, mailed Mar. 20, 2014.
Notice of Allowance for U.S. Appl. No. 13/026,771, mailed Mar. 18, 2014.
Final Office Action for U.S. Appl. No. 13/214,183, mailed Apr. 17, 2014.
"Embedded Systems/Mixed C and Assembly Programming", Wikibooks, Aug. 6, 2009, pp. 1-7.
Notice of Allowance for U.S. Appl. No. 13/761,097, mailed Jul. 15, 2014.
Office Action for U.S. Appl. No. 13/571,797, mailed Apr. 24, 2014.
Notice of Allowance for U.S. Appl. No. 13/590,044, mailed Apr. 29, 2014.
Notice of Allowance for U.S. Appl. No. 13/954,831, mailed May 27, 2014.
Notice of Allowance of U.S. Appl. No. 13/833,044, mailed May 29, 2014.
Notice of Allowance for U.S. Appl. No. 13/761,048, mailed Jun. 10, 2014.
Office Action for Taiwanese Patent Application No. 100129642, mailed May 19, 2014 (with translation).
Office Action for U.S. Appl. No. 13/072,783, mailed Nov. 7, 2013.
Notice of Allowance for U.S. Appl. No. 13/026,840, mailed Jun. 24, 2014.
Notice of Allowance for U.S. Appl. No. 13/214,198, mailed Jun. 23, 2014.
Notice of Allowance for U.S. Appl. No. 13/590,044, mailed Jun. 23, 2014.
Ker et al., "MOS-bounded diodes for on-chip ESD protection in a 0.15-μm shallow-trench-isolation salicided CMOS Process" International Symposium on VLSI Technology, Systems and Applications, 2003, 5 pgs.
Notice of Allowance for U.S. Appl. No. 13/840,965, mailed Jun. 25, 2014.
Office Action for U.S. Appl. No. 13/970,562, mailed Jun. 27, 2014.
Office Action for U.S. Appl. No. 13/835,308, mailed Jun. 27, 2014.
Notice of Allowance for U.S. Appl. No. 13/288,843, mailed Jul. 8, 2014.
Restriction Requirement for U.S. Appl. No. 13/678,539, mailed Jul. 1, 2014.
Notice of Allowance for U.S. Appl. No. 14/231,413, mailed Jul. 18, 2014.
Notice of Allowance for U.S. Appl. No. 13/590,044, mailed Jul. 23, 2014.
Restriction Requirement for U.S. Appl. No. 13/833,067, mailed Jul. 11, 2014.
Notice of Allowance for U.S. Appl. No. 13/954,831, mailed Aug. 4, 2014.
Restriction Requirement for U.S. Appl. No. 13/678,544, mailed Aug. 1, 2014.

(56) References Cited

OTHER PUBLICATIONS

Notice of Allowance for U.S. Appl. No. 13/761,097, mailed Jul. 25, 2014.
Ex parte Quayle for U.S. Appl. No. 13/761,057, mailed Aug. 8, 2014.
Final Office Action for U.S. Appl. No. 13/314,444, mailed May 14, 2014.
Corrected Notice of Allowability for U.S. Appl. No. 13/288,843, mailed Aug. 19, 2014.
Office Action for U.S. Appl. No. 13/590,049, mailed Aug. 29, 2014.
Ex Parte Quayle for U.S. Appl. No. 13/590,047, mailed Aug. 29, 2014.
Ex Parte Quayle for U.S. Appl. No. 13/590,050, mailed Sep. 3, 2014.
Office Action for U.S. Appl. No. 13/678,544, mailed Sep. 12, 2014.
Office Action for U.S. Appl. No. 13/678,539, mailed Sep. 10, 2014.
Notice of Allowance for U.S. Appl. No. 13/288,843, mailed Sep. 18, 2014.
Notice of Allowance for U.S. Appl. No. 13/761,057, mailed Sep. 26, 2014.
Notice of Allowance for U.S. Appl. No. 13/833,044, mailed Sep. 24, 2014.
Notice of Allowance for U.S. Appl. No. 13/314,444, mailed Sep. 24, 2014.
Office Action for U.S. Appl. No. 13/761,045, mailed Sep. 30, 2014.
Notice of Allowance for U.S. Appl. No. 13/835,308, mailed Oct. 10, 2014.
Notice of Allowance for U.S. Appl. No. 13/571,797, mailed Oct. 14, 2014.
Office Action for U.S. Appl. No. 13/833,067, mailed Oct. 20, 2014.
Notice of Allowance for U.S. Appl. No. 14/085,228, mailed Oct. 23, 2014.
Office Action for U.S. Appl. No. 13/842,824, mailed Oct. 29, 2014.
Herner et al., "Vertical p-i-n. Polysilicon Diode with Antifuse for stackable Field-Programmable ROM", IEEE Electron Device Letters, vol. 25, No. 5, pp. 271-273, May 2004.
Notice of Allowance for U.S. Appl. No. 13/590,049, mailed Nov. 25, 2014.
Notice of Allowance for U.S. Appl. No. 13/590,047, mailed Nov. 24, 2014.
Office Action for U.S. Appl. No. 13/590,044, mailed Dec. 9, 2014.
Notice of Allowance for U.S. Appl. No. 13/590,050, mailed Dec. 18, 2014.
Office Action for U.S. Appl. No. 14/042,392, mailed Dec. 31, 2014.
Office Action for U.S. Appl. No. 14/071,957, mailed Dec. 29, 2014.
International Search Report and Written Opinion for International Patent Application No. PCT/US/2014/056676, mailed Dec. 19, 2014.
Office Action for U.S. Appl. No. 14/493,083, mailed Jan. 8, 2015.
Office Action for Chinese Patent Application No. 2011102443903, mailed Dec. 16, 2014.
Notice of Allowance for U.S. Appl. No. 13/970,562, mailed Jan. 23, 2015.
Notice of Allowance for U.S. Appl. No. 14/493,069, mailed Feb. 17, 2015.
Notice of Allowance for U.S. Appl. No. 14/085,228, mailed Feb. 18, 2015.
Notice of Allowance for U.S. Appl. No. 13/761,045, mailed Feb. 18, 2015.
Notice of Allowance for U.S. Appl. No. 14/231,404, mailed Jan. 22, 2015.
Notice of Allowance for U.S. Appl. No. 14/021,990, mailed Dec. 9, 2014.
Final Office Action for U.S. Appl. No. 13/678,544, mailed Feb. 15, 2015.
Office Action for U.S. Appl. No. 14/101,125, mailed Mar. 6, 2015.
Hassan, "Argument for anti-fuse non-volatile memory in 28nm high-k metal gate", Feb. 15, 2011, wwwl.eeetimes.com publication.
Office Action for U.S. Appl. No. 13/026,783, mailed on Mar. 5, 2015.
Final Office Action for U.S. Appl. No. 13/678,539, mailed Apr. 1, 2015.
Office Action for U.S. Appl. No. 14/636,155, mailed on Apr. 10, 2015.
Notice of Allowance for U.S. Appl. No. 14/021,990, mailed Apr. 14, 2015.
Notice of Allowance for U.S. Appl. No. 13,842,824, mailed Apr. 14, 2015.
Notice of Allowance for U.S. Appl. No. 14/071,957, mailed Apr. 14, 2014.
Notice of Allowance for U.S. Appl. No. 14/231,404, mailed Apr. 17, 2015.
Notice of Allowance for U.S. Appl. No. 13/590,444, mailed May 12, 2015.
Notice of Allowance for U.S. Appl. No. 13/072,783, mailed May 13, 2015.
Notice of Allowance for U.S. Appl. No. 13/833,067, mailed Jun. 5, 2015.
Office Action for U.S. Appl. No. 13/314,444, mailed Dec. 10, 2014.
Final Office Action for U.S. Appl. No. 13/026,783, mailed Jul. 30, 2015.
Notice of Allowance for U.S. Appl. No. 14/553,874, Aug. 10, 2015.
Office Action for U.S. Appl. No. 14/500,743, mailed Aug. 17, 2015.
Notice of Allowance for U.S. Appl. No. 14/042,392, mailed Aug. 21, 2015.
Office Action for U.S. Appl. No. 14/485,696, mailed Aug. 20, 2015.
Notice of Allowance for U.S. Appl. No. 14/493,083, mailed Aug. 27, 2015.
Office Action for U.S. Appl. No. 13/678,539, mailed Sep. 16, 2015.
Office Action for U.S. Appl. No. 14/507,691, mailed Oct. 30, 2015.
Final Office Action for U.S. Appl. No. 14/101,125, mailed Nov. 17, 2015.
Notice of Allowance for U.S. Appl. No. 13/072,783, mailed Oct. 27, 2015.
Office Action for U.S. Appl. No. 14/792,479, mailed Aug. 28, 2015.
Notice of Allowance for U.S. Appl. No. 14/500,743, mailed Dec. 2, 2015.
Notice of Allowance for U.S. Appl. No. 14/636,155, mailed Dec. 4, 2015.
Notice of Allowance for U.S. Appl. No. 14/071,957, mailed Dec. 4, 2015.
Notice of Allowance for U.S. Appl. No. 13/678,544, mailed Feb. 12, 2016.
Office Action for U.S. Appl. No. 14/749,392, mailed Feb. 25, 2016.
Office Action for U.S. Appl. No. 14/940,012, mailed Feb. 26, 2016.
Notice of Allowance for U.S. Appl. No. 14/485,698, mailed Mar. 1, 2016.

* cited by examiner

MCP Type I

MCP Type II

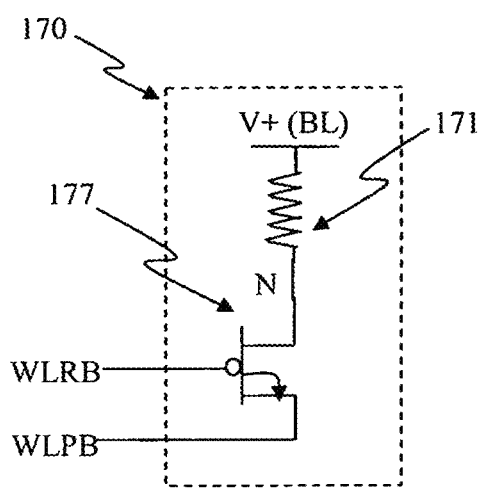
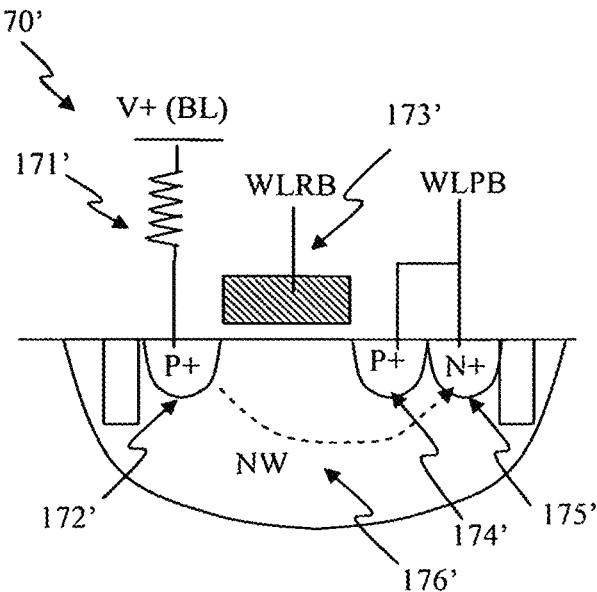
FIG. 7(a4)  FIG. 7(a4')
|  | Program by diode | | | Program by MOS | |
|---|---|---|---|---|---|
|  | Select | Deselect |  | Select | Deselect |
| WLPB | 0 | VDDP |  | VDDP | VDDP |
| WLRB | X | VDDP |  | 0 | VDDP |
FIG. 7(a4")
|  | Read by MOS | | | Read by diode | |
|---|---|---|---|---|---|
|  | Select | Deselect |  | Select | Deselect |
| WLPB | VDD | VDD |  | 0 | VDD |
| WLRB | 0 | VDD |  | X | VDD |
FIG. 7(a4''')

SYSTEM AND METHOD OF A NOVEL REDUNDANCY SCHEME FOR OTP

CROSS-REFERENCE TO RELATED APPLICATIONS

This application claims priority benefit of a U.S. Provisional Patent Application No. 62/012,947, filed on Jun. 16, 2014, and entitled "SYSTEM AND METHOD OF A NOVEL REDUNDANCY SCHEME FOR OTP," which is hereby incorporated herein by reference.

BACKGROUND OF THE INVENTION

As memory capacity is becoming larger, a memory can have higher possibility of random defects, particle contaminations, or manufacturing inefficiencies such that the memory may not be useable. A conventional approach is to use spare cells to replace defective cells.

FIG. 1 shows a block diagram of a portion of a conventional memory chip 20 as an example of memory repairs. The memory chip 20 has a memory array 21 coupled to an X-decoder 23, which couples to the output of an X-address buffer 25. An external X-address goes through X-address buffer 25 and then the X-decoder 23, to select a row 28 in the memory array 21. But if the row 28 is defective, this row needs to be replaced by a good row. A redundant row 22, a redundant X-decoder 24, a defective X-addresses storage 26, and a match circuit 27 can be built to serve this purpose. The defective X-address storage 26 stores the X-addresses of the defective rows in non-volatile memories, once the defective rows are found and tested. When an external X-address accesses a row, the X-address is input to both the normal X-decoder 23 and the redundant X-decoder 24 through the X-address buffers 25. The X-address is also input to the match circuit 27 to check if the defective X-address storage 26 stores the same address. If there is not a match, the normal row 28 will be selected. Otherwise, if there is a match, the redundant row 22 will be selected. The same concept can be applied to replace a defected column or a cell. As an example of a 1 Mb×8 memory with 10 X-addresses, 10 Y-addresses, and 8 I/Os, the required storage to specify a defective row is 10 bits for X-address and one bit to indicate a valid address for a total of 11 bits. To repair a faulty column for any I/Os, the require bits are 10 Y-address, 1 valid bit, and 3 bits for I/Os, or 14 bits total. The valid bit, or enable bit, is to indicate a valid redundant address; otherwise, an address with all un-programmed bits would be treated as a defective address. One-Time Programmable (OTP), a memory that can be programmed only once, is sufficient for use as the defective-address storage 26. The data stored in the non-volatile storage 26 are typically loaded into latches or registers before being used for address comparisons.

Laser fuses have been used to store defective addresses as a prior art since 1980s. FIG. 2(a) shows a block diagram of a one bit laser fuse cell 13. The cell 13 has a laser fuse 14 coupled to a circuit 18 to detect if the fuse is blown to generate a digital output Q. The laser fuse can be a polysilicon, silicided polysilicon, or metal. To allow a laser beam penetrating through the thick interlayer dielectrics (i.e. SiO2), the numbers of metal layers need to be limited, special layout rules need to be followed, and special testers need to be purchased for programming. Moreover, the laser cell size (~10-100 um2) is determined by a laser beam spot and alignment clearness that can not be scaled with the ever shrinking MOS devices easily. Furthermore, the memory repair can only be done in the wafer level before packaging (i.e. not field programmable). As a result, this solution can not keep up with the developments of CMOS technologies in the 21$^{st}$ century.

A programmable resistive device can be used to store defective addresses for memory repairs. A programmable resistive device is generally referred to a device's resistance state that may change after means of programming. Resistance states can also be determined by resistance values. For example, a resistive device can be a One-Time Programmable (OTP) device, such as electrical fuse, and the programming means can apply a high voltage to induce a high current to flow through the OTP element. When a high current flows through an OTP element by turning on a program selector, the OTP element can be programmed, e.g., burned into a high or low resistance state (depending on either fuse or anti-fuse). A programmable resistive device can also be Phase-Change RAM (PCRAM) or Resistive RAM (RRAM) that can be programmed reversely and repeatedly. Another type of programmable resistive device such as Magnetic RAM (MRAM) or Conductive-Bridge RAM (CBRAM) that can be programmed based on directions of current flowing through the resistive device.

An electrical fuse is a common OTP which is a programmable resistive device that can be programmed only once. An electrical fuse can be constructed from a segment of interconnect, such as polysilicon, silicided polysilicon, silicide, metal, metal alloy, or some combinations thereof. The metal can be aluminum, copper, other transition metals, or non-aluminum metal gate for CMOS. One of the most commonly used electrical fuses is a CMOS gate, fabricated in silicided polysilicon, used as interconnect. The electrical fuse can also be one or more contacts or vias instead of a segment of interconnect. A high current may blow the contact(s) or via(s) into a very high resistance state. The OTP can be an anti-fuse, where a high voltage makes the resistance lower, instead of higher. The anti-fuse can consist of one or more contacts or vias with an insulator in between. The anti-fuse can also be a CMOS gate coupled to a CMOS body with a thin gate oxide as insulator to be breakdown by a high voltage.

A conventional programmable resistive memory cell is shown in FIG. 2(b). The cell 10 consists of a resistive element 11 and an NMOS program selector 12. The resistive element 11 is coupled to the drain of the NMOS 12 at one end, and to a high voltage V+ at the other end. The gate of the NMOS 12 is coupled to a select signal (Sel), and the source is coupled to a low voltage V−. When a high voltage is applied to V+ and a low voltage to V−, the resistive device 10 can be programmed by raising the select signal (Sel) to turn on the NMOS 12. One common resistive element is a silicided polysilicon, which can be fabricated at the same time as a MOS gate. The size of the NMOS 12, as program selector, needs to be large enough to deliver the required program current for a few microseconds. The program current for a silicided polysilicon is normally between a few milliamps (mA) for a fuse with width of 40 nm to about 100 mA for a fuse with width about 0.6 um. As a result, the cell size of an electrical fuse using silicided polysilicon tends to be very large. The programmable resistive memory cell 10 can be organized as a two-dimensional array with all V+'s in the same columns coupled together as bitlines (BLs) and all Sel's in the same rows coupled together as wordlines (WLs).

Another programmable resistive memory cell 15 is shown in FIG. 2(c). The programmable resistive memory cell has a programmable resistive element 16 and a diode 17 as program selector. The programmable resistive element 16 is coupled between an anode of the diode 17 and a high voltage V+. A cathode of the diode 17 is coupled to a low voltage V−. By applying a proper voltage between V+ and V− for a proper duration of time, the programmable resistive element 16 can be programmed into high or low resistance states, depending on voltage/current and duration. The diode 17 can be a junction diode constructed from a P+ active region on N well and an N+ active region on the same N well as the P and N terminals of a diode, respectively. In another embodiment, the diode 17 can be a diode constructed from a polysilicon structure with two ends implanted by P+ and N+, respectively. The P or N terminal of either junction diode or polysilicon diode can be implanted by the same source or drain implant in CMOS devices. Either the junction diode or polysilicon diode can be built in standard CMOS processes without any additional masks or process steps. The programmable resistive memory cell 15 can be organized as a two-dimensional array with all V+'s in the same columns coupled together as bitlines (BLs) and all Sel's in the same rows coupled together as wordline bars (WLBs).

The conventional electrical fuse cell size using MOS as program selector is very large (~50 um2), and the current is very high (~20 mA) for memory repairs. The gate-oxide breakdown anti-fuse tends to have Soft Breakdown problem, instead of Hard Breakdown, such that the programmed anti-fuse can be healed by itself and cause severe reliability problems. Moreover, the anti-fuses are problematic to implement in-system repairs because of costs, capacity, and yield/reliability, and special requirements such as high voltages, charge pumps, or additional pins, etc. As a result, there is a need for improved approaches to repair memories in the wafer level, in the package, in the module, or even in the systems to increase yields and reduce costs of a memory chip or module after production.

SUMMARY

Embodiments disclosed herein use various schemes to repair and/or configure a memory while already provided in a system. Faulty memory in a system can be due to fatigue, wear out, stress, degraded performance (e.g., due to aging) or opens/shorts. When a memory chip is found faulty, the memory chip can be repaired or configured while installed in a system. This capability can substantially reduce costs for users, because the difficulties of finding replacement parts, taking the old parts off the system, and install new chips/modules can be very time consuming and costly.

According to one embodiment, a memory device can undergo in-system repair or configuration for memories using One-Time Programmable (OTP) memory. Memories found to be defective or performance degraded in a system can be repaired in-situ through use of OTP memory provided within the memories.

The invention can be implemented in numerous ways, including as a method, system, device, or apparatus (including graphical user interface and computer readable medium). Several embodiments of the invention are discussed below.

As a memory, one embodiment can, for example, include at least: a plurality of normal memory cells and a plurality of redundant memory cells; at least one selector to select normal memory cells or redundant memory cells; at least one One-Time Programmable (OTP) memory having a plurality of OTP cells configured to store one or more defective addresses, where the OTP cells can be programmed or read with at least one supply voltage no more than 4.0 Volts; and at least one match circuit configured to evaluate whether an access memory address has been stored as a defective address in the OTP memory. The memory can be repaired or configured by programming new defective addresses or configuration parameters into the OTP memory.

As a memory for in-system repairs and configurations, one embodiment can, for example, include at least one OTP memory integrated into a memory chip or an SoC. The OTP memory can be programmed to store defective addresses and enable/disable bits, once an in-system repair or configuration mechanism is activated. The data programmed into the OTP memory can be read and verified. The program voltages can be supplied from the core and I/O voltages without additional high voltage supplies or additional pins for the memory chips. It is useful that the memory chips have the same pin outs and voltage supplies as memory chips without this capability. It is even more useful that the program voltages being less than 4.0V, or 3.3V in other embodiment, to prevent damaging the memory chips. After programmed, the data stored in the OTP memory can be used to compare with the incoming address in a match circuit to turn on the normal or redundant cells during memory accesses. To reduce the OTP cell size and the OTP program voltage, the OTP cell can be an electrical fuse cell using at least one diode in standard CMOS processes as program selector.

As an electronic system, one embodiment can, for example, include at least: a processor; and a memory operatively connected to the processor. The memory can include at least: a plurality of normal memory cells to provide data storage; a plurality of redundant memory cells to repair one or more of the normal memory cells; at least one selector to select at least one of the normal memory cells or the redundant memory cells; at least one One-Time Programmable (OTP) memory having a plurality of OTP cells configured to store one or more defective addresses; and at least one comparison circuit configured to compare an access memory address with the one or more defective addresses stored in the OTP memory to produce a select signal used by the at least one selector to select at least one of the normal memory cells or the redundant memory cells. The memory can be repaired or configured by programming defective addresses or new configuration parameters into the OTP memory.

As an electronic system, one embodiment can, for example, include at least a processor, and a memory operatively connected to the processor. The memory can be provided in one or more memory chips. The electronic system can include an in-system repair or configuration mechanism. In one embodiment, the in-system repair or configuration mechanism for a memory chip can, for example, include at least one OTP memory integrated into the memory chip. The OTP memory can be programmed to store defective addresses and enable/disable bits, once the in-system repair or configuration mechanism is activated. The data programmed into the OTP memory can be read and verified. The program voltages can be supplied from core and I/O voltages without additional high voltage supplies or pins for the memory chips. It is useful that the memory chips can have the same pin outs and voltage supplies as memory chips without this capability. It is also useful that the program voltages can be less than 4.0V, or 3.3V in other embodiment. After being programmed, the data stored in the OTP memory can be used to compare with an incoming address in a match circuit to select the normal or redundant cells during memory access. To reduce the OTP cell size and the OTP program voltage, the OTP cell can be an electrical fuse cell using at least one diode in standard CMOS processes as program selector.

As a method for in-system repairing or configuring a memory, one embodiment can, for example, include at least: providing a plurality of normal memory cells and a plurality of redundant memory cells; providing at least a selector to select one or more of the normal cells or the redundant cells; storing at least one defective address in an OTP memory having a plurality of OTP cells configured to store defective addresses; and programming or reading at least one of the OTP cells in the OTP memory; and repairing the memory using the at least one defective address in the OTP memory to make use of at least one of the redundant memory cells.

As a method for providing in-system repair or configuration mechanism for a memory, one embodiment can, for example, include at least one One-Time Programmable (OTP) memory in at least one memory chip and at least one repair program. When the system is found not functional, at least one diagnosis program can be run to determine if any memory chips have defects. If any of the memory chips are found having new defects or performance degraded and repairable, a program can be run to repair the defects by instructing a CPU or embedded processor to inform a memory controller to generate proper timing waveforms to program the defective addresses and enable/disable bits into the OTP memory. The data programmed into the OTP memory can be read and verified. The repair program can be downloaded from the Internet in real time and in-situ in another embodiment. The program voltages can be supplied from a core and I/O voltages without additional high voltage supplies or pins for the memory chips. It is useful for the memory chips the same pin outs and voltage supplies as memory chips without this capability. It is even more useful that the program voltage being less than 4.0V, or even 3.3V in other embodiment, to prevent damaging the memory chips. After programmed, the data stored in the OTP memory can be used to compare with an incoming address in a match circuit to select the normal or redundant cells, respectively, during memory access. To reduce the OTP cell size and the OTP program voltage, the OTP cell can be an electrical fuse cell using at least one diode in standard CMOS processes as program selector.

As a memory, one embodiment can, for example, include at least: a plurality of normal memory cells and a plurality of redundant memory cells; at least one selector to select the normal memory cells or the redundant memory cells; and at least one One-Time Programmable (OTP) memory having a plurality of OTP cells configured to store defective addresses. Each of the OTP cells can include at least one segment of interconnect as OTP element. The memory can be configured or repaired by programming configuration parameters or defective address into the OTP memory while the memory being still electronically and physically connected within an electronic system.

BRIEF DESCRIPTION OF THE DRAWINGS

The present invention will be readily understood by the following detailed descriptions in conjunction with the accompanying drawings, wherein like reference numerals designate like structural elements, and in which:

FIG. 7(a2) shows a schematic of an OTP cell with a PMOS for low power applications according to another embodiment.

FIG. 7(a3) shows a schematic of an OTP cell with an NMOS for low power applications according to another embodiment.

FIG. 7(a4) shows a schematic of a programmable resistive cell with a PMOS configured as diode or MOS during program or read according to one embodiment.

FIG. 7(a4') shows a cross section of a programmable resistive cell with a PMOS configured as diode or MOS during program or read, corresponding to the cell in FIG. 7(a4), according to one embodiment.

FIG. 7(a4") shows operation conditions of a programmable resistive cell with a PMOS configured to be a diode or MOS as program selector, corresponding to the cell in FIGS. 7(a4) and 7(a4'), according to one embodiment.

FIG. 7(a4''') shows operation conditions of a programmable resistive cell with a PMOS configured to be a diode or MOS as read selector, corresponding to the cell in FIGS. 7(a4) and 7(a4'), according to one embodiment.

FIG. 7(b1) shows a layout of an OTP cell with a PMOS for low power applications according to one embodiment.

FIG. 7(b2) shows a layout of an OTP cell with a PMOS for low power applications according to another embodiment.

FIG. 7(b3) shows a layout of an OTP cell with a PMOS for low power applications according to yet another embodiment.

FIG. 7(b4) shows a layout of an OTP cell with a PMOS for low power applications according to yet another embodiment.

FIG. 7(b5) shows a layout of an OTP cell with a PMOS for low power applications according to yet another embodiment.

FIG. 7(b6) shows a layout of an OTP cell with a PMOS for low power applications and a shared contact according to yet another embodiment.

DETAILED DESCRIPTION OF EMBODIMENTS OF THE INVENTION

Embodiments disclosed herein use various schemes to repair and/or configure a memory while already provided in a system. Faulty memory in a system can be due to fatigue, wear out, stress, degraded performance (e.g., due to aging) or opens/shorts. When a memory chip is found faulty, the memory chip can be repaired or configured while installed in a system. This capability can substantially reduce costs for users, because the difficulties of finding replacement parts, taking the old parts off the system, and install new chips/modules can be very time consuming and costly.

Semiconductor devices may degrade after being used in a system for long period of time. The device degradations can cause a high leakage current, a shift in threshold voltage, reduction in drain current, change to contact/via resistance, or degradation of gate-oxide integrity, etc. At a functional level, a semiconductor chip may become faulty because of device degradation. Particularly, a memory chip may have new defective cells, or slower speed that fails to meet timing requirements. New defective cells can be replaced with redundant cells. Slower speed can be fixed by adjusting chip configuration parameters. DRAM is an example to illustrate the concept of in-system configuration according to one embodiment. In a DRAM (namely, in a DRAM chip package), there are RAS, CAS, and Taa that stand for Row-Access Strobe, Column-Access Strobe, and Address Access Time, respectively. During DRAM production tests, DRAM chips are programmed with proper RAS, CAS, and Taa cycles into non-volatile registers, called latency registers, for different bins. The non-volatile latency registers can be loaded into volatile registers upon initialization. A memory controller can access the latency information and then determine proper timing to access DRAMs. If the actual latency is longer than the latency set in the register, the DRAM would appear to be faulty. In such case the DRAM may be fixed by changing the latency register to a higher value.

According to one embodiment, a memory device can undergo in-system repair or configuration for memories using One-Time Programmable (OTP) memory. Memories found to be defective or performance degraded in a system can be repaired in-situ through use of OTP memory provided within the memories.

Several embodiments of the invention are discussed below with reference to FIGS. 3(a)-11. However, those skilled in the art will readily appreciate that the detailed description given herein with respect to these figures is for explanatory purposes as the invention extends beyond these limited embodiments.

Figure 1:
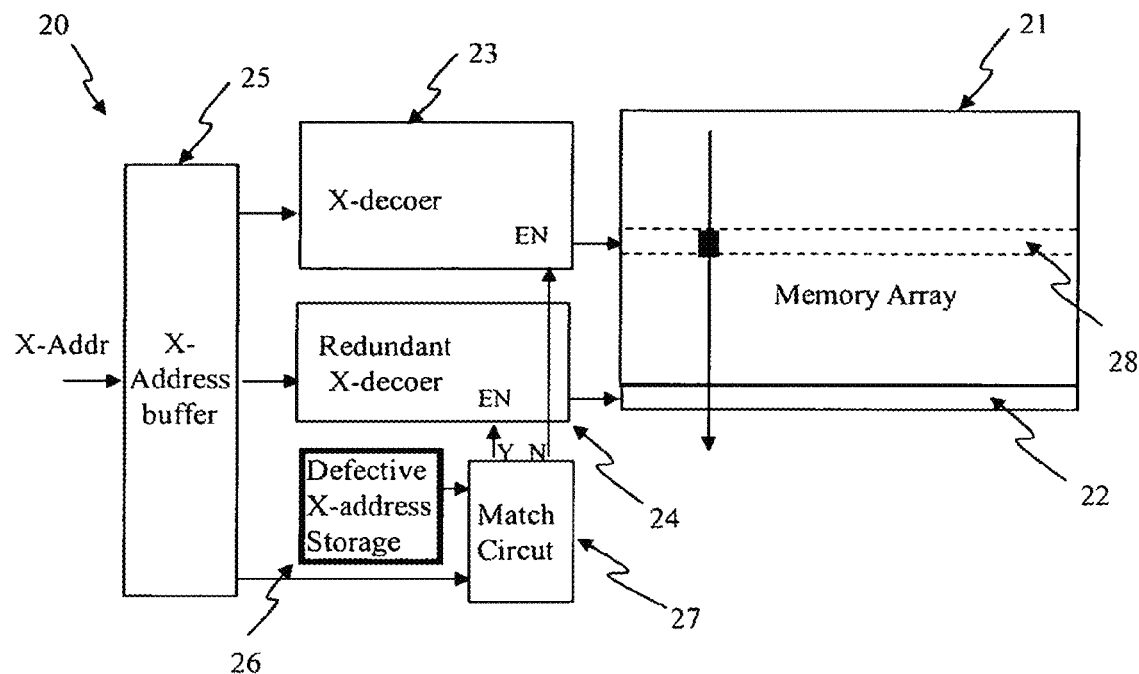
FIG. 1 shows a block diagram of memory repair using non-volatile data storage as a prior art.
Figure 2A:
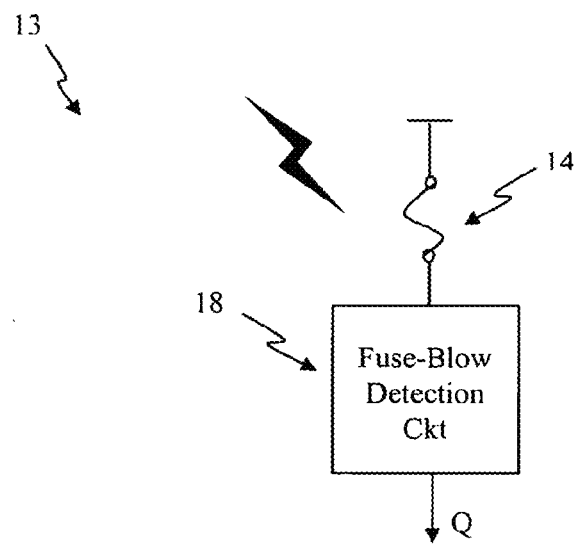
FIG. 2(a) shows a laser fuse cell with a fuse-blow detection circuit.
Figure 2B:
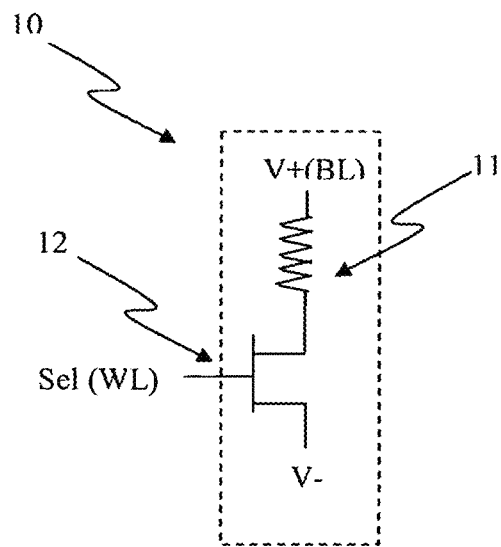
FIG. 2(b) shows a conventional programmable resistive memory cell using MOS as program selector.
Figure 2C:
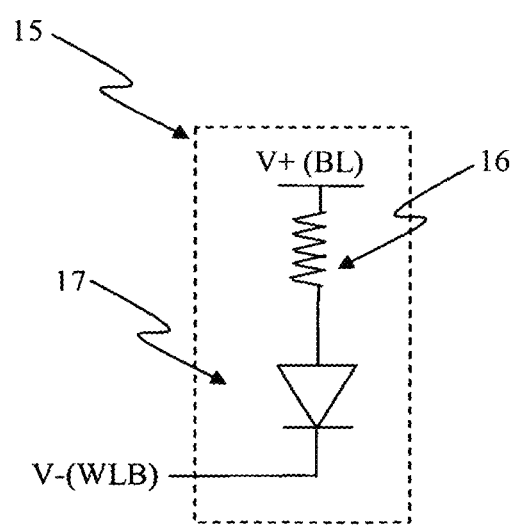
FIG. 2(c) shows another programmable resistive cell using diode as program selector.
Figure 3A:
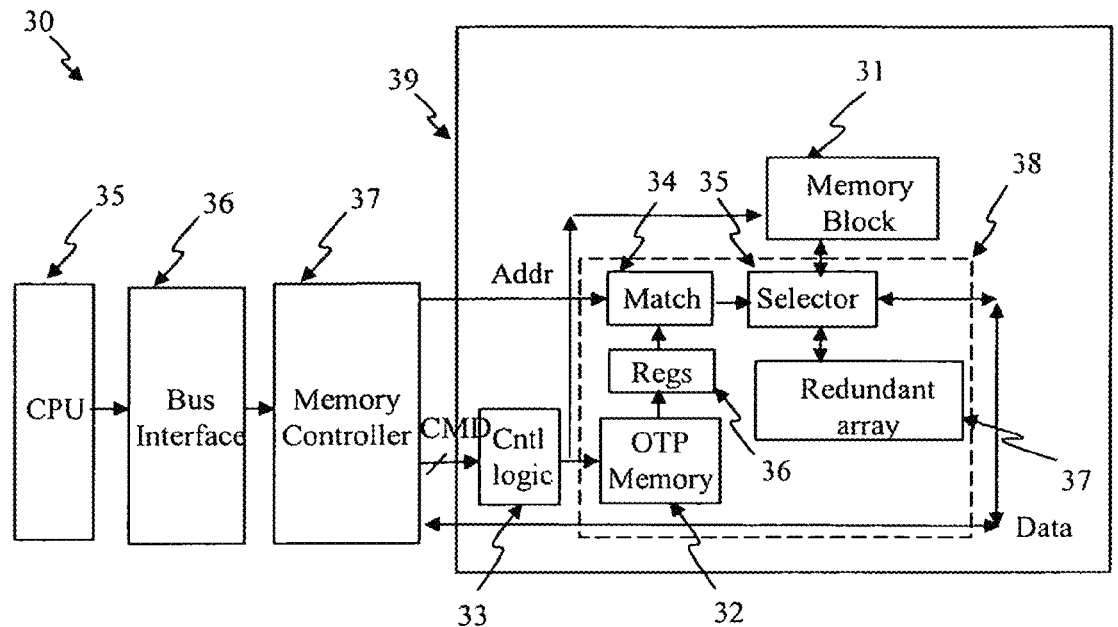
FIG. 3(a) shows a block diagram of in-system repair or configuration according to one embodiment.

FIG. 3(a) illustrates a block diagram of a portion of an electronic system 30 suitable for In-system repair or configuration according to one embodiment. A memory 39 to be repaired has at least one memory block 31, at least one redundancy block 38, and a control logic 33 shared between memory block 31. The redundancy block 38 has at least one OTP memory 32, volatile registers 36, a match circuit 34, a selector 35, and at least one redundant array 37. The defective addresses stored in the OTP 32 can be loaded into volatile registers 36 and then are used to compare with the incoming address to find any match in the match circuit 34. If there is a match, a redundant array 37, instead of a main array in the memory block 31, can be selected by the selector 35 for access. A control logic 33 is responsible to generate control signals to access the memory block 31 and to read or program the OTP memory 32 in the redundancy block 38. The control logic 33 can be coupled to a memory controller 37, a bus interface 36, and then to a CPU 35. For a general purpose electronic system, such as Personal Computer (PC), the memory controller 37, bus interface 36, and CPU 35 tends to be in separated chips, while the control logic 33 for accessing the OTP 32 can be integrated with the memory 39.

When the electronic system 30 is found not functional, the electronic system 30 can be rebooted in a privileged mode, e.g., safe mode in Window Operation System. A diagnosis program can be run to determine the causes of the system failure. If a system failure is due to memory defects in the memory 39, a repair program can be run to diagnose and possibly repair the memory 39 subsequently without taking the memory 39 out of the electronic system 30. The repair program run in a CPU 35 can communicate to a bus interface chip 36, which can further communicate to a memory controller 37. The memory controller 37 is responsible to generate read/write control signals for the memory 39, which includes one or more memory chips such as DRAM or flash. For simplicity, DRAM is used as an example to illustrate the concepts. The memory controller 37 can issue a serial of commands (CMD) signals to the DRAM. Issuing a CMD, such as a combination of CS/, WE/, CAS/, RAS/, and CKE, with address and input data, if needed, can do memory operations such as activation, pre-charge, refresh, read, or write in today's SDRAMs or DDR DRAMs.

When a memory, such as DRAM, is found mal-functional in a system, the first step is to find out how many redundant rows and/or columns in the memory 39 are available. For example, if a memory 39 has 3 redundant rows available but only two have been used, a new defective cell can be repaired by using the only one redundant row left. If there are two new defective cells found, this memory 39 can not be repaired unless these two cells are on the same row. The locations of the defective bits can be recorded by writing data into the memory and reading them back. Then, the addresses of the defective cells can be programmed into the OTP memory 32.

This can be achieved by using the memory controller 37 to send a command (CMD) to activate the OTP memory 32 in a serial interface, such as SPI, I2C, or the like. The command can be a combination of control signals not used before. The activation can be simply setting a bit in a register, such as Mode Register, to trigger a state machine in the control logic 33. The data to be programmed can be supplied from the I/Os of the memory 39. After programming OTP memory 32 is completed, the OTP memory 32 can be verified by using the memory controller 37 issuing another command to read the OTP memory. The read command can be a combination of control signals not used before. The activation can be simply setting a bit in a register, such as Mode Register, to trigger a state machine in the control logic 33. The data of the OTP memory 32 can be read through the I/Os of the memory 39. The same procedure can be applied to other defective bits and enable/disable bits until the addresses of all defective bits are programmed into the OTP memory 32. The address match can include enable or disable bits set or unset in another embodiment. The volatile registers 36 can be used to store data from the OTP memory for high bandwidth and fast access. In other embodiment, the volatile registers can be loaded with the data to be repaired directly from the memory controller 37. Then the memory diagnosis program can be run again to make sure if the defective bits can be fixed before programming the same data into the OTP memory 32 permanently.

Figure 3B:
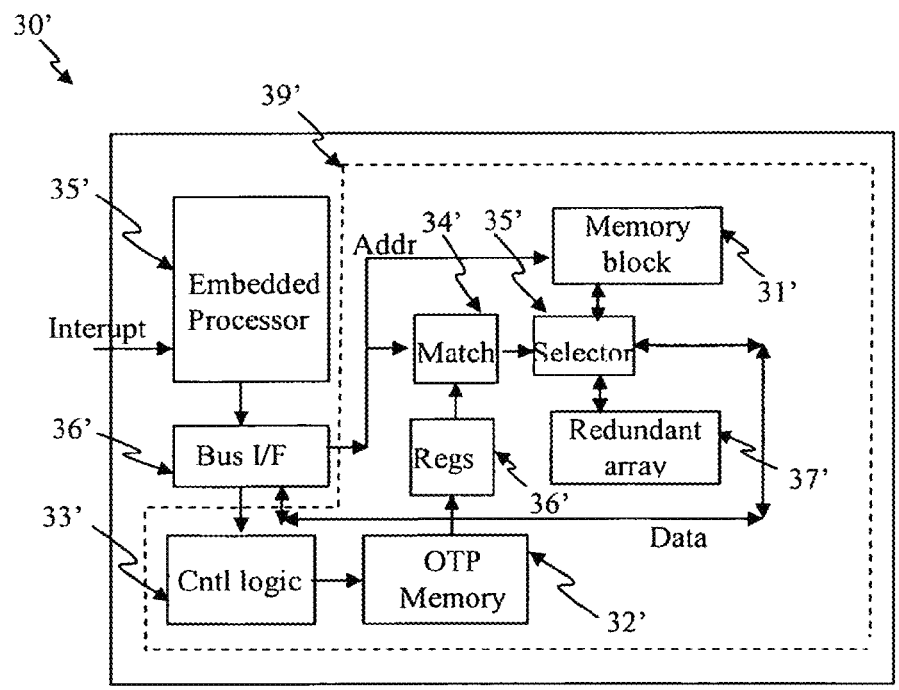
FIG. 3(b) shows a block diagram of in-system repair or configuration according to another embodiment.

FIG. 3(b) shows a block diagram of a portion of an SoC (System-in-a-Chip) 30' for in-system repair or configuration according to another embodiment. An embedded processor 35' can be coupled to a bus interface unit 36' and to a memory 39'. The memory 39' has a memory block 31', a redundant array 37', a selector 35', a match circuit 34', volatile registers 36', at least one OTP memory 32', and a control logic 33'. When the memory 39' is found mal-functional in the SoC 30', the first step is to find out how many redundant rows and/or columns in the memory 39' are available. For example, if a memory 39' has 3 redundant rows available but only two have been used, a new defective cell can be repaired by using the only one redundant row left. If there are two new defective cells found, this memory 39' can not be repaired unless these two cells are on the same row. The locations of the defective bits can be recorded by writing data into the memory and reading them back. Then, the addresses of the defective cells can be programmed into the OTP memory 32'. This can be achieved by using the bus interface unit 37' to send a command (CMD) to activate the OTP memory 32' in a serial interface, such as SPI, I2C, or the like. The command can be a combination of control signals not used before. The activation can be simply setting a bit in a register, such as Mode Register, to trigger a state machine in the control logic 33'. The data to be programmed can be supplied from the I/Os of the memory 39'. After programming OTP memory 32' is completed, the OTP memory 32' can be verified by using the bus I/F unit 37' issuing another command to read the OTP memory. The read command can be a combination of control signals not used before. The activation can be simply setting a bit in a register, such as Mode Register, to trigger a state machine in the control logic 33'. The data of the OTP memory 32' can be read through the I/Os of the memory 39'. The same procedure can be applied to other defective bits and enable/disable bits until the addresses of all defective bits are programmed into the OTP memory 32'. The address match can include enable or disable bits set or unset in another embodiment. The volatile registers 36' can be used to store data from the OTP memory for high bandwidth and fast access. In other embodiment, the volatile registers can be loaded with the data to be repaired directly from the bus I/F 36'. Then the memory diagnosis program can be run again to make sure if the defective bits can be fixed before programming the same data into the OTP memory 32' permanently.

There are various and equivalent embodiments for this invention. In one embodiment, the memory chips can be found defected by running diagnosis programs in a privileged mode (e.g., safe mode in Window). If a memory chip is found having defective bits (within the memory block 31 in FIG. 3(a) or 31' in FIG. 3(b)) and the memory redundancy is allowed fixing all of the defective bits, the memory chip can be repaired by running application software to program the redundant addresses and enable/disable bits in the OTP memory 32' integrated into the memory chip 30'. In another embodiment, the OTP memory 32' and the memory to be repaired can be integrated into an embedded processor such that the repair mechanism can be triggered and supervised by embedded CPU accordingly. In another embodiment, a portion of the repair software can be downloaded from Internet so that the repairs can be done in situ and in real time.

Figure 4A:
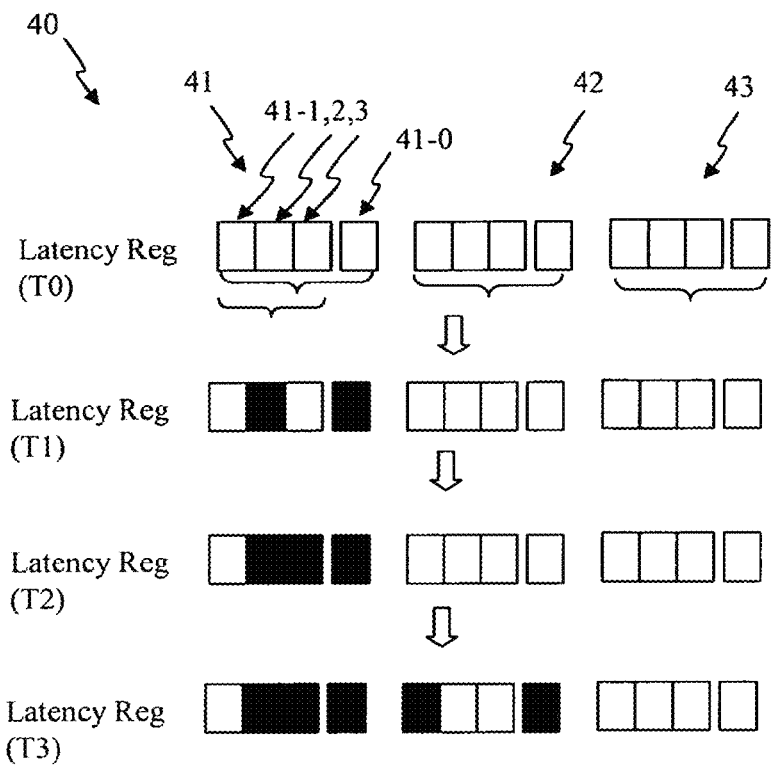
FIG. 4(a) shows a block diagram of configuring a latency register according to one embodiment.

FIG. 4(a) shows a block diagram 40 of procedures to configure a latency register step by step, according to one embodiment. The latency register has three sets of registers 41, 42, and 43. Each set has one enable bit and 3 data bits, shown as 41-0 and 41-1,2,3 for the set 41. When a DRAM is manufactured, these bits are not programmed as shown in time stamp T0. After testing, a DRAM's latency is found to be "2" so that a number 2 is programmed into registers 41-1,2,3 and the enable bit 41-0 is also programmed as shown in time stamp T1. After this DRAM is used for a while, assume that the latency is downgraded to "3" cycles so that the DRAM appears to be faulty. However, this DRAM can still be used again if the latency register can be changed to 3 by in-system programming bit 41-3 into 1 in time stamp T2. If this DRAM needs to be changed to latency of "4", a new set 42 can be enabled by programming 42-0 and 42-1 into 1s so that the set 41 can be automatically disabled when bit 42-0 is set, as shown in time stamp T3. The same scenario can go on to use set 43 if needed.

Figure 4B:
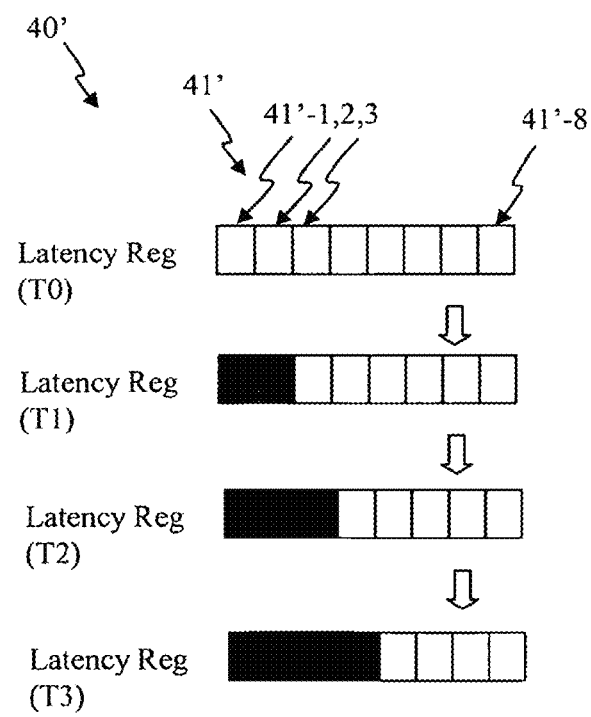
FIG. 4(b) shows a block diagram of configuring a latency register according to another embodiment.

FIG. 4(b) shows a block diagram 40' of procedures to configure a latency register 41' according to another embodiment. The latency register 41' has 8 bits, 41'-1 through 41'-8. After fabrication, all latency bits 41'-1 to 41'-8 are not programmed. If a DRAM is tested working at latency "2", bits 41'-1 and 41'-2 are programmed in time stamp T1. After using this DRAM in the system for a while, if the latency has degraded to "3" cycles, the latency register can be programmed to 3 by programming bit 41'-3 into 1 in time stamp T2. After further use, the DRAM is further degraded to "4" cycles. The latency register 41' can be reconfigured into "4" cycles by programming bit 41'-4 into 1. The same scenario can be utilized with respect to bits 41'-5 through 41'-8.

Figure 4C:
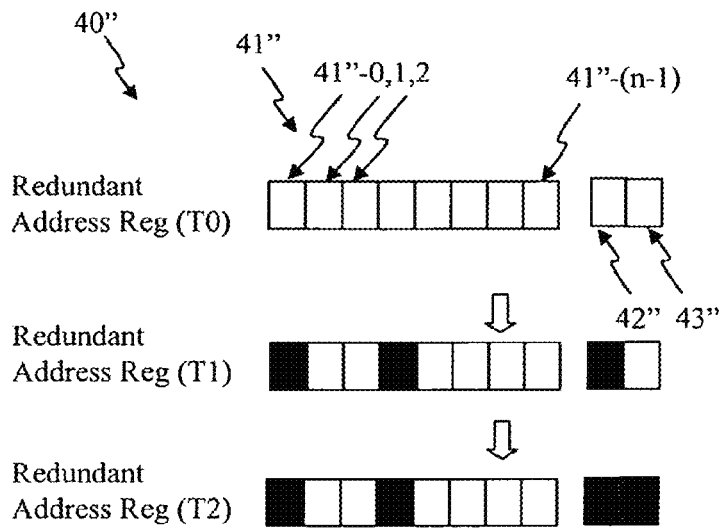
FIG. 4(c) shows a block diagram of enabling and disabling redundant address register according to one embodiment.

FIG. 4(c) shows a block diagram 40" of procedures to program a redundant address register 41" with enable and disable bits, 42" and 43", respectively. A redundant address register has n bits, 41"-0 through 41"-(n−1), one enable bit 42", and one disable bit 43". When the memory chip is manufactured, all bits are blank in time stamp T0. After testing, the memory chip is found faulty at address A[7:0]=0000,1001. Bits 41"-0 and 41"-3 are programmed accordingly, so is the enable bit 42" to indicate the redundant address is valid at time stamp T1. After using the memory for some time, this redundant address is found faulty again, this entry in the redundant address register 40" can be disabled by programming bit 43" at time stamp T2. With the disable feature, a redundant address can be invalided so that a new redundant address can be used to replace the old one.

Figure 4D:
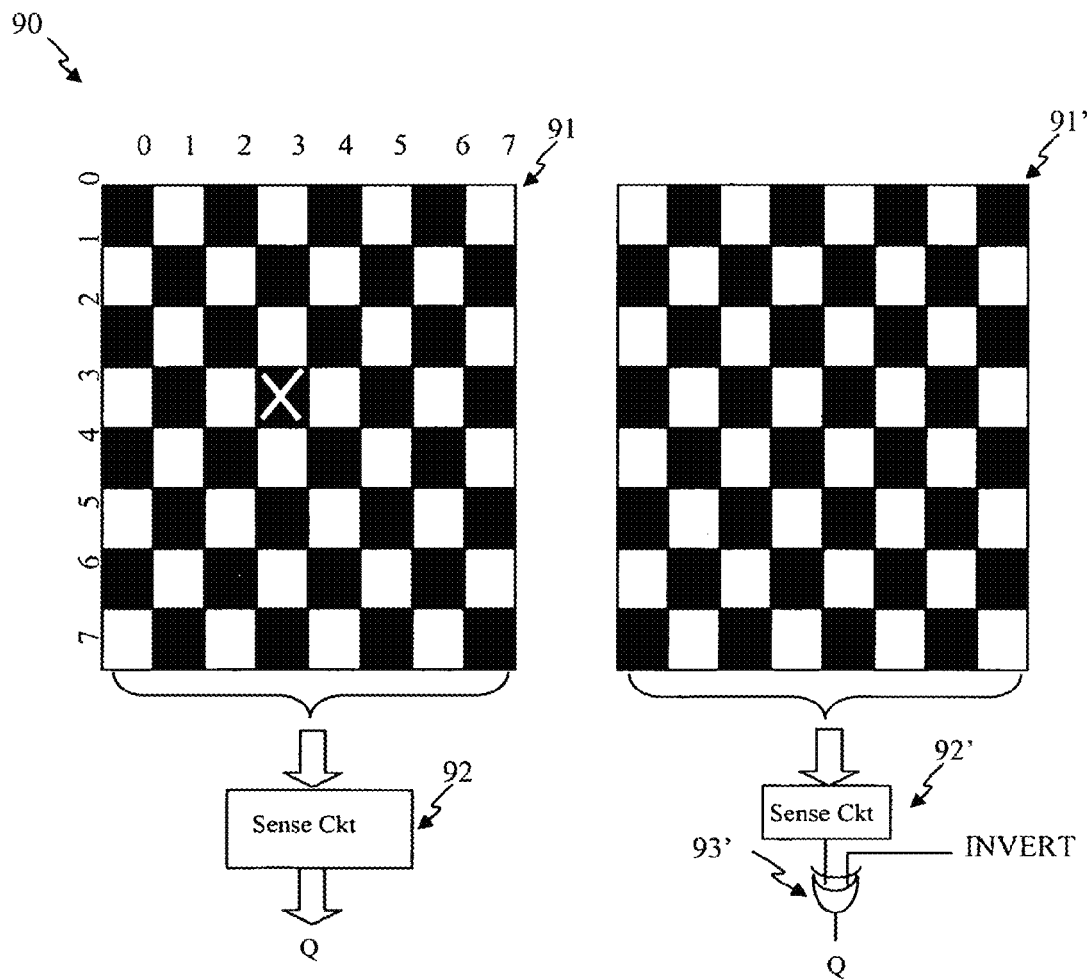
FIG. 4(d) shows a block diagram of a redundancy scheme by optional inversion according to one embodiment.

FIG. 4(d) shows a block diagram 90 of a simple redundancy scheme to fix a single-bit defect in an OTP I/O array before being used. A portion of an OTP memory I/O array 91 has 8×8 OTP cells, as an example. The cells in the OTP array 91 can be read by a sense circuit 92 to output a data Q. If the cell at address (3,3) is faulty, the read data would be 1 before program, instead of 0. A simple scheme to solve this problem is to inverting all data in the OTP array 91' during programming and to invert all data in the readout, once a defect bit has been detected and the data needs to be 0 in the defective bit location. The users need to attend to invert all data to be programmed and setting an INVERT bit to use this scheme. Inverting all data in the readout can be embodied by using an XOR gate 93' to the data coming out of the sense circuit 92' with the INVERT bit. The non-volatile bit INVERT needs to be set to indicate this scheme is activated for programming and for reading. If a blank portion of the OTP needs to be programmed again at a later time, this bit needs to be read to determine whether to invert the new data to be programmed by the users. The INVERT bit can be built as part of the OTP array or as a stand alone OTP bit that can be loaded into a volatile register upon initialization. If an OTP has n I/Os, this scheme can be used to fix up to n faulty bits with n non-volatile INVERT bits, presumably the n faulty bits are not located in the same I/O array.

Figure 4E:
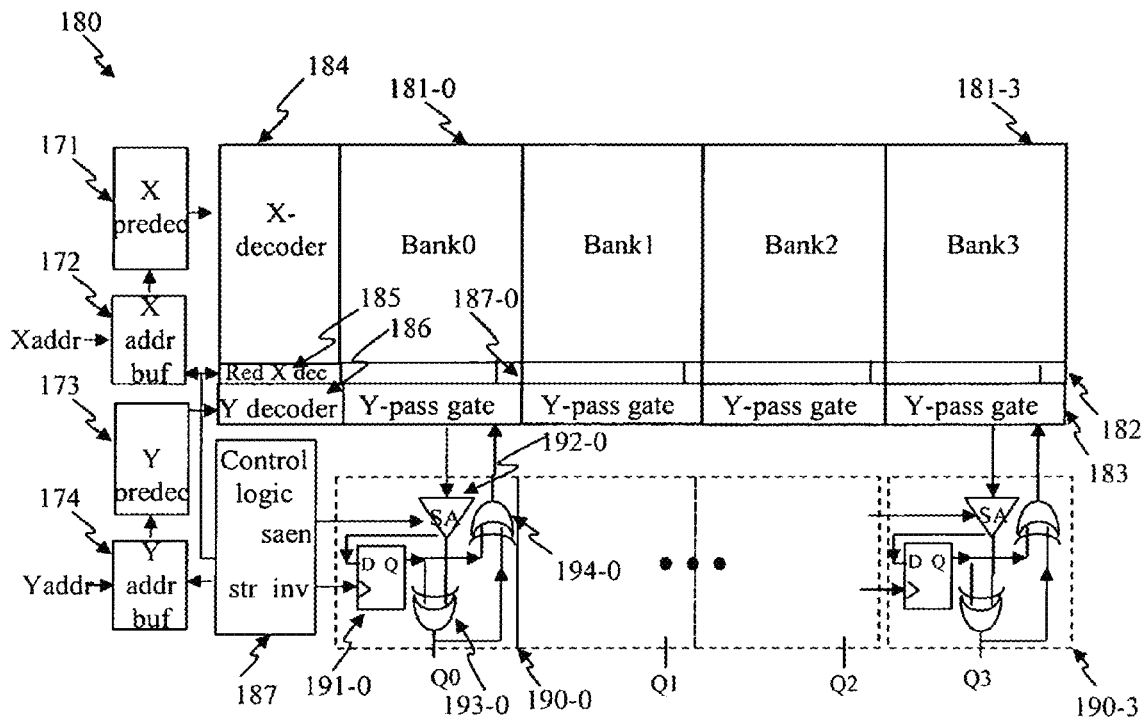
FIG. 4(e) shows a block diagram of an OTP memory with INV redundancy scheme according to one embodiment.

FIG. 4(e) shows a block diagram of a portion of an OTP memory 180 that uses the INVERT redundancy scheme, according to one embodiment. The OTP memory 180 has 4 banks of OTP arrays 181-0 through 181-3 associated with 4 I/Os Q0, Q1, Q2, and Q3, respectively. The OTP memory 180 has one redundant row 182, and Y-pass gates 183 for all 4 banks. The redundant row 182 can be used to store INVERT bits, such as 187-0, associated with each I/O and other information. The OTP banks 181-0 through 181-3 are organized as two-dimensional arrays with a plurality of rows and columns in each bank. Each row of the OTP banks 181-0 through 181-3 can be selected by the outputs of X decoder 184. The redundant row 182 can be selected by a redundant X decoder 185. And the Y-pass gates 183 can be selected by Y-decoder outputs 186. The X and Y decoders, 184 and 186, are coupled to the outputs of the X and Y pre-decoders 171 and 173, respectively, and which are further coupled to the outputs of the X and Y address buffers, 172 and 174, respectively. Each bank has I/O circuits 190-0 through 190-3. Each I/O circuit has a sense amplifier (SA) 192-0 coupled to the selected column through the output of the Y-pass gate 183. The output of the SA 192-0 can be sent to the output Q0 through an XOR 193-0 and/or to a latch or register 191-0. The other input of the XOR 193-0 can be the output of the latch or register 191-0. As for the program path, Q0 can be the input data go through an XOR 194-0 and Y-pass gate 183 to the selected column. The other input of the XOR 194-0 can be the output of the latch or register 191-0 so that the input data to be programmed can be inverted, if the data in the latch/register 191-0 is 1. In other embodiment, the program data can be inverted externally so that the program XOR 194-0 can be omitted. For example, the OTP can be programmed only when the data are "0", not 1, if INVERT bit is set to 1. This is particularly more suitable for programming one bit at a time. If the program XOR 194-0 is omitted, the INVERT bit 187-0 needs to be checked every time programming into a blank area in the main array. Block 187 is a control logic, responsible to generate timing signals for read and program.

The INVERT scheme in the macro level can be further described in the following. All bits need to be check if they are in the virgin state (i.e. 0-state) before the OTP macro can be used. If all bits are read 0s, this means there are no defects in the OTP memory such that this OTP macro can be ready for use. However, if every I/O bank has no more than a single bit read 1, this OTP macro can still be repaired by programming a bit in a specific column in the redundant row 182 as an INVERT bit for those I/O banks have single defect. Every time this OTP is ready for use, the INVERT bit needs to be read and stored in a latch/register, such as 191-0. Subsequently any data to be read from the OTP memory or to be programmed into the OTP memory will be inverted if the corresponding INVERT bits are programmed in each bank. Inversion of the data can be easily embodied as going through an XOR gate, such as 193-0 or 194-0, with the INVERT bit, in the read or program path, respectively. The INVERT bit cell and latch/register is associated with one I/O.

Figure 4F:
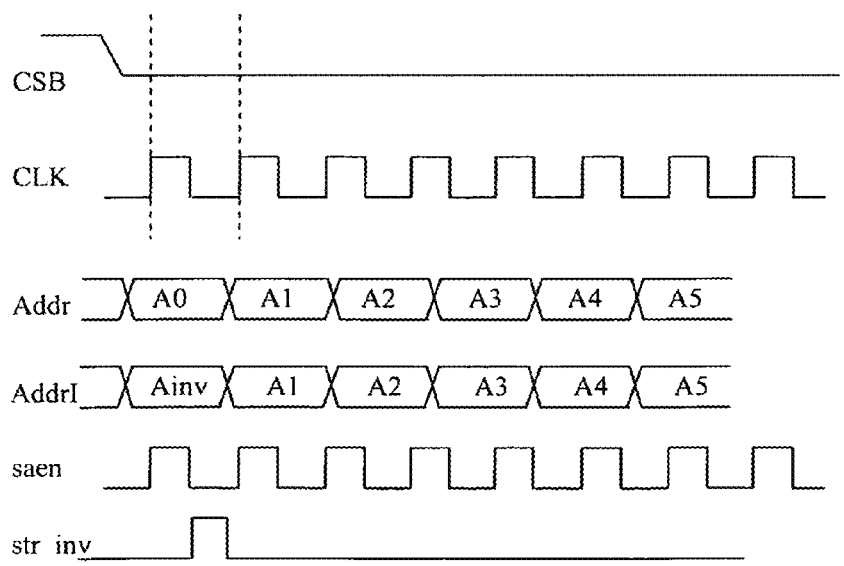
FIG. 4(f) shows a timing waveform of reading and storing the INV bit before any read transactions.

FIG. 4(f) shows a timing waveform of reading and storing INVERT bit before any read transactions can happen. When chip select bar (CSB) goes from high to low, this OTP memory is ready to use. The input addresses Addr to access the OTP are supposedly A0, A1, A3, etc. However, the address in the first cycle after CSB is enabled is replaced by an INVERT bit address internally as AddrI, so that a particular INVERT bit in redundancy cells can be read by the same sense amplifiers to sense data. The sense amplifier can be enabled by asserting "saen". After the data are sensed, the INVERT latch/register 191-0 can be enabled by asserting "str_inv" to store sensed data into latch/register 191-0, only in the first cycle. Subsequently, all data read out will be inverted once the INVERT bits are read, stored, and found set to 1. If the number of the INVERT address is more than the I/O width, reading and storing INVERT bits can be more than one cycle, upon CSB is asserted. In one embodiment, the INVERT bits are stored in a redundant row and can be accessed by column addresses. In another embodiment, the redundant row is an integrated with the main array.

The above discussions are for illustrative purposes. The INVERT bit for each bank can be programmed or read individually. The INVERT bits can be stored in a redundant row in the OTP array or as individual OTP cells. The redundant row can be integrated into the OTP array or as a stand-alone row. The locations in the redundant row to store INVERT bits can vary and selected by specific Y-addresses. The mirror storage of the INVERT bits can be latches or flip-flops. Reading INVERT bits into volatile storage can be triggered during initialization, such as powering up, enable read/program, or enabling OTP macro.

Figure 5A:
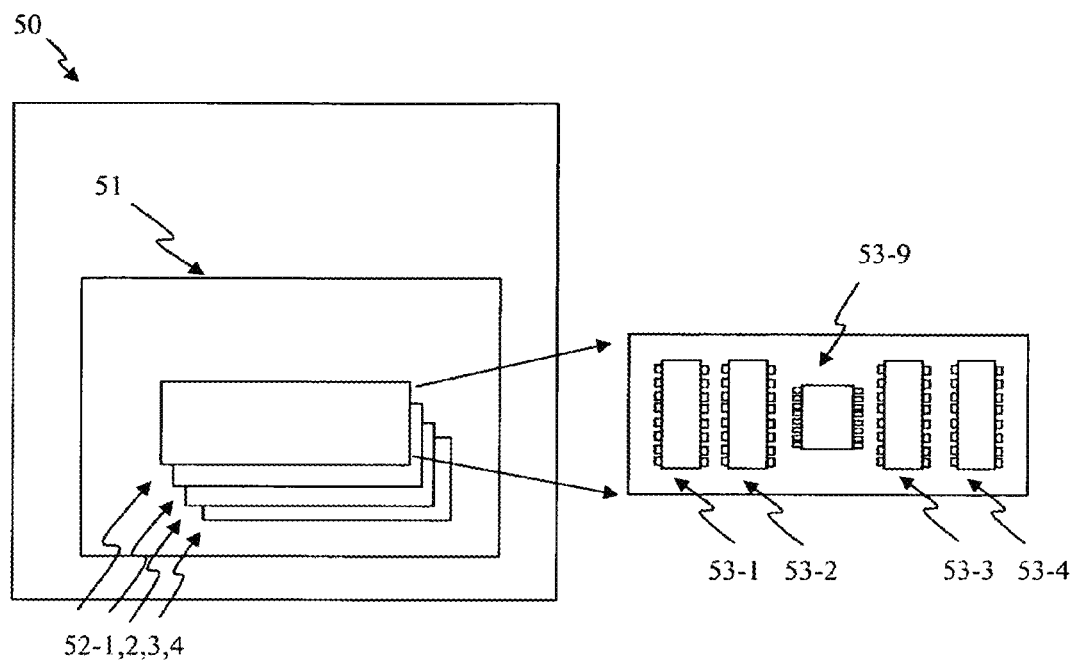
FIG. 5(a) shows a block diagram of hardware in an electronic system having at least one memory module for in-system repair or configuration.

Some in-system repair or configuration implementations can utilize some aspects in hardware. FIG. 5(a) shows a block diagram of a system 50 that has at least one Printed Circuit Board (PCB) 51, which has four DRAM modules 52-1,2,3,4. Each DRAM module has four discrete DRAM chips, 53-1,2,3,4, and a local memory controller 53-9. For example, if each DRAM chip has 1 GB of memory capacity, a module with four DRAM chips would have 4 GB. A PCB 51 having four DRAM modules would have memory capacity of 16 GB. Conventionally, if a single bit is faulty in a DRAM chip, the whole DRAM module needs to be replaced if the in-system repair or configuration scheme is not available.

Figure 5B:
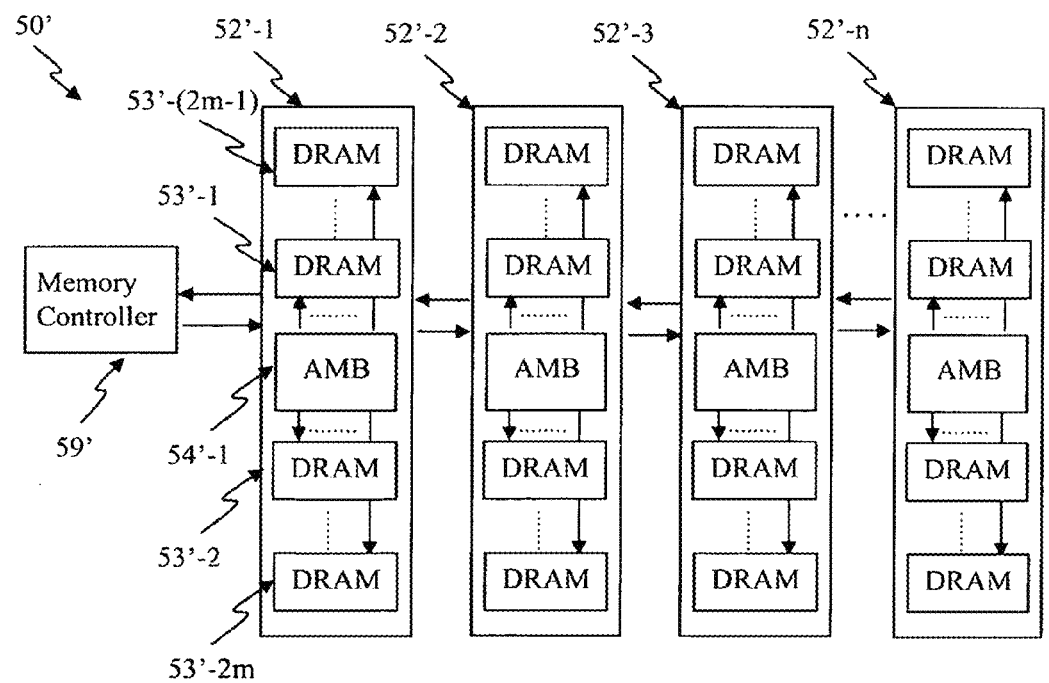
FIG. 5(b) shows a block diagram of a schematic of memory controller and memories in memory modules for in-system repair or configuration.
Figure 5C:
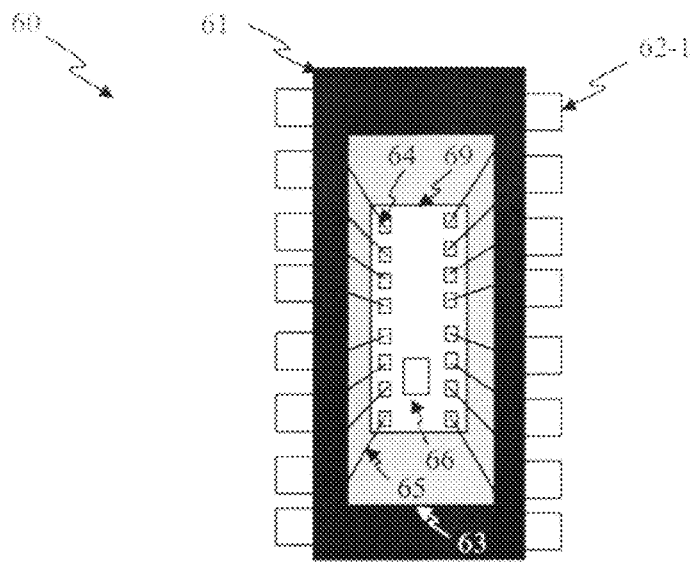
FIG. 5(c) shows a block diagram of integrated circuit package for in-system repair or configuration.
Figures 5D, 5E:
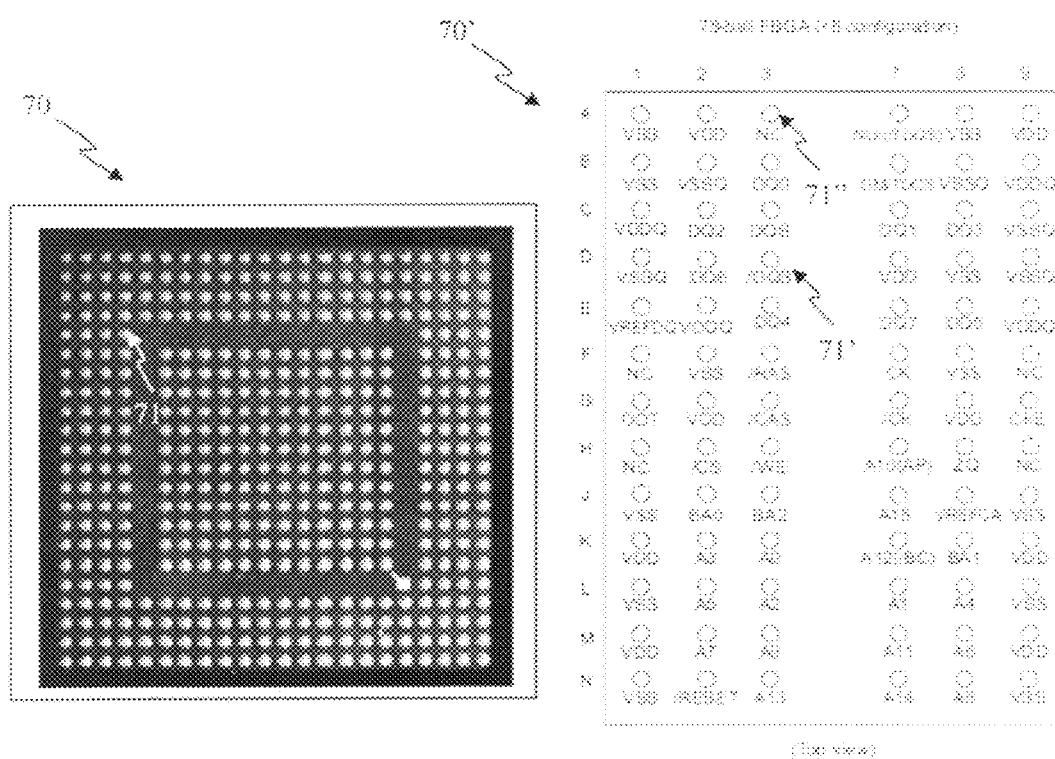
FIG. 5(d) shows a bottom view of a BGA package of an integrated circuit for in-system repair or configuration.
FIG. 5(e) shows a pin configuration of a DDR2 SDRAM chip for in-system repair or configuration.

FIG. 5(b) shows a block diagram of a schematic of a DRAM sub-system 50'. A memory controller 59' communicates with n DRAM modules 52'-1 through 52'-n. Each DRAM module 52'-i, where i=1, 2, 3, . . . , n, has a local memory controller called Advanced Memory Buffer (AMB) 54'-i to communicate with 2m DRAM chips, 53'-1, 53'-3, . . . , 53'-(2m−1) in one side and another 2m chips 53'-2, 53'-4, . . . , 53'-2m in the other side. The local memory controller 54'-*i* is responsible for generating differential signals upon receiving single-end signals from memory controller 59'.

FIG. 5(*c*) shows a bonding diagram of a DRAM chip 60 in a package, as an example. The DRAM chip 60 has a package body in plastic mold 61 and 16 pins 62-1 through 62-16, as an example. A lead frame has pins 61-1 through 61-16 in the outside and a cavity 63 in the center to accommodate a DRAM die 69 in the cavity 63. The DRAM die has 16 bonding pads 64-*i* to connect to each pin 62-*i*, through bonding wires 65-*i*, where i=1, 2, 3, . . . , 16. After bonding wires 65-*i* are attached between the die 69 and the lead frame, the body of the lead frame can be placed in a plastic molding. The DRAM chip 69, namely, the DRAM die 69 has at least one OTP memory 66 to store defective addresses. It is useful for OTP memory 66 to be able to program in low core or I/O compatible voltages. If not, high voltage supplies need to be generated inside the DRAM chip 60 because the pin outs of commodity memories are determined by JEDEC standards. Moreover, the OTP's programming voltage is more preferably below 4.0V, or even 3.3V in other embodiment, to prevent high voltage damaging the oxide and creating more undesired leakage current in the DRAM chip 60. Therefore, the OTP memory should have low program voltage, small size, and be I/O voltage compatible. An OTP using silicided polysilicon as OTP element and diode as program selector in standard CMOS processes can serve these purposes, according to one embodiment.

The DRAM package shown in FIG. 5(*c*) is a Dual-In-Line Package (DIP), as an example. DRAM packages can be Thin-Small Outline Package (TSOP), Ball Grid Array (BGA), or Fine Ball Grid Array (FBGA) in newer generations. FIG. 5(*d*) shows a bottom view of a DRAM BGA package 70 with many small balls 71 for sold bumps. FIG. 5(*e*) shows a ×8 pin configuration of a DDR3 SDRAM 70' in a 78-ball FBGA package according to JEDEC standard. The pin configuration 70' has signal balls 71' and Non-Connect (NC) balls 71". The NC balls can be used to supply high voltages for OTP programming in one embodiment of this invention. Alternatively, all input and output pins in the DRAM package can be supplied with voltage as high as 2.5V for programming.

Figure 6A:
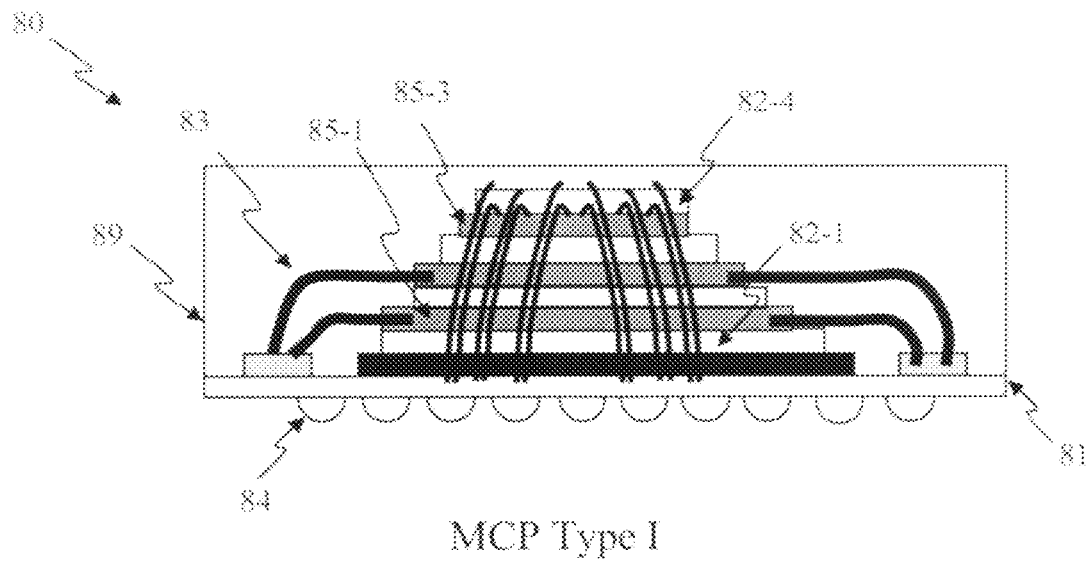
FIG. 6(a) shows a diagram of a Type I Multiple-Chip Package (MCP) for in-system repair or configuration.
Figure 6B:
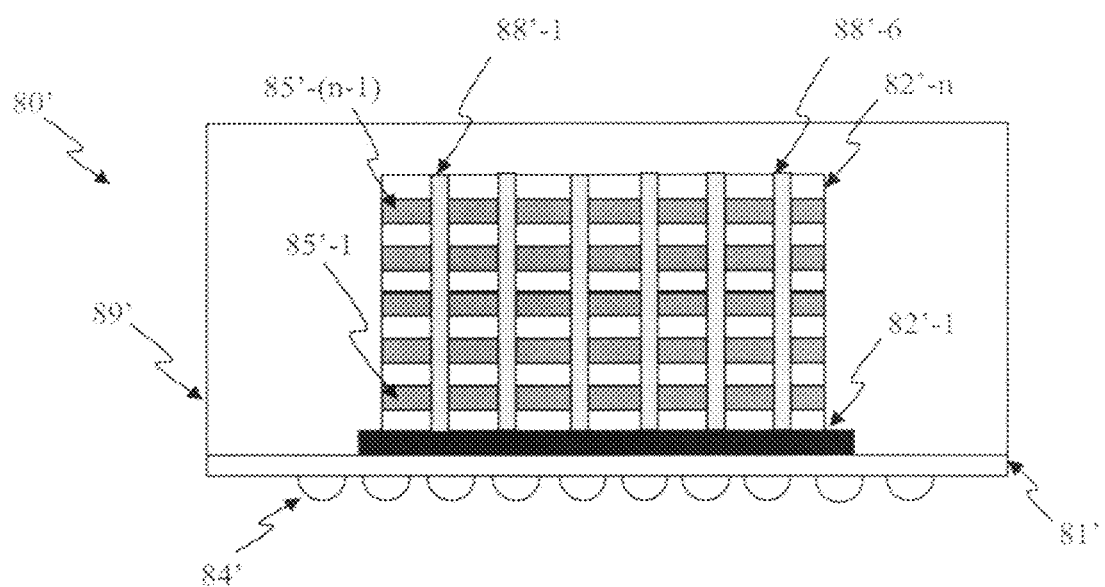
FIG. 6(b) shows a diagram of a Type II Multiple-Chip Package (MCP) for in-system repair or configuration.

FIG. 6(*a*) shows a cross section of a Type I Multiple-Chip Package (MCP) 80 for in-system repair or configuration, according to one embodiment. The MCP 80 has a package body 89 built on a substrate 81. The substrate 81 is basically a small PCB to route signals from dies 82 to solder bumps 84. There are four integrated circuit dies 82-1 through 82-4 stacking one on top of the other. The upper dies tend to be smaller or remain the same. Between the dies 82 are interposers 85-1 through 85-3. There are bonding wires 83 to interconnect dies to dies or dies to the package substrate. The dies can be CPU, ASIC, or memory (e.g., any of various types including DRAM, or mixed kinds of memories such as SRAM, DRAM, or flash). There can also be a memory controller built into the stack. The OTP memory for in-system repair or configuration can be integrated into the dies for the memories or the memory controller within the stack.

FIG. 6(*b*) shows a cross section of a Type II Multiple-Chip Package (MCP) 80' for in-system repair or configuration, according to another embodiment. The MCP 80' has a package body 89' built on a package substrate 81'. The substrate 81' is basically a small PCB to route signals from dies 82' in the stack to solder bumps 84'. There are n integrated circuit dies 82'-1 through 82'-*n* stacked one on top of the other. Between the dies 82' are interposers 85'-1 through 85'-(*n*−1). Through Silicon Vias (TSVs) 88'-1 through 88'-6 are holes drilled through silicon for interconnect. TSVs 88' can be between one or a few adjacent dies, between any dies to substrate, or can be from the top most die through all dies to the package substrate as shown in FIG. 6(*b*). The TSVs 88' can have very small diameter of ~10 um and can be hundreds or thousands of vias in a single die. Moreover, TSVs can be placed any where in a die, instead of placing around the edges of dies in the bonding wire technology. Comparing with bonding wires, TSVs can be smaller and denser, but difficult to manufacture and higher costs. The dies can be CPU, ASIC, same kinds of memories such as DRAM, or mixed kinds of memories such as SRAM, DRAM, or flash. The dies can be CPU, ASIC, or memory (e.g., any of various types including DRAM, or mixed kinds of memories such as SRAM, DRAM, or flash). There can also be a memory controller built into the stack. The OTP memory for in-system repair or configuration can be integrated into the dies for the memories or the memory controller within the stack.

The above discussions on memory packages (DIP, TSOP, BGA, FBGA, etc.), memory module, multiple-chip module, Wafer Scale Package (WSP), Wafer Level Package (WLP), package-in-package (PoP), System-in-Package (SiP), or 3D IC using bonding wires, TSVs, or combinations thereof are for illustrative purposes. The module or multiple-chip module can include at least one OTP memory integrated into any dies of same type of memory, mixed types of memory, processors, ASICs, or memory controllers. In addition, with stacked dies, the numbers of dies within the stack can vary. The number of bonding wires or TSVs can also vary. There are many varieties and equivalent embodiments.

Figure 7:
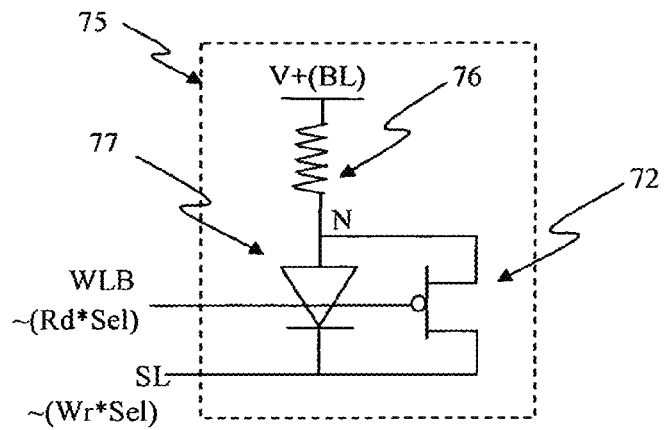
FIG. 7(a1) shows a schematic of an OTP cell with a PMOS for low power applications according to one embodiment.
Figure 7:
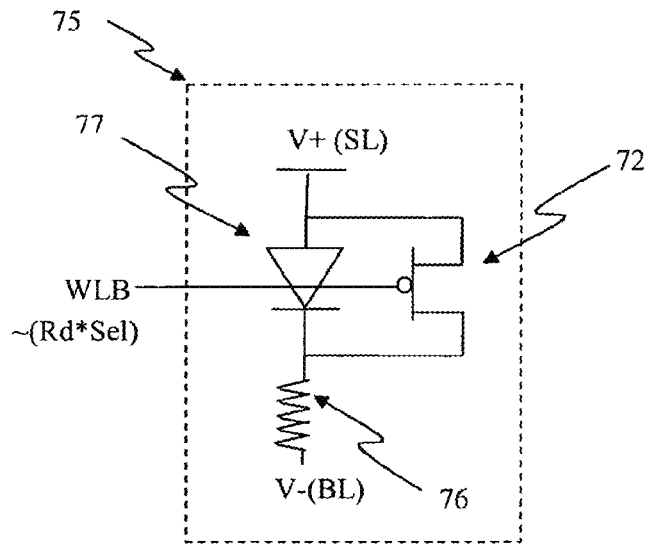
Figure 7:
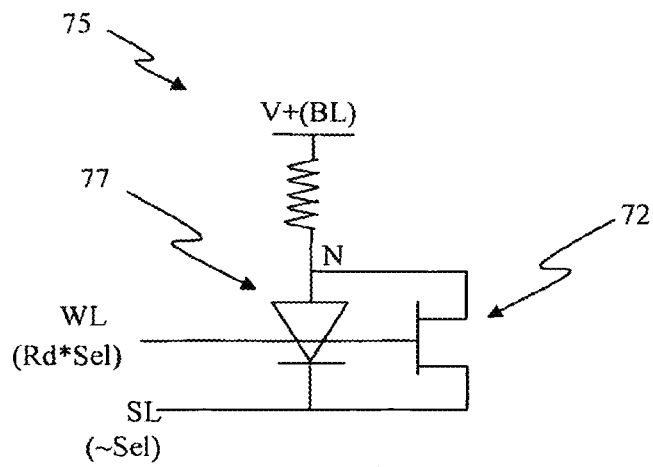
Figure 7:
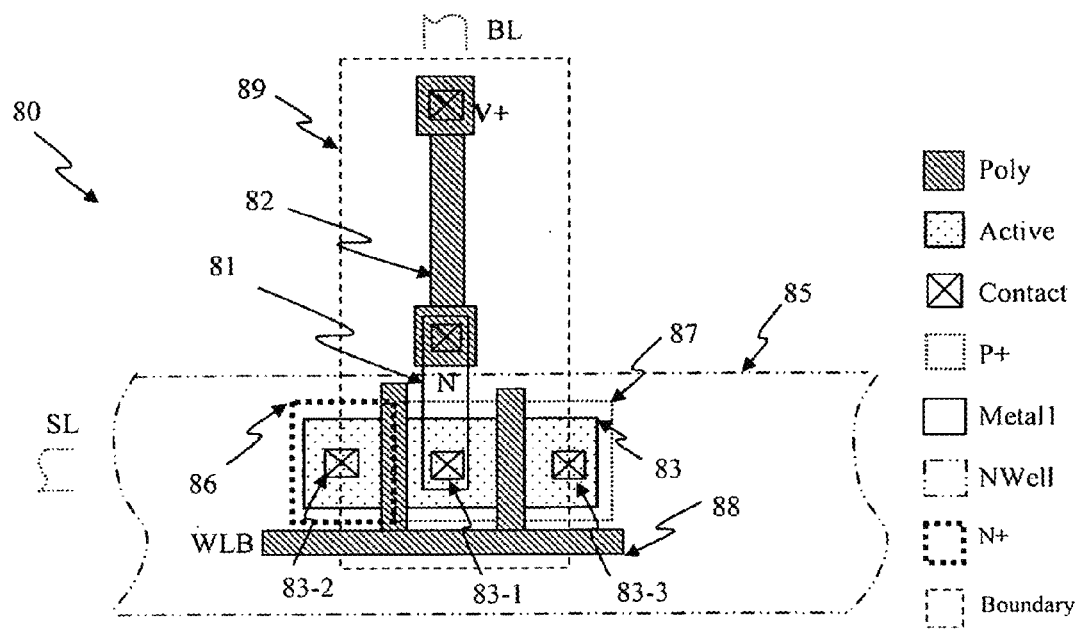
Figure 7:
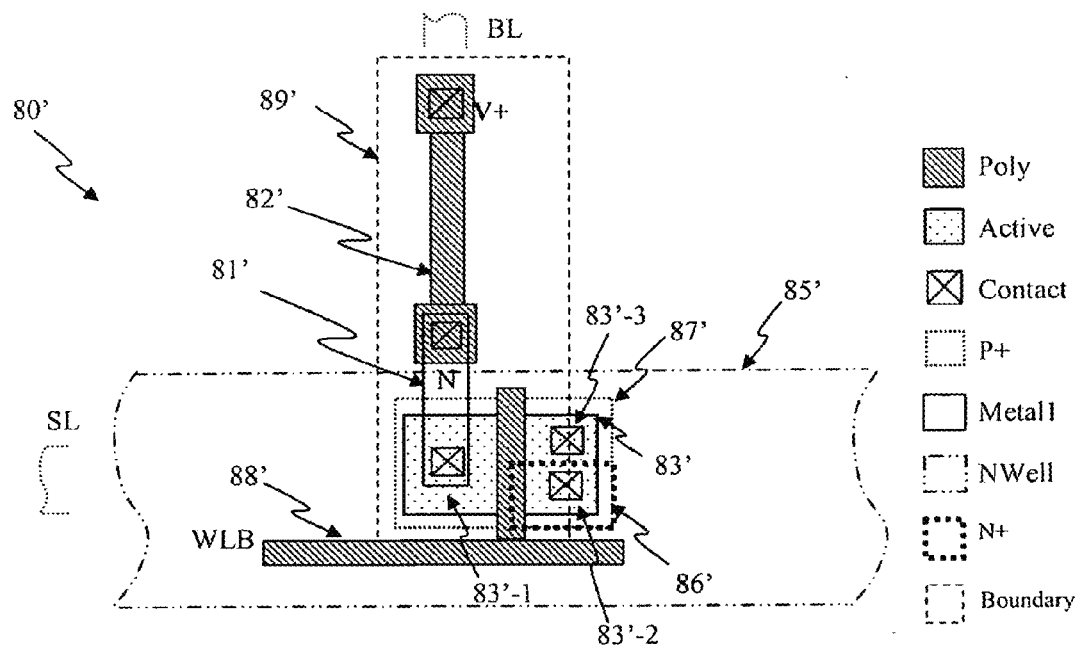
Figure 7:
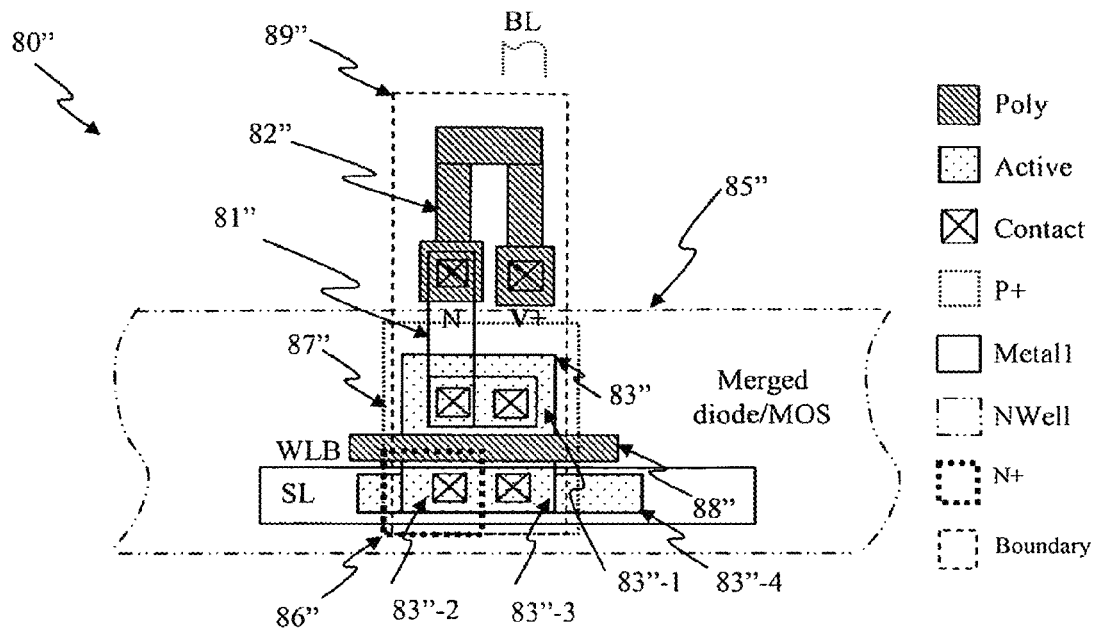
Figure 7:
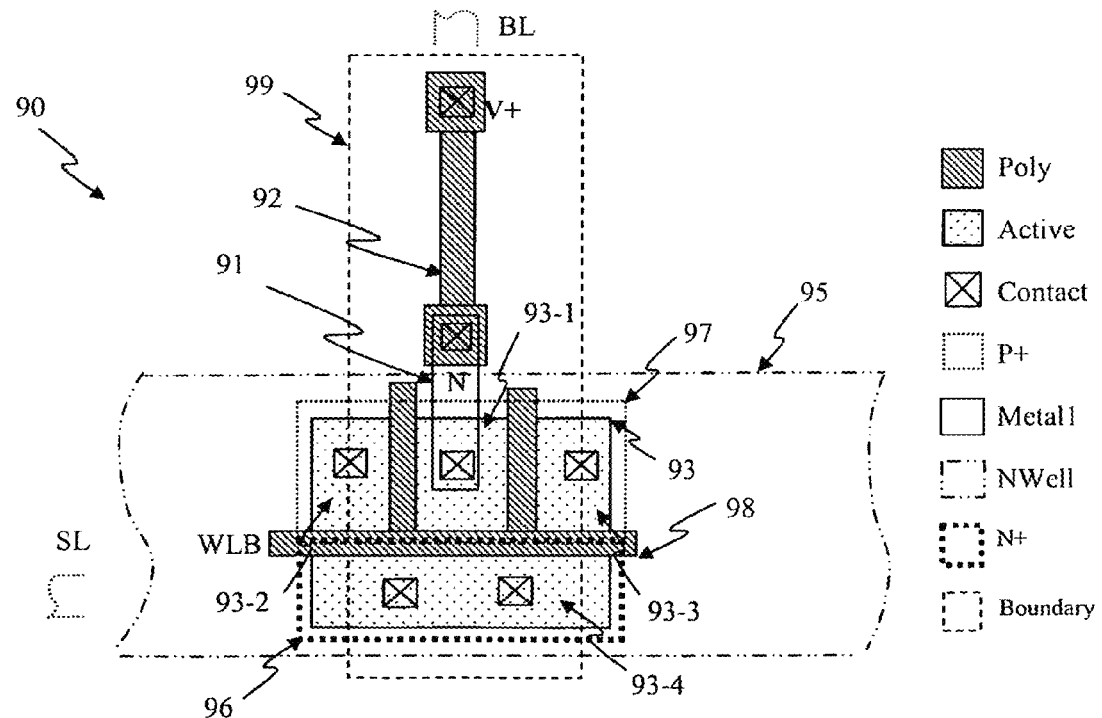
Figure 7:
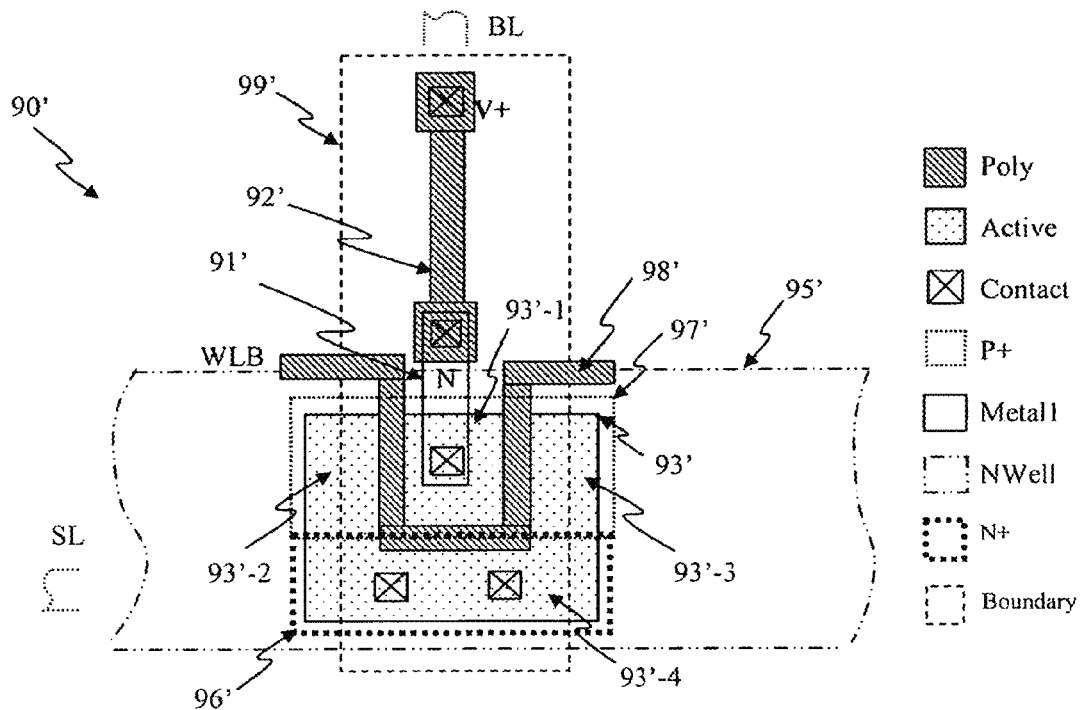
Figure 7:
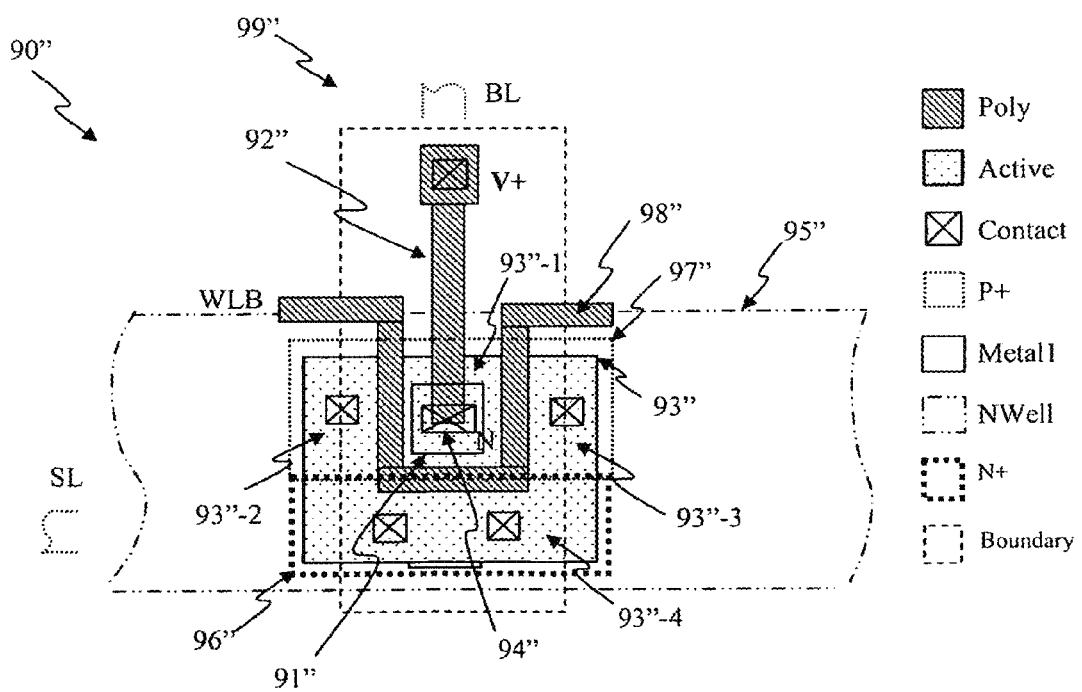

FIG. 7(*a*1) shows a programmable resistive device cell 75 for low voltage and low power applications. The I/O voltage supply of a DRAM can be down to 1.2V such that the diode's high turn-on voltage 0.7V as read/program selector can restrict the read margins. Therefore, a MOS can be used as read selector in the cell for better read performance according to another embodiment. The programmable resistive cell 75 has a programmable resistive element 76, a diode 77 as program selector, and a MOS 72 as read selector. The anode of the diode 77 (node N) is coupled to the drain of the MOS 72. The cathode of the diode 77 is coupled to the source of the MOS 72 as Select line (SL). The programmable resistive element 76 is coupled between node N and a high voltage V+, which can serve as a Bitline (BL). By applying a proper voltage between V+ and SL for a proper duration of time, the programmable resistive element 76 can be programmed into high or low resistance states, depending on voltage/current and duration. The diode 77 can be a junction diode constructed from a P+ active region on N well and an N+ active region on the same N well as the P and N terminals of a diode, respectively. In another embodiment, the diode 77 can be a diode constructed from a polysilicon structure with two ends implanted by P+ and N+, respectively. The P or N terminal of either junction diode or polysilicon diode can be implanted by the same source or drain implant in CMOS devices. Either the junction diode or polysilicon diode can be built in standard CMOS processes without any additional masks or process steps. The MOS 72 is for reading the programmable resistive device. Turning on a MOS in linear mode can have a lower voltage drop than a diode's for low voltage operations. To turn on the diode 77, the cathode of the diode can be set to low for the selected row during write, i.e. ~(Wr*Sel) in one embodiment. To turn on the MOS 72, the gate of the MOS can be set to low for the selected row during read, i.e. ~(Rd*Sel) in one embodiment. If the program voltage is VDDP=2.5V and core voltage for read can be VDD=1.0V, the selected and unselected SLs for program can be 0 and 2.5V, respectively. The SLs can be all set to 1.0V for read. The selected and unselected WLBs for read are 0 and 1.0V, respectively. The programmable resistive memory cell 75 can be organized as a two-dimensional array with all V+'s in the same columns coupled together as bitlines (BLs) and all MOS gates and sources in the same rows coupled together as wordline bars (WLBs) and Source Lines (SLs), respectively.

FIG. 7(a2) shows a schematic of another programmable resistive cell according to another embodiment. FIG. 7(a2) is similar to FIG. 7(a1) except that the placement of the resistive element and diode/MOS are interchanged. V+'s of the cells in the same row can be coupled to a source line (SL) that can be set to VDDP for program and VDD for read. V−'s of the cells in the same column can be coupled as a bitline (BL) and further coupled to a sense amplifier for read and set to ground for program. The gates of the MOS in the same row can be coupled to a wordline bar (WLB) that can be set to low when selected during read, i.e. ~(Rd*Sel), in one embodiment.

FIG. 7(a3) shows a schematic of another programmable resistive cell according to another embodiment. FIG. 7(a3) is similar to FIG. 7(a1) except that the PMOS is replaced by an NMOS. V+'s of the cells in the same column can be coupled as a bitline (BL) that can be coupled to VDDP for program and coupled to a sense amplifier for read. The cathodes of the diode and the sources of the MOS in the same row can be coupled as a source line (SL). The SL can be set to ground when selected for read or program. The gates of the MOS in the same row can be coupled as a wordline (WL) that can be set high when selected for read, i.e. Rd*Sel, in one embodiment.

FIG. 7(a4) shows a schematic of using at least one PMOS configured as a diode or MOS for program or read selector according to one embodiment. The programmable resistance device cell 170 has a programmable resistive element 171 coupled to a PMOS 177. The PMOS 177 has a gate coupled to a read wordline bar (WLRB) and a drain coupled to a program wordline bar (WLPB), a source coupled to the programmable resistive element 171, and a bulk coupled to the drain. The PMOS 177 can have the source junction or the channel conducted to behave like a diode or MOS selector, respectively, for the selected cells during programming. The PMOS 177 can also have the source junction or the channel conducted to behave like a diode or MOS selector, respectively, during reading.

FIG. 7(a4') shows a cross section of the cell in FIG. 7(a4) to further illustrate the program and read path using at least one PMOS as a selector configured as diode or MOS according to one embodiment. The programmable resistive device cell 170' has a programmable resistive element 171' coupled to a PMOS 177' that consists of a source 172', gate 173', drain 174', bulk (N well) 176', and N well tap 175'. The PMOS has a special conduction mode that is hard to find in any ordinary CMOS digital or analog designs by pulling the drain 174' to a low voltage (e.g. ground) to turn on the source junction diode 172' for programming as shown in a dash line. Since the diode has an I-V characteristic of an exponential law than a square law in MOS, this conduction mode can deliver high current to result in smaller cell size and low program voltage. The PMOS can be turned on during read to achieve low voltage read.

The operation conditions of the cells corresponding to FIGS. 7(a4) and 7(a4') are further described in FIGS. 7(a4") and 7(a4''') to illustrate the novelty of the particular cells. FIG. 7(a4") shows operation conditions of programming by diode or by MOS. During programming, the selected cells can have WLPB coupled to a low voltage (i.e. ground) to turn on the source junction diode, while the WLRB can be coupled to VDDP, the program voltage, or any voltage in one embodiment. The WLPB can be coupled to VDDP and WLRB coupled to a low voltage to turn on the MOS for programming in another embodiment. The WLPB and WLRB of the unselected cells can be both coupled to VDDP. In another embodiment, the WLPB and WLRB of the selected cells can be both set to a low voltage such that both diode and MOS can be turned on during programming.

FIG. 7(a4''') shows operation conditions of reading by diode or by MOS, corresponding to FIGS. 7(a4) and 7(a4'). During reading, the selected cells can have the WLPB coupled to VDD core voltage and the WLRB coupled to a low voltage to turn on the PMOS in FIG. 7(a4) in one embodiment. The selected cells can also have the WLPB coupled to a low voltage and the WLRB coupled to VDD, or any voltage, to turn on the source junction diode 172' of the PMOS 177' in FIG. 7(a4'). The WLPB and WLRB of the unselected cells can be coupled to VDD. In another embodiment, the WLPB and WLRB of the selected cells can be both set to a low voltage such that both diode and MOS can be turned on during reading. There can be a mix of program or read by diode or MOS in different combinations. The PMOS can be drawn in the layout like a conventional PMOS without any design rule violations, but the operation voltages applied to the PMOS terminals are quite different from the conventional means.

FIG. 7(b1) shows a top view of a programmable resistive cell 80 that corresponds to the schematic in FIG. 7(a1), according to one embodiment. A one-piece active region 83 inside an N well 85 is divided into 83-1, 83-2, and 83-3 by a polysilicon gate 88, to serve as anode of diode, cathode of diode, and source of MOS, respectively. The active region 83-2 and a portion of MOS gate 88 is covered by an N+ implant 86, while the rest of the active region is covered by a P+ implant 87. A programmable resistive element 82 has one end coupled to the anode of the diode by a metal 81, and the other end coupled to a supply voltage line V+, or Bitline (BL). The cathode of the diode 83-2 and the source of the MOS 83-3 can be coupled as Source Line (SL) by a higher level of metal running horizontally.

FIG. 7(b2) shows another top view of a programmable resistive device cell 80' that corresponds to the schematic in FIG. 7(a1), according to another embodiment. A one-piece active region 83' inside an N well 85' is divided into 83'-1, 83'-2, and 83'-3 by a polysilicon gate 88' and an N+ implant 86', to serve as anode of diode, cathode of diode, and source of MOS, respectively. The active region 83'-2 and a portion of MOS gate 88' is covered by an N+ implant 86', while the rest of the active region is covered by a P+ implant 87'. A programmable resistive element 82' has one end coupled to the anode of the diode by a metal 81', and the other end coupled to a supply voltage line V+, or Bitline (BL). The cathode of the diode 83'-2 and the source of the MOS 83'-3 are coupled as Source Line (SL) by a higher level of metal running horizontally.

FIG. 7(b3) shows yet another top view of a programmable resistive device cell 80" that corresponds to the schematic in FIG. 7(a1), according to yet another embodiment. A one-piece active region 83" inside an N well 85" is divided into 83"-1, 83"-2, and 83"-3 by a polysilicon gate 88" and an N+ implant 86", to serve as anode of diode, cathode of diode, and source of MOS, respectively. The active region 83"-2 and a portion of MOS gate 88" is covered by an N+ implant 86", while the rest of the active region is covered by a P+ implant 87". A programmable resistive element 82" has one end coupled to the anode of the diode by a metal 81", and the other end coupled to a supply voltage line V+, or Bitline (BL). The resistive element 82" can be bent to fit into the space more efficiently. The cathode of the diode 83"-2 and the source of the MOS 83"-3 are coupled as Source Line (SL) by an additional active region 83"-4 and a higher level of metal running horizontally.

FIG. 7(b4) shows a top view of a programmable resistive cell 90 that corresponds to the schematic in FIG. 7(a1), according to one embodiment. A one-piece active region 93 inside an N well 95 is divided into 93-1, 93-2, 93-3, and 93-4 by a polysilicon gate 98, to serve as anode of diode, one source of MOS, another source of MOS, and cathode of the diode, respectively. The active region 93-4 and a portion of MOS gate 98 is covered by an N+ implant 96, while the rest of the active region is covered by a P+ implant 97. A programmable resistive element 92 has one end coupled to the anode of the diode by a metal 91, and the other end coupled to a supply voltage line V+, or Bitline (BL). The cathode of the diode 93-4 and the sources of the MOS 93-2 and 93-3 are coupled as Source Line (SL) by a higher level of metal running horizontally. In this embodiment, the MOS device is put on two sides of the cell that can be shared with the adjacent cells to save area. One or two MOS devices 93-2 or 93-3 can be converted into a diode by changing the P+ implant 97 to N+ implant 96 on the active region 93-2 or 93-3, respectively, to trade read for program performance in another embodiment.

FIG. 7(b5) shows a top view of a programmable resistive cell 90' that corresponds to the schematic in FIG. 7(a1), according to one embodiment. A one-piece active region 93' inside an N well 95' is divided into 93'-1, 93'-2, 93'-3, and 93'-4 by a polysilicon gate 98', to serve as anode of diode, one source of MOS, another source of MOS, and cathode of the diode, respectively. The active region 93'-4 and a portion of gate 98' is covered by an N+ implant 96', while the rest of the active region is covered by a P+ implant 97'. A programmable resistive element 92' has one end coupled to the anode of the diode by a metal 91', and the other end coupled to a supply voltage line V+, or Bitline (BL). The cathode of the diode 93'-4 and the sources of the MOS 93'-2 and 93'-3 are coupled as Source Line (SL) by a higher level of metal running horizontally. In this embodiment, the MOS device is put on two sides of the cell without any contact in the source to save area. One or two MOS devices 93'-2 or 93'-3 can be converted into a diode by changing the P+ implant 97' to N+ implant 96' on the active region 93'-2 or 93'-3, respectively, to trade read for program performance in another embodiment.

FIG. 7(b6) shows another top view of a programmable resistive cell 90" that corresponds to the schematic in FIG. 7(a1), according to one embodiment. This cell layout is very similar to the one shown in FIG. 7(b4), except that the body of the fuse element 92" overlaps into the active region 93"-1 and is coupled to the active region 93"-1 by a single shared contact 94" with a metal 91" on top, instead of using one contact for body to metal and another contact for active to metal as shown in FIG. 7(b4). This embodiment can save spacing between the body 92" and active area 93"-1.

The programmable resistive elements, diodes, and MOS in FIGS. 7(a1)-7(a3), and 7(b1)-7(b6) are for illustrative purposes. There are many variations and equivalent embodiments that can be used. Some of the variations of the embodiments are further discussed below.

The MOS devices shown in FIGS. 7(a1)-7(a3), and 7(b1)-7(b6) can be either NMOS or PMOS in other embodiments. The diodes as shown in FIGS. 7(b1)-7(b6) have isolation between anodes and cathodes using dummy MOS gates. However in another embodiment, the anode and cathode of the diode can be isolated by Shallow Trench Isolation (STI), Local Oxide Isolation (LOCOS), or Salicide Block Layer (SBL). Various isolation schemes such as dummy MOS gate, LOCOS, STI, or SBL can be applied to one, two, four sides, or any sides of the programmable resistive device cells, and can also be applied between adjacent programmable resistive cells. To reduce contact resistance, the contact size for diode/MOS can be larger than at least one contact outside of the OTP cell array. The contact enclosure can be smaller than at least one contact enclosure outside of the OTP cell array.

The diodes or MOS devices built on active regions as shown in FIGS. 7(b1)-7(b6) can be inside an N well on a P type substrate, or inside a P well on an N type substrate in other embodiment. The diodes or MOS can be built on isolated substrate such as in CMOS SOI technologies other than bulk CMOS in another embodiment. The diode or MOS can be built in planar CMOS or in 3D FinFET technologies. Those skilled in the art understand that there are many variations and equivalent embodiments.

The programmable resistive element in FIGS. 7(a1)-7(a3), and 7(b1)-7(b6) can be One-Time Programmable (OTP) that can be programmed only once, or can be programmed reversibly and repetitively, such as in PCRAM or RRAM. Alternatively, the programmable resistive element can be programmed based on the directions of current flowing through the element, such as in MRAM or CBRAM. For OTP cells, the programmable resistive element can be a fuse or anti-fuse, depending on higher or lower after-program resistance can be generated, respectively. The fuse can be a segment of interconnect, a single or plural of conductive contact or via. The anti-fuse can be a contact or via with dielectric in-between, or a MOS with gate oxide to be broken down to create different resistance, etc.

A fuse made of a segment of interconnect can be used as an example to illustrate the concept of the present invention. The programmable resistive elements shown in FIGS. 7(a1)-7(a3), and 7(b1)-7(b6) illustrate certain embodiments. As denoted, the OTP elements can be built from any interconnects, including but not limited to polysilicon, silicided polysilicon, silicide, polymetal, local interconnect, metal, metal alloy, thermally isolative active region, CMOS gate, or combinations thereof. The polymetal can be a sandwich structure of metal-nitride-polysilicon, such as W/WNx/Si. The OTP elements can be N type, P type, or part N and part P type. Each of the OTP elements can have an anode, a cathode, and at least one body. The body can be a rectangle and can be tapered near the larger anode or cathode. The anode can be larger than the cathode for electromigration easier to happen. The anode or cathode contacts can be no more than two (2) for polysilicon/local interconnect, and can be no more than four (4) for metal fuse, in certain embodiments. The contact size can be larger than at least one contact outside of the OTP memory array. The contact enclosure can be smaller than at least one contact enclosure outside of the OTP memory array to lower the electromigration threshold. The length to width ratio in the body can be between 0.5-8, or 3-6, for polysilicon/polymetal/local interconnect, or in the case of metal even larger than 10 for metal, for example. An active region can be placed underneath or near the anode/cathode to dissipate heat easily and to create a suitable temperature profile for programming. There are many variations or combinations of embodiments in part or all that can be considered equivalent embodiments.

Polysilicon used to define CMOS gates or as interconnect in a high-K/metal-gate CMOS process can also be used as OTP elements. The fuse element can be P type, N type, or part N and part P type if applicable. The after/before resistance ratio can be enhanced for those fuse elements that have P+ and N+ implants to create a diode after being programmed, which can be done with polysilicon, polymetal, thermally isolated active region, or gate of a high-K/metal-gate CMOS. For example, if a metal-gate CMOS has a sandwich structure of polysilicon between metal alloy layers, the metal alloy layers may be blocked by masks generated from layout database to create a diode in the fuse elements. In SOI or SOI-like processes, a fuse element can also be constructed from a thermally isolated active region such that the fuse element can be implanted with N+, P+, or part N+ and part P+ in each end of the active region. If a fuse element is partly implanted with N+ and P+, the fuse element can behave like a reverse-biased diode, such as when silicide on top is depleted after being programmed. In one embodiment, if there is no silicide on top of active regions, an OTP element can also be constructed from an isolated active region with part N+ and part P+ acting as a diode for breakdown in forward or reverse biased conditions. Using isolated active region to construct an OTP element, the OTP element can be merged with part of the program-selector diode in one single active island to save area.

In some processing technologies that can offer local interconnect, the local interconnect can be used as part or all of an OTP element. Local interconnect, also called as metal-0 (M0), is a by-product of a salicide process that has the capability to directly interconnect polysilicon or MOS gate with an active region. In advanced MOS technologies beyond 28 nm, scaling along the silicon surface dimensions is much faster than scaling in the height. As a consequence, the aspect ratio of CMOS gate height to the channel length is very large such that making contacts between metal 1 and source/drain or CMOS gate very expensive in terms of device area and cost. Local interconnect can be used as an intermediate interconnect between source/drain to CMOS gate, between CMOS gate to metal 1, or between source/drain to metal 1 in one or two levels of interconnect. The local interconnects, CMOS gate, or combination can be used as an OTP element in one embodiment. The OTP element and one terminal of the program-selector diode can be connected directly through local interconnect without needing any contacts to save area in another embodiment.

Those skilled in the art understand that the above discussions are for illustration purposes and that there are many variations and equivalents in constructing electrical fuse, anti-fuse elements, or program selectors in CMOS processes.

Figure 7C:
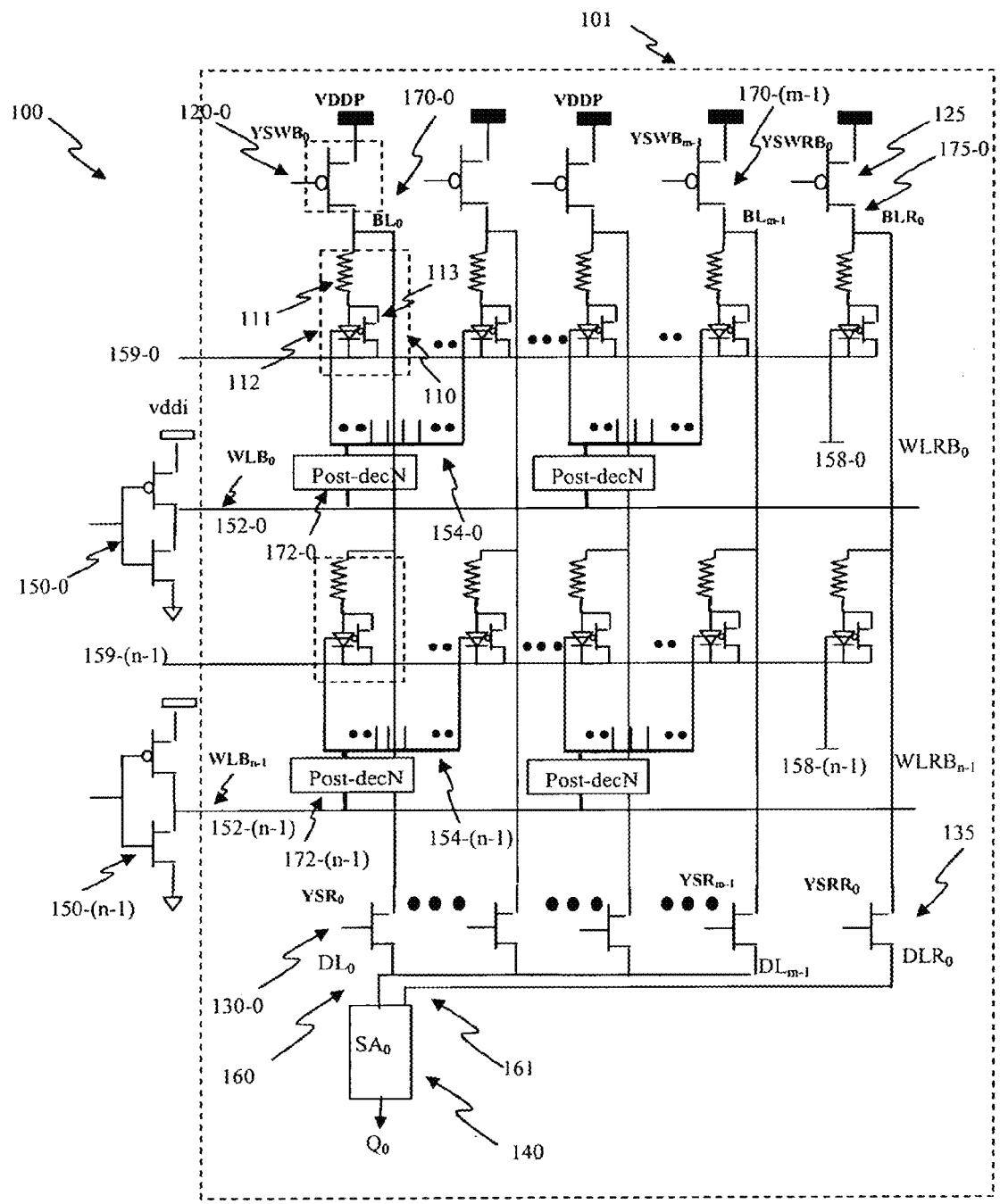
FIG. 7(c) shows a block diagram of a portion of an OTP memory array according to one embodiment.

The programmable resistive devices can be used to construct a memory in accordance with one embodiment. FIG. 7(c) shows a portion of a programmable resistive memory 100 constructed by an array 101 of n-row by (m+1)-column cells 110, as shown in FIG. 7(a1) and n wordline drivers 150-i, where i=0, 1, ..., n−1, in accordance with one embodiment. The memory array 101 has m normal columns and one reference column for one shared sense amplifier 140 for differential sensing. Each of the memory cells 110 has a resistive element 111 coupled to the P terminal of a diode 112 as program selector, a MOS 113 as read program selector, and to a bitline BLj 170-j (j=0, 1, ... m−1) or reference bitline BLR0 175-0 for those of the memory cells 110 in the same column. The gate of the MOS 113 is coupled to a wordline WLBi 152-i through a local wordline LWLBi 154-i, where i=0, 1, ..., n−1, for those of the memory cells 110 in the same row. Each wordline WLBi is coupled to at least one local wordline LWLBi, where i=0, 1, ..., n−1. The LWLBi 154-i is generally constructed by a high resistivity material, such as N well, polysilicon, polycide, polymetal, local interconnect, active region, or metal gate to connect cells, and then coupled to the WLBi (e.g., a low-resistivity metal WLBi) through conductive contacts or vias, buffers, or post-decoders 172-i, where i=0, 1, ..., n−1. Buffers or post-decoders 172-i may be needed when using diodes as program selectors or MOS as read selectors to increase performances in other embodiments. The select lines (SLs), 159-0 through 159-(n−1), can be embodied similar to WLBs, that have local SLs, buffers, post-decoders, with low or high resistivity interconnect, etc. Each BLj 170-j or BLR0 175-0 is coupled to a supply voltage VDDP through a Y-write pass gate 120-j or 125 for programming, where each BLj 170-j or BLR0 175-0 is selected by YSWBj (j=0, 1, ..., m−1) or YSWRB0, respectively. The Y-write pass gate 120-j (j=0, 1, ..., m−1) or 125 can be built by PMOS, though NMOS, diode, or bipolar devices can be employed in some embodiments. Each BLj or BLR0 is coupled to a dataline DLj or DLR0 through a Y-read pass gate 130-j or 135 selected by YSRj (j=0, 1, ..., m−1) or YSRR0, respectively. In this portion of memory array 101, m normal datalines DLj (j=0, 1, ..., m−1) are connected to an input 160 of a sense amplifier 140. The reference dataline DLR0 provides another input 161 for the sense amplifier 140 (no multiplex is generally needed in the reference branch). The output of the sense amplifier 140 is Q0.

To program a cell, the specific WLBi and YSWBj are turned on and a high voltage is supplied to VDDP, where i=0, 1, ... n−1 and j=0, 1, ..., m−1. In some embodiments, the reference cells can be programmed to 0 or 1 by turning on WLRBi, and YSWRB0, where i=0, 1, ..., n−1. To read a cell, all SLs can be set to low and a dataline 160 can be selected by turning on the specific WLBi (read selector) and YSRj (Y read pass gate), where i=0, 1, ..., n−1, and j=0, 1, ..., m−1, and a reference cell coupled to the reference dataline DLR0 161 can be selected for the sense amplifier 140 to sense and compare the resistance difference between normal and reference BLs to ground, while disabling all column write pass gates YSWBj and YSWRB0 where j=0, 1, ..., m−1.

Figure 7D:
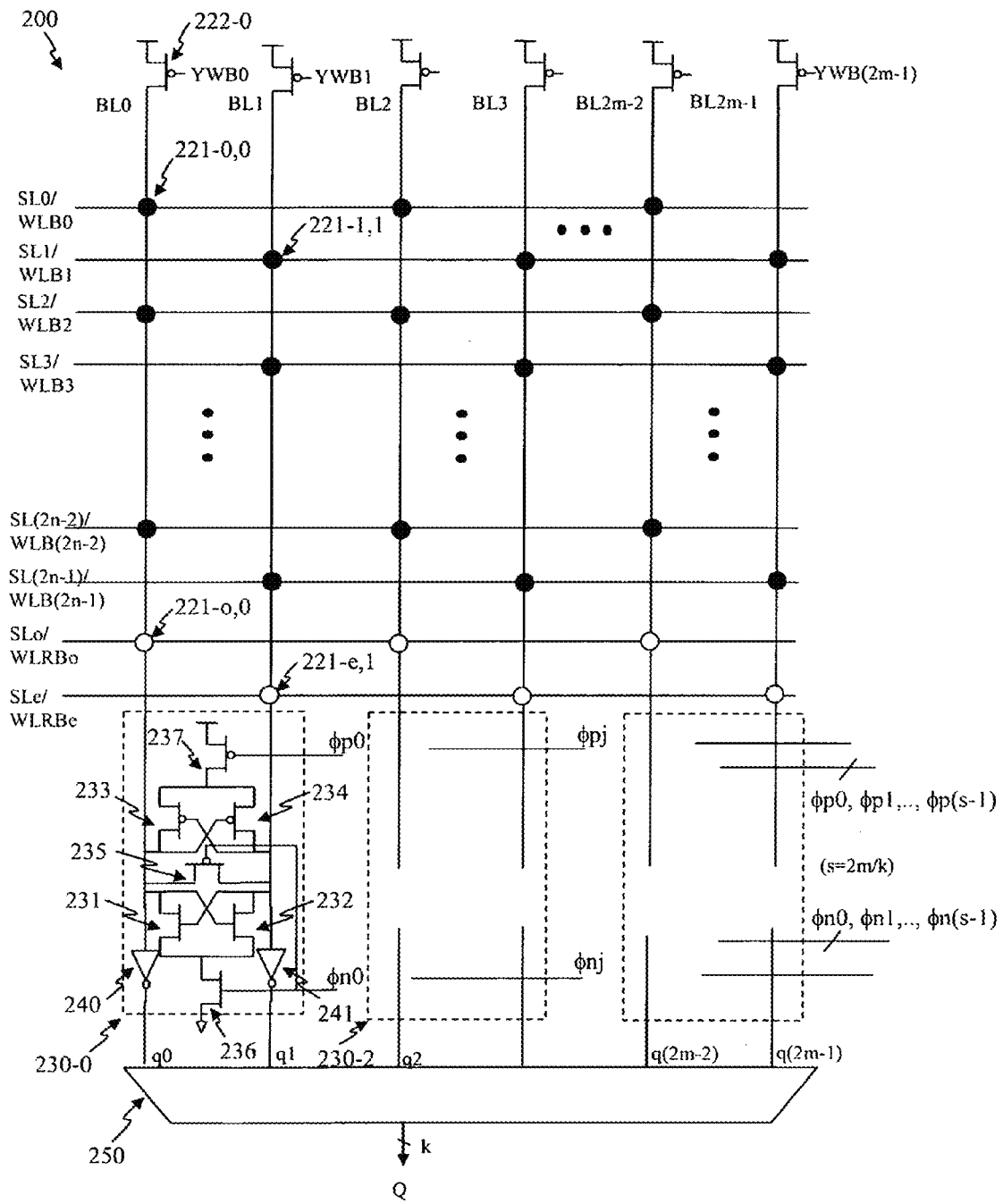
FIG. 7(d) shows a block diagram of a portion of an OTP memory array with differential sensing according to one embodiment.

FIG. 7(d) shows a schematic of a portion of an OTP array 200, according to another embodiment. The OTP array 200 as 2n rows and 2m columns organized in a half-populated two dimensional array for a total of 2 nm cells, i.e. the cells at even rows are only coupled to even columns, and the cells at odd rows are only coupled to the odd columns. The bitlines (BLj, j=0, 1, 2, ..., 2m−1) are running in the column direction and the source lines/wordline bar (SLi/WLBi, i=0, 1, 2, ..., 2n−1) are running row direction. At each intersection of even-row/even-column and odd-row/odd-column is an OTP cell corresponding to the cell shown in FIG. 7(a1). For example, a cell 221-0,0 is located at (row, column)=(0,0), another cell 221-1,1 is located at (1,1), and so on. Another two reference rows SLe/WLRBe and SLo/WLRBo are provided for differential sensing. The reference cells are similar to the normal cells except that the fuse resistance is set about half-way between state 0 and state 1 resistance. This can be achieved by adjusting the ratio of fuse width and length in the reference cells, or blocking a portion of silicide on the fuse or put an additional reference resistor in serial with the reference cells outside of the OTP array. The reference cells on the even row of the reference row are coupled to odd columns, such as 221-e,1, 221-e,3, etc. The reference cells on the odd row of the reference row are coupled to even columns, such as 221-o,0, 221-o,2, etc. During read, when a cell in an even column is turned on, another reference cell in the adjacent odd column is also turned on too so that BLs in a column pair can be used for differential sensing. Each BLj has a PMOS pullup 222-j coupled to a program voltage supply VDDP with the gates coupled to YWBj, where j=0, 1, 2, ..., 2m−1. During program, a cell can be selected by turning on a SLi (i=0, 1, 2, ..., 2n−1) and YWBj (j=0, 1, 2, ..., 2m−1) to conduct a current flowing through a diode in the selected cell and thus program the cell into a different resistance state. There can be more than one pair of reference SL/WLR with different reference resistances upon selection to suit different ranges of post-program resistances.

In FIG. 7(d), there are m sense amplifiers 230-j, j=0, 1, 2, . . . , m−1 to sense data between two adjacent BLs. In the sense amplifier 230-0, for example, a pair of NMOS 231 and 232 have their drains and gates cross-coupled and their sources coupled to a drain of a NMOS pulldown device 236. The NMOS pulldown 236 can be omitted in another embodiment. Similarly, a pair of PMOS 233 and 234 have their drains and gates cross-coupled and their sources coupled to a drain of a PMOS pullup 237. The drains of the NMOS 231 and PMOS 233 are coupled to BL0 and the drains of the PMOS 232 and PMOS 234 are coupled to BL1. Two inverters 240 and 241 are coupled to the BL0 and BL1 for local output q0 and q1, respectively. The gates of the NMOS 236 and PMOS 237 are coupled to φn and φp, respectively. A PMOS equalizer 235 has a gate coupled to φn to equalize the BL0 and BL1 voltages before sensing. The PMOS equalizer 235 can be an NMOS with gate coupled to φp in other embodiment. The equalizer 235 can be replaced by a pair of BL0 and BL1 pullups or pulldowns to VDD and ground with gates coupled to φn and φp, respectively, in another embodiment. The equalizer or pullups/pulldowns can be coupled to a different control signal in yet another embodiment. If the OTP array have k outputs Q0, Q1, . . . , Q(k−1), there can be s=2m/k pairs of φn and φp to select and activate k sense amplifiers. The 2m local outputs, q0, q1, . . . , q(2m−1) can be multiplexed in a multiplexer 250 to generate k outputs Q0, Q1, . . . , Q(k−1) accordingly.

Figure 7E:
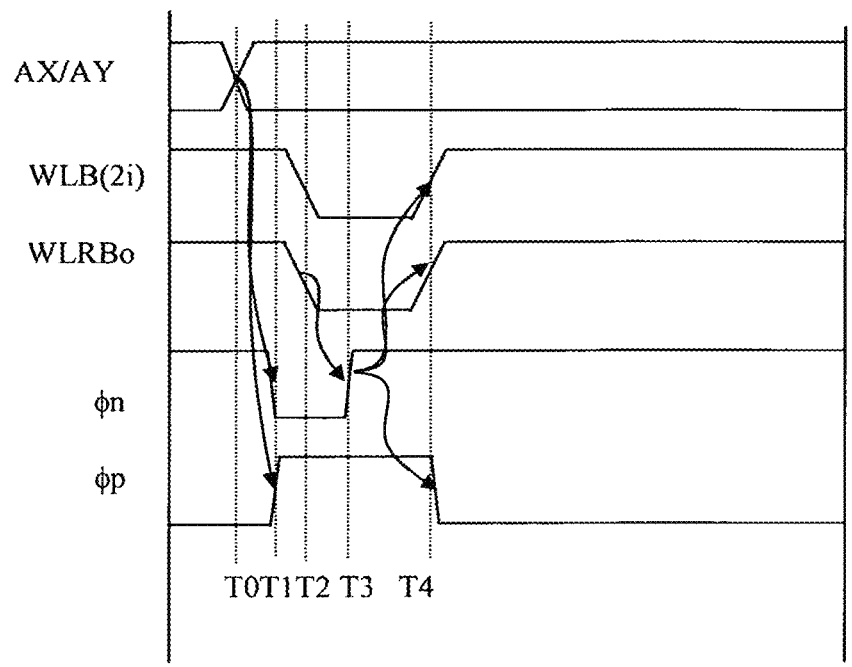
FIG. 7(e) shows a timing diagram of a portion of an OTP memory array according to one embodiment.
Figure 7F:
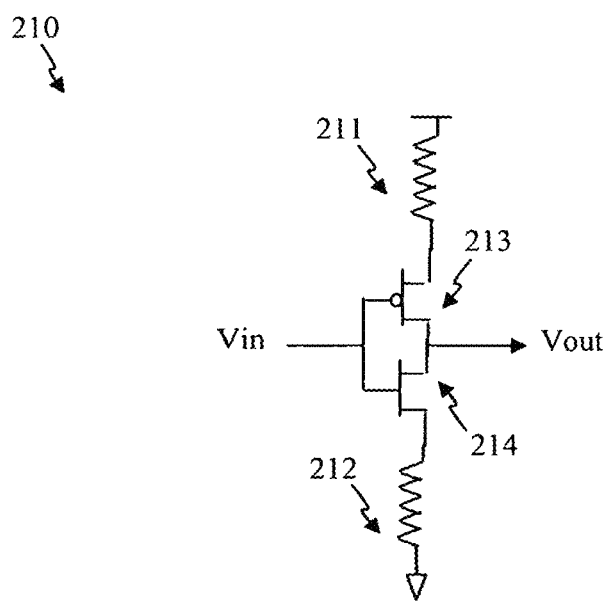
FIG. 7(f) shows a schematic of a sense amplifier, corresponding to a sense amplifier SA0 in FIG. 7(c), according to one embodiment.

FIG. 7(e) shows a portion of timing diagram to illustrate how a sense amplifier operates, corresponding to the sense amplifiers 230-j (j=0, 1, 2, . . . , m−1) in FIG. 7(d). All normal and reference source lines are set to high in the read mode. At time T0, X- and Y-addresses are selected for a new read operation. At T1, φn is set low and φp is set high to disable the cross-coupled latch consists of MOS 231, 232, 233, and 234 and equalize the BL0 and BL1 so that the data from the previous sensing can be reset. At T2, an even/odd WLB and a corresponding odd/even WLRB are turned on so that the normal and reference cells in the same BL pair can be selected for sensing. At T3, φn is set high to turn on the half latch of NMOS 231 and 232. The BL0 and BL1 differential voltages can be developed based on a resistor-load NMOS latch consisting of a fuse and a reference fuse in serial with their read selectors coupled to an NMOS latch having cross-coupled NMOS 231 and 232. At T4, the WLB and WLRB are turned off and the PMOS pullup is activated by setting φp low to enable the PMOS half latch consisting of PMOS 233 and 234. Full-swing local outputs q0 and q1 will be ready at the outputs of the inverters 240 and 241, respectively. The local outputs q0 through q(2m−1) can be further selected by a multiplexer 250 to generate Q0, Q1, . . . , Q(k−1). The timing sequences of turning off WLB/WLRB and turning on φp are not critical.

Figure 8:
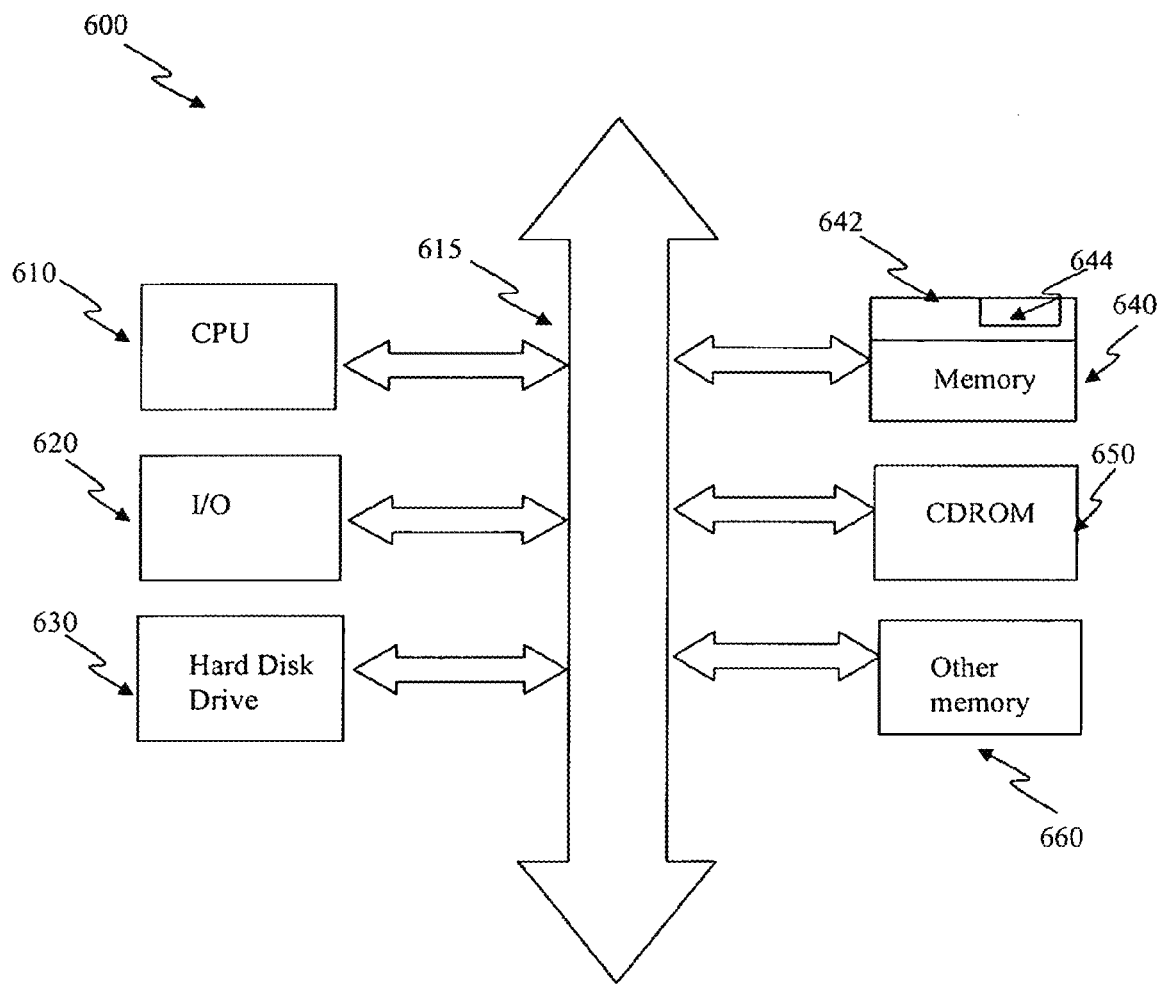
FIG. 8 shows a block diagram of a portion of an electronics system using OTP memory for in-system repair or configuration.

FIG. 8 shows an electronic system 600 according to one embodiment. The electronic system 600 can include a DRAM memory 640, such as in a memory array 642, OTP memory 644, according to one embodiment. The electronic system 600 can, for example, pertain to a computer system. The electronic system can include a Central Process Unit (CPU) 610, which communicate through a common bus 615 to various memory and peripheral devices such as I/O 620, hard disk drive 630, CDROM 650; DRAM memory 640, and other memory 660. Other memory 660 is a conventional memory such as SRAM, ROM, or flash that can interface to CPU 610 through a memory controller. CPU 610 generally is a microprocessor, a digital signal processor, or other programmable digital logic devices. Memory 640 can be constructed as an integrated circuit, which includes the memory array 642 and at least one OTP memory 644 for in-system repair or configuration. The DRAM memory 640 typically interfaces to CPU 610 through a memory controller. If desired, the memory 640 may be combined with the processor, for example CPU 610, in a single integrated circuit.

Figure 9A:
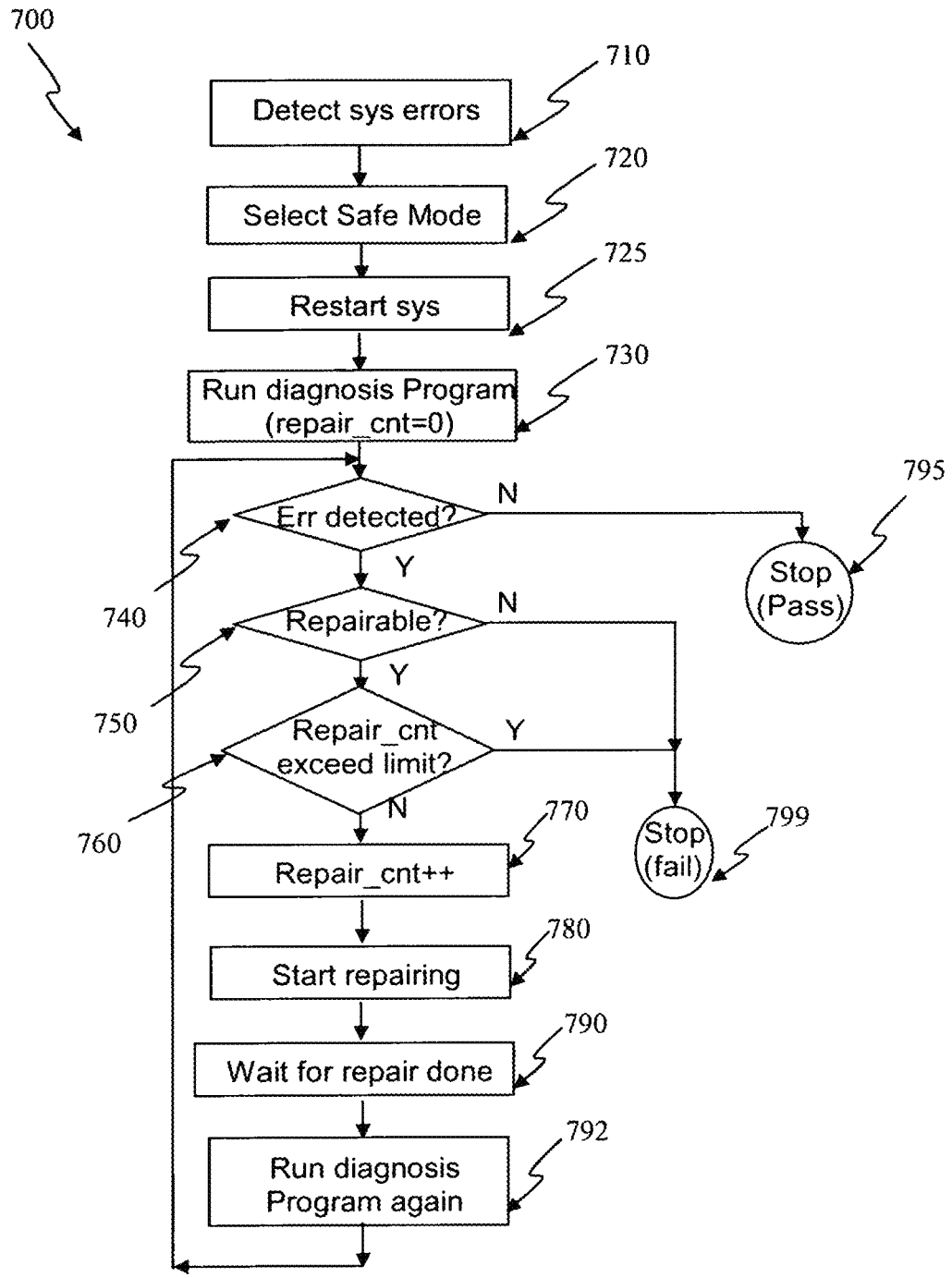
FIG. 9(a) depicts a method in a flow chart to repair or configure memories in a system according to one embodiment.

FIG. 9(a) shows a flow chart 700 depicting a method for repairing or configuring a memory in-system, according to one embodiment. The procedure starts at 710 when an electronic system is not functional. The electronic system may hang and does not respond to any interrupts and/or a display may show a blue screen and display a message such as "System Faults", "Memory Faults", "Bus Errors", etc. in a Windows Operating System (OS). In such cases, a user is recommended to reboot the OS in a privileged mode, i.e., Safe mode in Windows, in step 720 and then restart the electronic system in step 725. Subsequently, a diagnosis can be invoked to figure out what is wrong in the electronic system. Typically, the peripherals such as hard disk, monitor, CDROM, or memories such as DRAM, SRAM, or flash are checked. The device status may be displayed on the display. Faults in memories can be easily detected by writing data into the memories and read them out to compare with the original data written. A diagnosis program (or program module) can detect any faults in DRAM, SRAM, or flash easily in step 730. Reset a repair count, repair_cnt=0. If no memory errors are detected in step 740, this could be a "soft error" due to alpha particles or other non-recurring events such as noise, such that the diagnosis can stop in step 795 and the electronic system can be rebooted. If errors persist, the additional part of diagnosis program needs to check further if the memory faults can be repaired in step 750. The diagnosis program needs to understand how many more defective cells are detected, their locations and memory organization so that the redundancy scheme can be evaluated for possible repairs. This diagnosis program may vary for different memory vendors with different memory organizations and redundancy schemes. If memory faults are diagnosed as not repairable in step 750, the diagnose stops at 799 with a failure. Otherwise, the repair continues to step 760 to further check if the number of repairs (repair_cnt) exceeds a limit (e.g. 5 times). If the repair count does not exceed a limit, the repair goes on to increment the repair count in 770 and perform actual repairs. If the repair does exceed the limit, the diagnose stops at 799 with a failure. The actual repair starts in step 780. After waiting for the repair to finish in step 790, the diagnosis program can be run again in 792. After finishing the diagnosis, the flow can go back to verify or detect errors in 740 until all errors are repaired or the repair count exceeds a limit.

Figure 9B:
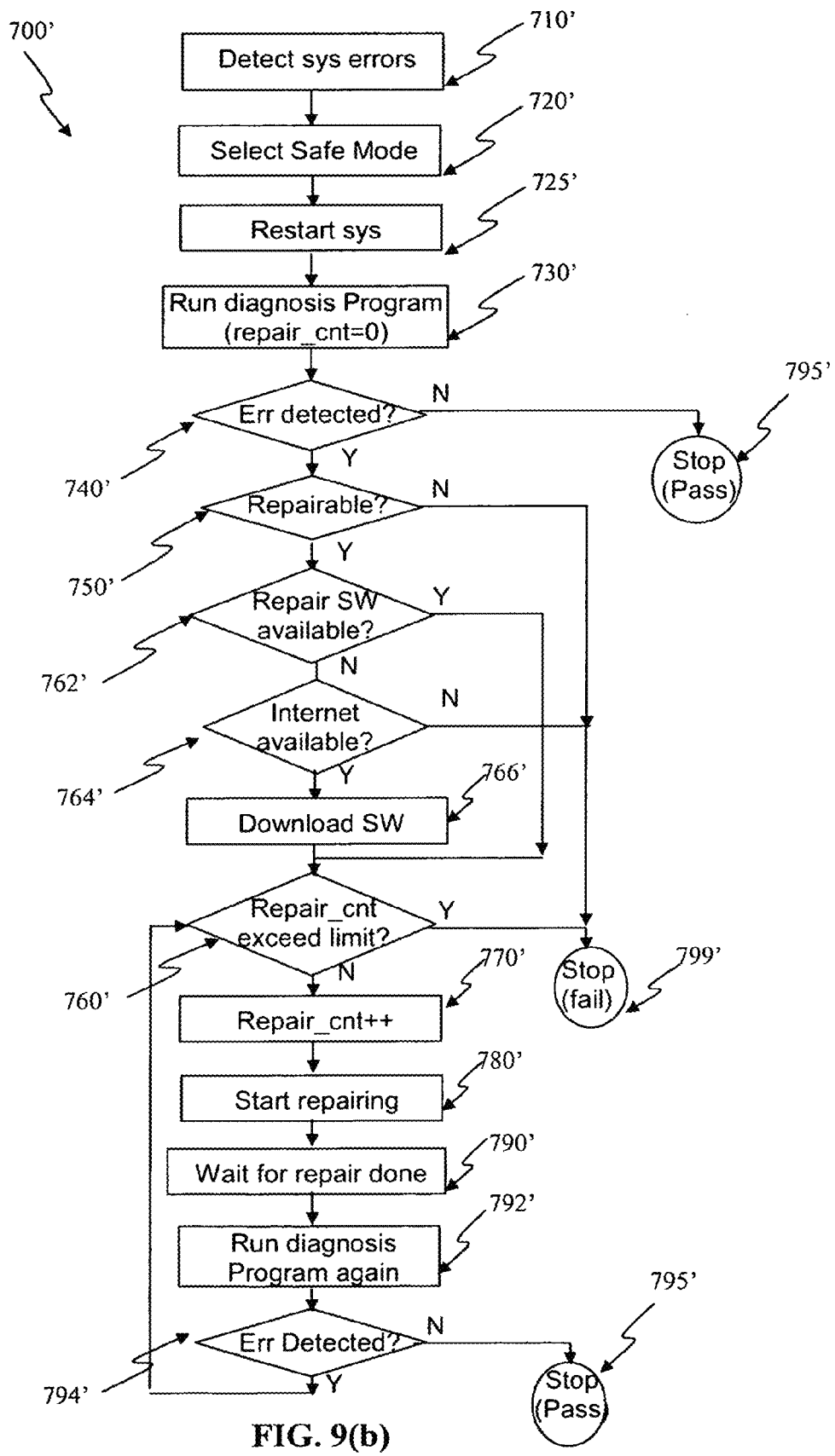
FIG. 9(b) depicts a method in a flow chart to repair or configure memories in a system with the repair software downloaded from the Internet according to another embodiment.

FIG. 9(b) shows a flow chart 700' depicting a method for repairing or configuring a memory in-system using Internet, according to another embodiment. The procedure starts at 710' when an electronic system is not functional. A user is recommended to reboot the OS in a privileged mode, i.e., Safe mode in Windows, in step 720' and then restart the electronic system in step 725'. Subsequently, a diagnosis can be invoked to figure out what is wrong in the electronic system in step 730'. Typically, the peripherals such as hard disk, monitor, CDROM, or memories such as DRAM, SRAM, or flash are checked. The device status may be displayed on the display. Faults in memories can be easily detected by writing data into the memories and read them out to compare with the data written. A diagnosis program (program module) can detect any faults in DRAM, SRAM, or flash in step 740' easily. If no memory errors are detected, this could be a "soft error" due to alpha particles or other non-recurring events such as noise, such that the diagnosis can stop in step 795' and the system can be readily rebooted. If the errors persist, an additional part of the diagnosis program needs to check if the memory faults can be repaired in step 750'. The diagnosis program needs to understand how many more defect cells are detected, their locations, and memory organization so that the redundancy scheme can be evaluated for possible repairs. The diagnosis program may vary for different memory vendors with different memory organizations and redundancy schemes. If the memory faults are diagnosed as not repairable in step 750', the diagnoses stop at 799' with a failure. Otherwise, the repair continues to step 762' to check if repair software is available. If yes, continue to step 760' to check if the number of repairs (repair_cnt) exceeds a limit (e.g., 5 times). If not, check if Internet connection is available in 764'. If Internet is not available in 764', stop the repair with a failure in 799'. If the Internet is available, proceed to download the repair software in 766'. Then, check if repair count (repair_cnt) exceeds a limit (e.g. 5). If the repair count exceeds the limit, stop the repair with a failure in 799'. If the repair count does not exceed the limit, increment the repair count in 770', and start repairing in 780'. After waiting for repair to finish in 790', the diagnosis program can be run again in 792' to check if all faults are repaired in 794'. If yes, stop the repair with a pass in 795. If not, go back to check repair count in 760'. This loop continues until all repairs are done or repair count exceeds a limit.

Figure 10:
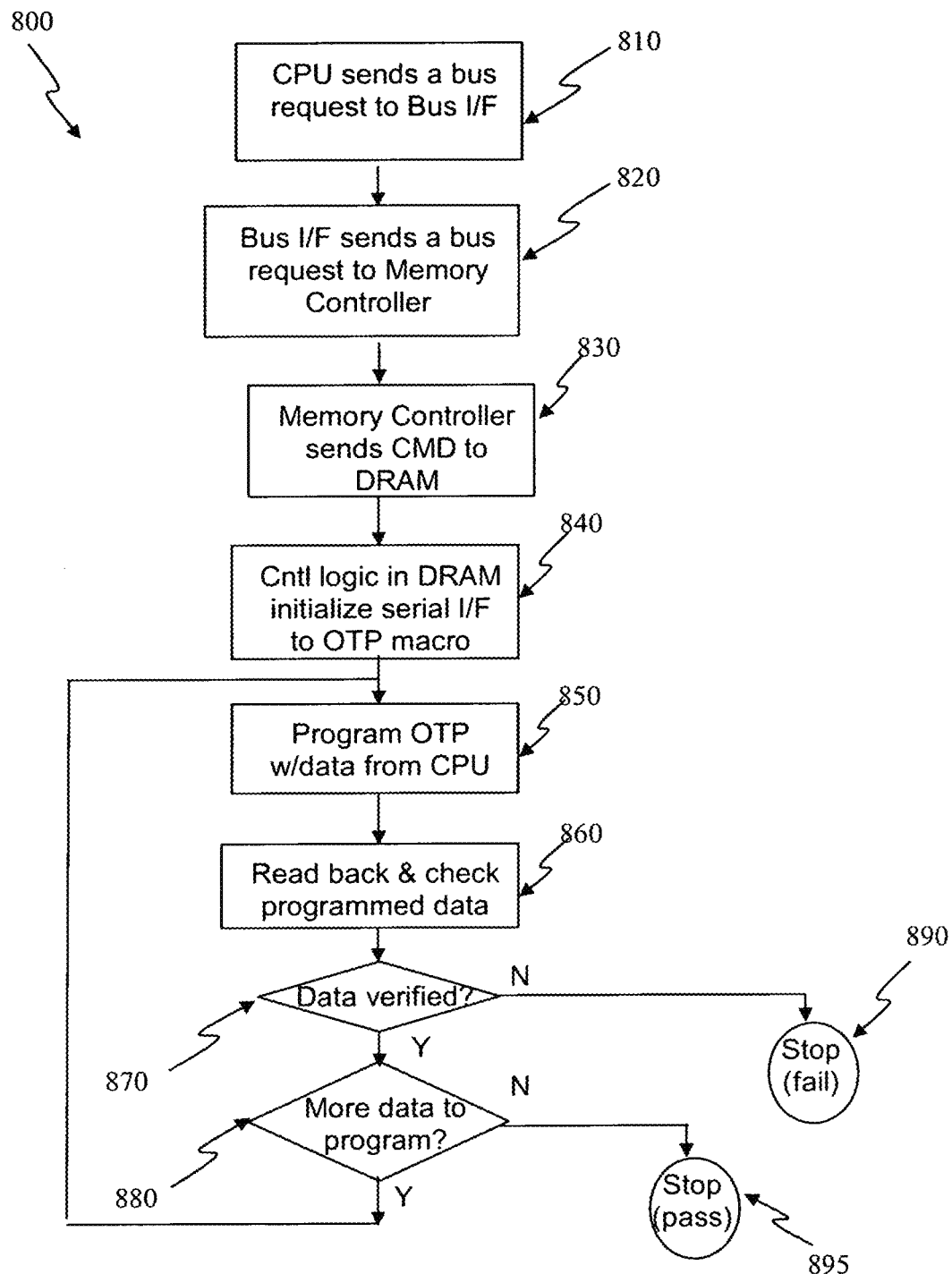
FIG. 10 depicts a method in a flow chart to program defect addresses or update parameters into memories in a system for repair or configuration according to one embodiment.

FIG. 10 shows a flow chart 800 depicting a method for programming data into an OTP memory in a memory chip, according to one embodiment. The procedure starts at 810 for CPU to send a bus request to a Bus Interface Unit. The Bus Interface Unit then sends a request to a memory controller in step 820 in response to CPU's request. The memory controller sends commands (i.e. combinations of control signals such as WE\, CAS\, RAS\, CKE in SDRAM) to the memory chip in step 830. The command can be any combination of control signals or any states in a state machine normally not used before. Alternatively, the memory controller can set a bit in a special register (i.e. Mode Register) in the memory chip. Once receiving the commands from the memory controller, a control logic in the memory chip (e.g. DRAM) can generate signals with proper timing to initialize serial interface to program the OTP memory accordingly in step 840. Programming OTP memory starts in step 850 with the data sent from CPU. After programming is done, the memory controller reads back the data in OTP memory and checks with the original data sent in step 860. The data are verified in step 870 to determine if they are the same as expected. If not, repair stops with a failure in step 890. If yes, then check if there are more data to be programmed into OTP memory in 880. If not, repair stops with a pass in step 895. If yes, go back to step 850 to program more data sent from CPU.

Figure 11:
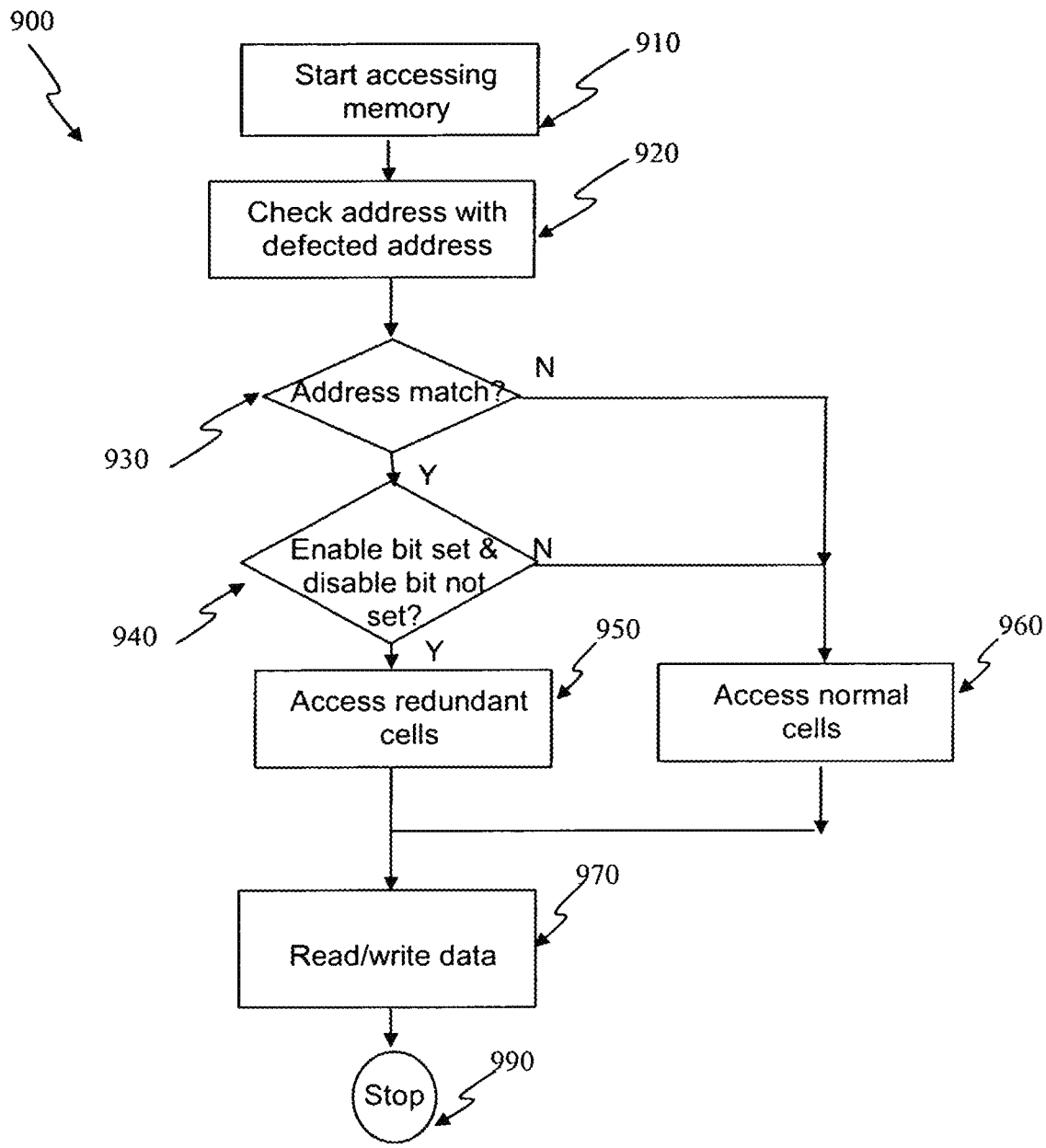
FIG. 11 depicts a method in a flow chart to access a memory after in-situ memory repair and configuration.
Figure 12A:
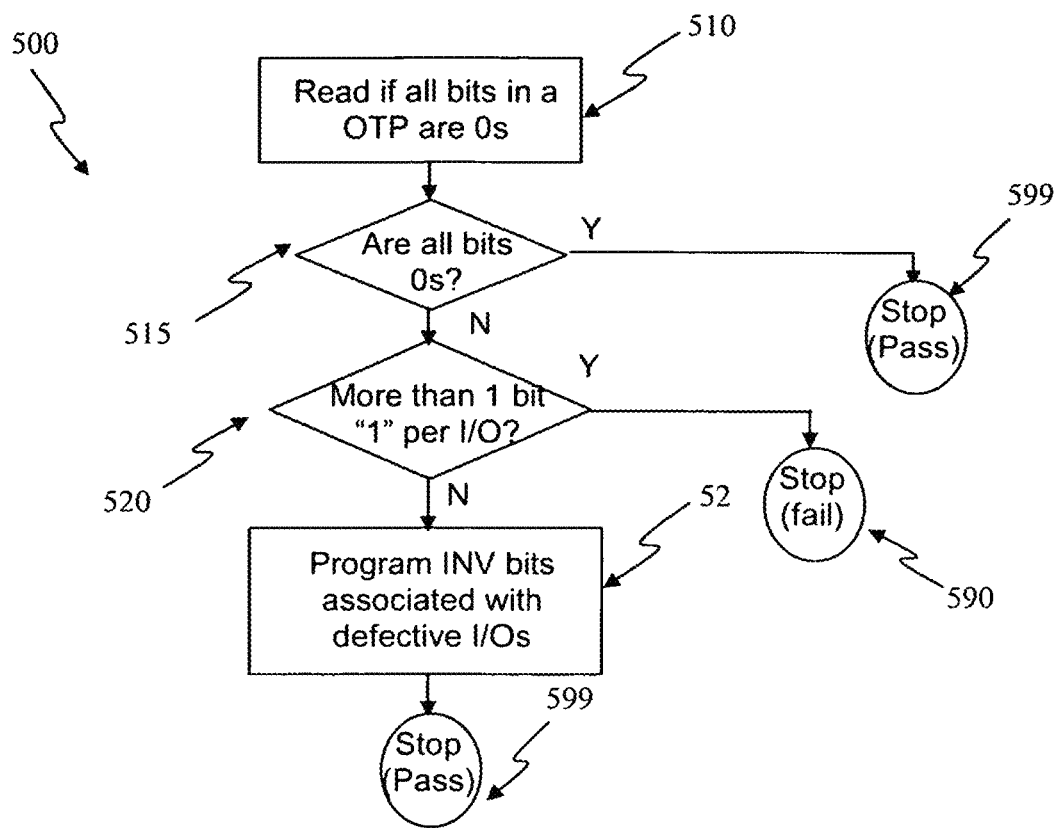
FIG. 12(a) depicts a method in a flow chart to pre-condition the INV bits.
Figure 12B:
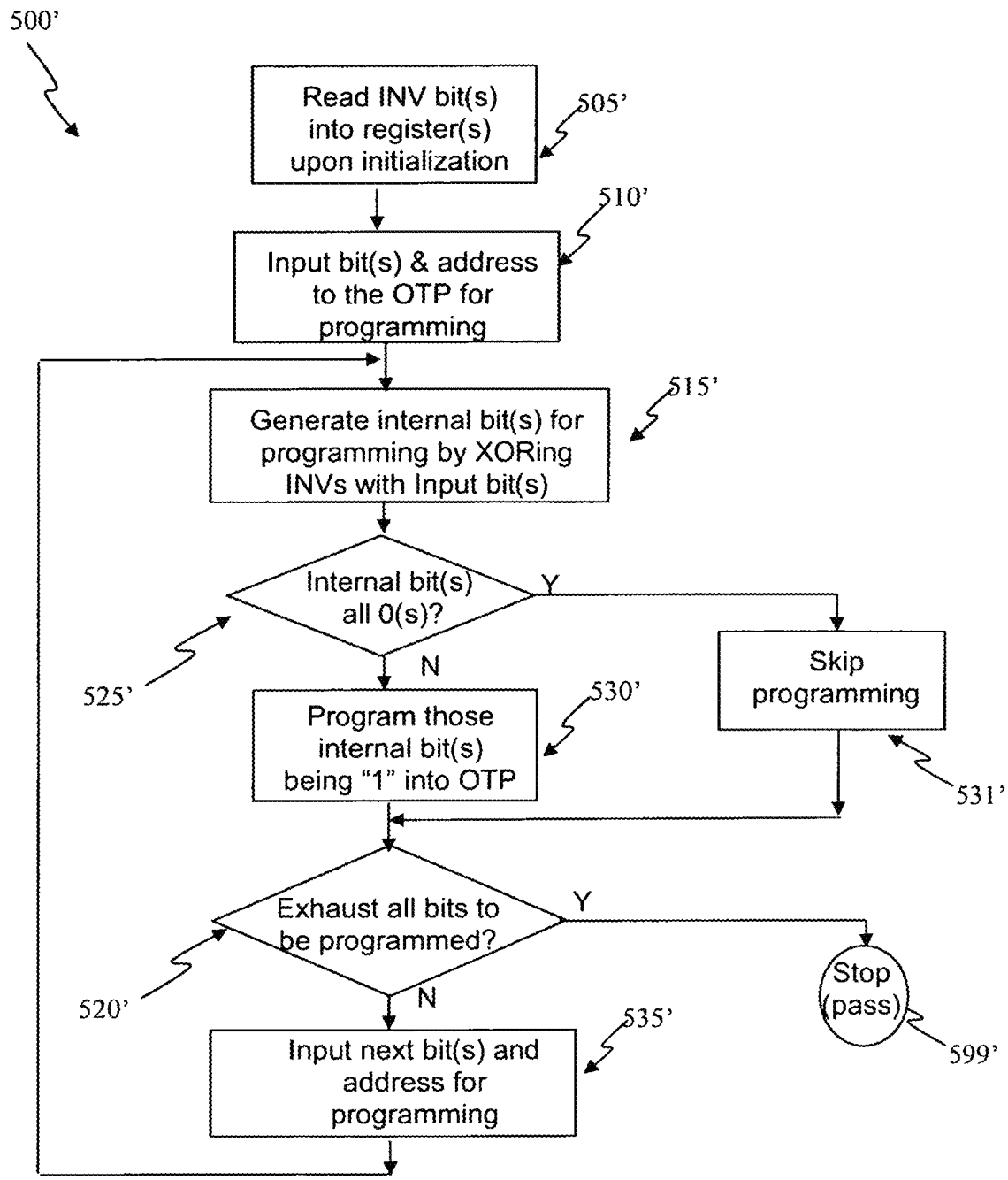
FIG. 12(b) depicts a method in a flow chart to program the OTP with INV redundancy scheme.
Figure 12C:
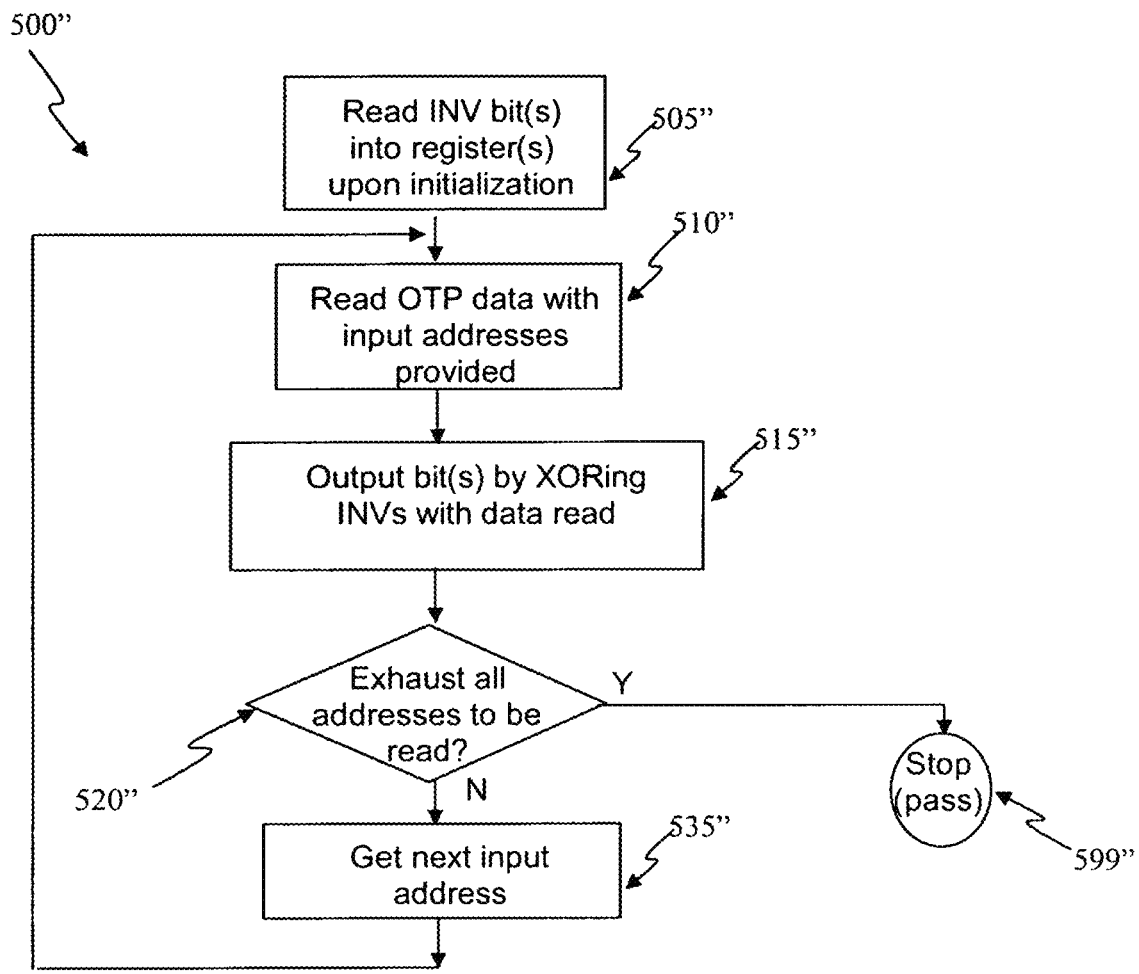
FIG. 12(c) depicts a method in a flow chart to read the OTP with INV redundancy scheme.

FIG. 11 shows a flow chart 900 depicting a method for accessing data in a memory after being repaired or configured in-system, according to one embodiment. The procedure starts at 910 to generate an address to access the memory. The address is checked at step 920 against defective addresses stored in the OTP memory to determine whether there is a match in step 930. If there is not a match, normal memory cell(s) are accessed in step 960. If there is a match, determine if the enable bit of the defective address is set and disable bit, if any, is not set in step 940. If determined that the enable bit for the defective address is not set (unless the disable bit is also set), then access the normal cell(s) in step 960. If determined that the disable bit for the defective address is set, then even though the enable bit for the defective address is set, then access the normal cell(s) in step 960. On the other hand, if determined that the enable bit of the defective address is set and the disable bit, if any, not set, then access redundant cell(s) in step 950 instead. Then, read or write the selected cells in step 970, and stop in step 990 for the next access cycles.

The embodiments of invention can be implemented in a part or all of an integrated circuit in a Printed Circuit Board (PCB), or in a system (e.g., electronic system, computer system, memory system, etc.). The programmable resistive device can be reversible programmable resistive device, such as the emerging non-volatile memory. The emerging non-volatile memory can be Magnetic RAM (MRAM), Phase Change Memory (PCM), Conductive Bridge RAM (CBRAM), or Resistive RAM (RRAM). Though the program mechanisms are different, their logic states can be distinguished by different resistance values, and therefore they are all different types of programmable resistive memories.

FIGS. 9(*a*), 9(*b*), 10, and 11 illustrate flow charts depicting embodiments of a repair method 700, another repair method 700' with a portion of repair software downloaded from Internet, a program procedure for OTP memory 800, and an access procedure 900 after being repaired, respectively, for repairing or configuring a memory in system, in accordance with certain embodiments. The methods 700, 700', and 800 are described in the context of a memory, such as the memory 39 in FIG. 3(*a*) or 39' in FIG. 3(*b*). In addition, although described as a flow of steps, one of ordinary skilled in the art will recognize that at least some of the steps may be performed in a different order, including simultaneously, or skipped.

Additional details on OTP devices can be found in: (i) U.S. patent application Ser. No. 13/471,704, filed on May 15, 2012 and entitled "Circuit and System of Using Junction Diode as Program Selector for One-Time Programmable Devices," which is hereby incorporated herein by reference; (ii) U.S. patent application Ser. No. 13/026,752, filed on Feb. 14, 2011 and entitled "Circuit and System of Using Junction Diode as Program Selector for One-Time Programmable Devices," which is hereby incorporated herein by reference; and (iii) U.S. patent application Ser. No. 13/026,656, filed on Feb. 14, 2011 and entitled "Circuit and System of Using Polysilicon Diode As Program Selector for One-Time Programmable Devices," which is hereby incorporated herein by reference.

The above description and drawings are only to be considered illustrative of exemplary embodiments, which achieve the features and advantages of certain embodiments of the present invention. Modifications and substitutions of specific process conditions and structures can be made without departing from the spirit and scope of the present invention.

The many features and advantages of the present invention are apparent from the written description and, thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A One-Time Programmable (OTP) memory, comprising:
at least one main OTP array having a plurality of OTP cells, a plurality of Inputs/Outputs (I/Os), and at least one auxiliary OTP cell associated with each of the I/Os, at least one of the OTP cells having at least one OTP element and a selector;

at least one volatile cell per I/O to store data corresponding to the at least one auxiliary OTP cell; and a plurality of Boolean gates to invert the OTP cell data in each into or out of the main OTP array based on data stored in the at least one volatile cell for the corresponding I/O, wherein the OTP memory is configured to repair defects by inverting data into and out of the main array in each of the I/Os independently when no more than one defect per each of the I/Os is found, and wherein the inverting is achieved by automatically generating at least one cycle to read the at least one auxiliary OTP cell and correspondingly store the data read into the at least one volatile cell upon initialization.

2. An OTP memory as recited in claim 1, wherein the at least one auxiliary OTP cell is integrated as at least one additional row or column in the main OTP array.

3. An OTP memory as recited in claim 1, wherein the initialization is at least one of power up, chip select, read enable, or program enable.

4. An OTP memory as recited in claim 1, wherein the Boolean gates invert the OTP cell data comprise at least one Exclusive OR (XOR) or Exclusive NOR (NXOR).

5. An OTP memory as recited in claim 1, wherein the at least one OTP element in the at least one of the OTP cells is constructed from at least one of polysilicon, silicided polysilicon, silicide, metal, metal alloy, polymetal, CMOS gate, or thermally insulated active region thereof.

6. An OTP memory as recited in claim 1, wherein the at least one OTP element in the at least one of the OTP cells is an anti-fuse constructed from dielectric between conductors or thin gate-oxide in a MOS for breaking down.

7. An OTP memory as recited in claim 1, wherein the at least one OTP element in the at least one of the OTP cells is a floating gate to store charges.

8. An OTP memory as recited in claim 1, wherein the at least one selector in the at least one of the OTP cells is a diode constructed from source or drain on a CMOS well.

9. An OTP memory as recited in claim 1, wherein the at least one selector in the at least one of the OTP cells is a MOS.

10. An OTP memory as recited in claim 1, wherein the at least one selector in the at least one of the OTP cells is a MOS with source or drain junction turned on during programming.

11. An electronic system, comprising:
a processor; and
an OTP memory operatively connected to the processor, the OTP memory comprising:
at least one main OTP array having a plurality of OTP cells, a plurality of Inputs/Outputs (I/Os), and at least one auxiliary OTP cell associated with each of the I/Os, at least one of the OTP cells having at least one OTP element and a selector;
at least one volatile cell per I/O to store data corresponding to the at least one auxiliary OTP cells; and
a plurality of Boolean gates to invert the OTP cell data in each into or out of the main OTP array based on data stored in the at least one volatile cell for the corresponding I/O,
wherein the OTP memory is configured to repair defects by inverting data into and out of the main array in each of the I/Os independently when no more than one defect per each of the I/Os is found, and
wherein the inverting is achieved by automatically generating at least one cycle to read the at least one auxiliary OTP cell and correspondingly store the data read into the at least one volatile cell upon initialization.

12. An electronic system as recited in claim 11, wherein the initialization is at least one of power up, chip select, read enable, or program enable.

13. An electronic system as recited in claim 11, wherein the OTP memory includes an auxiliary OTP array, and wherein the at least one OTP cell is part of the auxiliary OTP array.

14. An electronic system as recited in claim 11, wherein the at least one selector in the at least one of the OTP cells is a diode constructed from source or drain on a CMOS well.

15. An electronic system as recited in claim 11, wherein the at least one selector in the at least one of the OTP cells is a MOS.

16. An electronic system as recited in claim 11, wherein the at least one selector in the at least one of the OTP cells is a MOS with source or drain junction turned on during programming.

17. A method for repairing an OTP memory with no more than one defect per I/O, comprising:
providing a main OTP memory having a plurality of main OTP cells in a plurality of Inputs/Outputs (I/Os) and a plurality of auxiliary OTP cells, at least one of the auxiliary OTP cells being associated with each I/O;
providing a plurality of volatile cells corresponding to the auxiliary OTP cells;
providing at least one Boolean gate to invert data into or out of the main OTP memory relative to each I/O dependent on a value stored in the corresponding volatile cell;
wherein data stored in each I/O of the main OTP memory are inverted if no more than one defect is found in each of the I/Os; and
wherein the inversion is achieved by automatically generating at least one cycle to read the auxiliary OTP cells into the volatile cells upon initialization.

18. A method as recited in claim 17, wherein programming the OTP memory comprises:
reading data from the auxiliary OTP cells of each I/O and storing the data read into the volatile cells;
inverting the data to be programmed if the corresponding volatile cell in each I/O is set; and
programming the main OTP cells if the inverted data is a non-virgin state.

19. An OTP memory as recited in claim 17, wherein at least one of the main OTP cells has at least one OTP element that is a fuse constructed from at least one of polysilicon, silicided polysilicon, silicide, metal, metal alloy, polymetal, CMOS gate, or thermally insulated active region thereof.

20. An OTP memory as recited in claim 17, wherein at least one of the main OTP cells has at least one OTP element that is an anti-fuse constructed from dielectric between conductors or thin gate-oxide in a MOS for breaking down.

21. An OTP memory as recited in claim 17, wherein at least one of the main OTP cells has at least one OTP element that is constructed from a floating gate to store charges.

* * * * *